(12) United States Patent
Kimura et al.

(10) Patent No.: US 8,670,263 B2
(45) Date of Patent: Mar. 11, 2014

(54) DATA HOLDING DEVICE

(75) Inventors: Hiromitsu Kimura, Kyoto (JP); Jun Iida, Kyoto (JP); Koji Nigoriike, Kyoto (JP); Yoshinobu Ichida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 324 days.

(21) Appl. No.: 13/025,395

(22) Filed: Feb. 11, 2011

(65) Prior Publication Data

US 2011/0199810 A1   Aug. 18, 2011

(30) Foreign Application Priority Data

Feb. 15, 2010   (JP) .................................. 2010-030199

(51) Int. Cl.
*G11C 11/22* (2006.01)
(52) U.S. Cl.
USPC ........... 365/145; 365/49.13; 365/65; 365/201
(58) Field of Classification Search
USPC .................................. 365/49.13, 65, 145, 201
See application file for complete search history.

(56) References Cited

U.S. PATENT DOCUMENTS

| | | | |
|---|---|---|---|
| 5,936,879 A * | 8/1999 | Brouwer et al. | 365/145 |
| 6,650,158 B2 * | 11/2003 | Eliason | 327/203 |
| 2009/0231903 A1 * | 9/2009 | Ogiwara et al. | 365/145 |
| 2010/0124094 A1 | 5/2010 | Kimura | |
| 2011/0128769 A1 | 6/2011 | Kimura | |

FOREIGN PATENT DOCUMENTS

| | | |
|---|---|---|
| JP | 3737472 | 11/2005 |
| JP | 2010-124290 | 6/2010 |
| WO | 2009/025346 | 2/2009 |

* cited by examiner

*Primary Examiner* — Thao Bui
(74) *Attorney, Agent, or Firm* — Fish & Richardson P.C.

(57) ABSTRACT

A data holding device according to the present invention includes a loop structure portion LOOP for holding data using a plurality of logic gates (NAND3 and NAND4) connected in a loop, a nonvolatile storage portion (NVM) for storing in a nonvolatile manner the data held in the loop structure portion (LOOP) by using the hysteresis characteristics of ferroelectric elements, a circuit separating portion (SEP) for electrically separating the loop structure portion (LOOP) and the nonvolatile storage portion (NVM), and a set/reset controller (SRC) for generating a set signal (SNL) and reset signal (RNL) based on data stored in the nonvolatile storage portion (NVM), wherein the plurality of logic gates are each set and reset to an arbitrary output logic level in accordance with the set signal (SNL) and reset signal (RNL).

19 Claims, 47 Drawing Sheets

FIG. 23
(a) <LAYOUT>
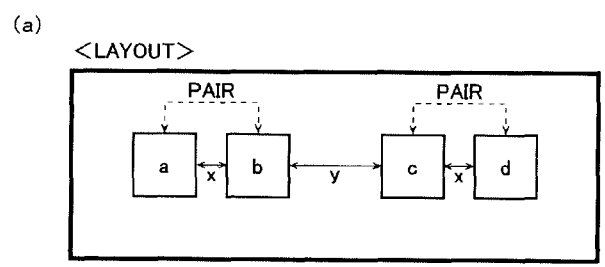
<ACTUAL SHAPE>
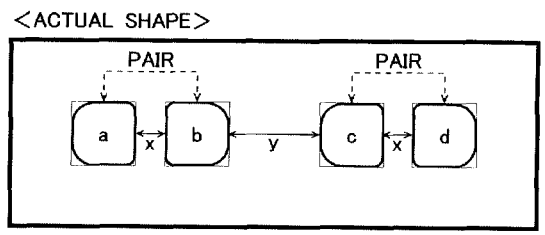
(b) <LAYOUT>
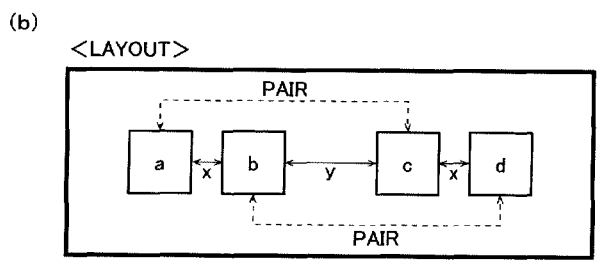
<ACTUAL SHAPE>
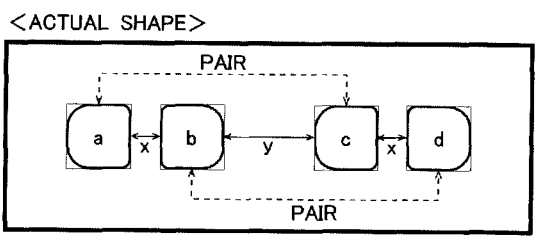

FIG. 24
(a)
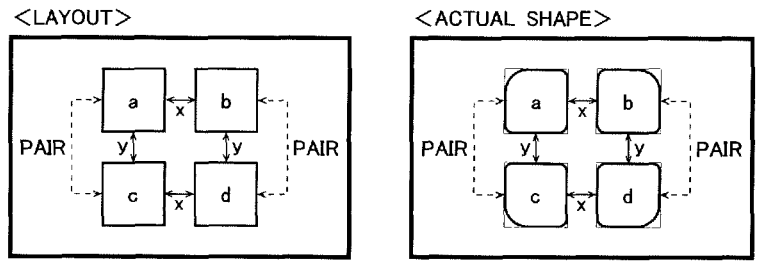
(b)
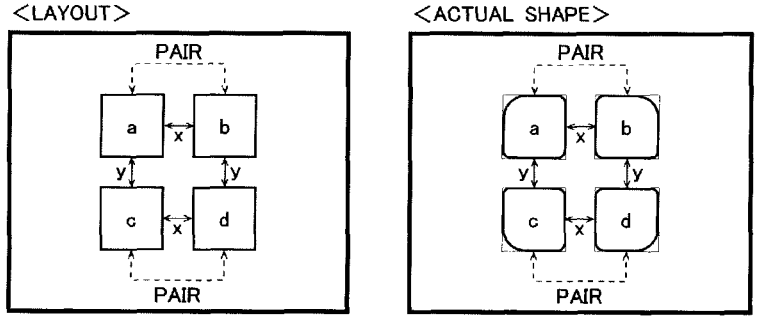
(c)
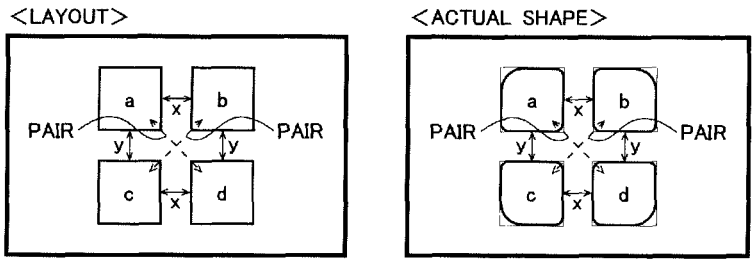

FIG. 28

| FUNCTION | PIN NAME | I/O | DESCRIPTION |
|---|---|---|---|
| LOGIC CONTROL | CP | IN | CLOCK |
| | D | IN | DATA INPUT |
| | SN | IN | PRESET |
| | RN | IN | CLEAR |
| | SD | IN | SCAN DATA INPUT |
| | SC | IN | SCAN CONTROL |
| FERROELECTRIC ELEMENT CONTROL | E1 | IN | FERROELECTRIC ELEMENT WRITE ENABLE |
| | HS | IN | DATA HOLD |
| | SAE | IN | SA ENABLE |
| | FRSTU | IN | FERROELECTRIC ELEMENT RESET (U) |
| | FRSTD | IN | FERROELECTRIC ELEMENT RESET (D) |
| | PL1_D | IN | PL1 DIGITAL INPUT |
| | PL2_D | IN | PL2 DIGITAL INPUT |
| FERROELECTRIC ELEMENT TEST | TESTU | IN | PL1/2U ANALOG ENABLE |
| | TESTD | IN | PL1/2D ANALOG ENABLE |
| | PL1U_A | IN | PL1U ANALOG INPUT |
| | PL2U_A | IN | PL2U ANALOG INPUT |
| | PL1D_A | IN | PL1D ANALOG INPUT |
| | PL2D_A | IN | PL2D ANALOG INPUT |
| FERROELECTRIC ELEMENT TEST | SO | OUT | SCAN OUTPUT |
| | Q | OUT | OUTPUT |

DATA HOLDING DEVICE

The present application is based on the following Japanese Application.
(1.) Japanese Laid-open Patent Application No. 2010-030199 (Application Date: Feb. 15, 2010)

BACKGROUND OF THE INVENTION

1. Field of the Invention

The present invention relates to a data holding device, and in particular, relates to a nonvolatile technique thereof.

2. Description of Related Art

As a data holding device that is used for a sequential circuit such as a latch circuit, there is known a circuit having two inverter circuits connected in series like a loop, for example. However, such a data holding device usually holds data only in a volatile manner, so the data will be lost when the power supply is turned off. In other words, even if the power supply is turned on again, the data stored before the power supply is turned off cannot be restored.

Therefore, when a sequence process utilizing the latch circuit having the data holding device is interrupted for some reason, the power supply should not be turned off for holding the data, while the power is consumed. In addition, if the sequence process is interrupted by a power failure or other accident, it is necessary to restart the process from the beginning with a large loss of time.

FIG. 46 illustrates a circuit of a data holding device according to a conventional example.

The data holding device illustrated in FIG. 27 includes a ferroelectric element CL connected to a signal line (a thick line in FIG. 27 on which held data shows up as a voltage signal) in a storage element having a loop structure portion (enclosed by a broken line in FIG. 27) constituted of inverters INVx and INVy.

When the power supply is turned off, a remanent polarization state of the ferroelectric element CL is set by using a voltage value on the signal line, so that data is written in the ferroelectric element CL. Such the writing action enables to store the data in a nonvolatile manner even after the power supply is turned off.

On the other hand, when the data written in the ferroelectric element CL is read out, the node N is set to a floating state after the power supply is turned on. Then, in this state, a voltage pulse is applied to an end of the ferroelectric element CL via the plate line PL, so that a voltage signal corresponding to the remanent polarization state of the ferroelectric element CL is generated at the node N. The voltage signal generated at the node N is decided to be 0 or 1 as data (0-1 decision) based on to the conventional data holding device described above a threshold value of the inverter INVx.

SUMMARY OF THE INVENTION

According to the conventional data holding device described above, it is surely advantageous that data can be held even if the power supply is turned off.

However, the conventional data holding device described above has a disadvantage that the ferroelectric element CL in the storage element becomes a large load capacitance existing on the signal line in a normal operation, which may cause a decrease of speed or an increase of power consumption in the storage element.

In addition, the conventional data holding device described above is required to setting the node N to a floating state (to turn off both the pass switches SWx and SWy) when the data is read out, so that the charge corresponding to the remanent polarization state of the ferroelectric element CL does not leak to the power supply line or to the ground line. Therefore, the conventional data holding device described above needs four types of clock signals (CKA, /CKA, CKB and /CKB) as drive clock signals for the pass switches SWx and SWy, which may cause an increase of power consumption.

In addition, as illustrated in FIGS. 46 and 47, the conventional data holding device described above uses a capacitive coupling between the ferroelectric element CL and a gate capacitance of a transistor constituting the inverter INVx so as to read a voltage signal Vout corresponding to the remanent polarization state of the ferroelectric element CL. However, the capacitance of the ferroelectric element CL (an upward-sloping solid line in FIG. 47) has a large value (a few hundred farads) while the gate capacitance of the transistor constituting the inverter INVx (a downward-sloping solid line in FIG. 47) has a small value (a few farads). Therefore, the voltage signal Vout that shows up at the node N is as small as approximately 10 to 100 millivolts, so it is difficult to set the threshold value of the inverter INVx in accordance with the voltage signal Vout for performing the 0-1 decision of the read data in view of variation of elements.

In addition, a conventional CMOS circuit has a conspicuous problem that if the power supply voltage decreases to 0.6 volts, data inside the data holding device will change because of fluctuation of the power supply voltage due to on/off of the circuit block power supply, i.e., there is little power margin of the supply voltage with respect to the fluctuation.

Note that the specification of Japanese Patent No. 3737472 (hereinafter referred to as Patent Document 1), which was filed by the same applicant, discloses and proposes a data holding device that uses a ferroelectric capacitor for holding data in a nonvolatile manner as a technique related to that described above.

A nonvolatile data holding device incorporating the ferroelectric element does not need the power supply voltage for holding the data, so the problem of changing data due to a fluctuation of the power supply voltage can be resolved. However, in view of characteristics of the ferroelectric element, it is difficult to drive the ferroelectric element by using the power supply voltage of 0.6 volts for writing data in the ferroelectric element. In other words, when the CMOS circuit is driven by the power supply voltage of 0.6 volts, it is difficult to use the same power supply voltage for driving the ferroelectric element.

On the contrary, when the CMOS circuit is driven by the power supply voltage of 3.3 volts, if the same power supply voltage is used for driving the ferroelectric element, unnecessarily large power will be consumed.

In addition, in the conventional data holding device described above there are many problems that should be considered when implementing a data holding device, such as: a fear that stored data of the ferroelectric element will be corrupted during on/off of the power supply; a necessity to stop clock entry to the loop structure portion when saving and restoring data to the ferroelectric element; and the fact that after incorporating the data holding device into the system, the analog characteristics of the ferroelectric element cannot be evaluated.

Considering the problem points discussed above that the inventors discovered, an object of the present invention is to provide a reliable and convenient data holding device, without reducing speed or increasing electricity consumed during regular operations, capable of saving data in a nonvolatile manner even after the power has been cut.

In order to achieve the above stated objective, the data holding device according to the present invention is configured so as to include a loop structure portion for holding data using a plurality of logic gates connected like a loop, a nonvolatile storage portion for storing in a nonvolatile manner the data held in the loop structure portion by using the hysteresis characteristics of the ferroelectric elements, a circuit separating portion for electrically separating the loop structure portion and the nonvolatile storage portion from each other, and a set/reset control unit that generates a predetermined set signal or reset signal based on the data stored in the nonvolatile storage portion, wherein the plurality of logic gates are each set and reset to arbitrary output logic levels in accordance with the set signals and reset signals previously described.

Other features, elements, steps, advantages, and characteristics will be further revealed by the detailed description of the best mode that follows below and the drawings related thereto.

BRIEF DESCRIPTION OF THE DRAWINGS

FIG. 23 is a schematic diagram illustrating a second layout example of a cell pattern.

FIG. 24 is a schematic diagram illustrating a third layout example of a cell pattern.

FIG. 28 is a chart explaining the function of the signal pin used in the fifth variation example of the data holding device according to the present invention.

DETAILED DESCRIPTION OF PREFERRED EMBODIMENTS

Figure 1:
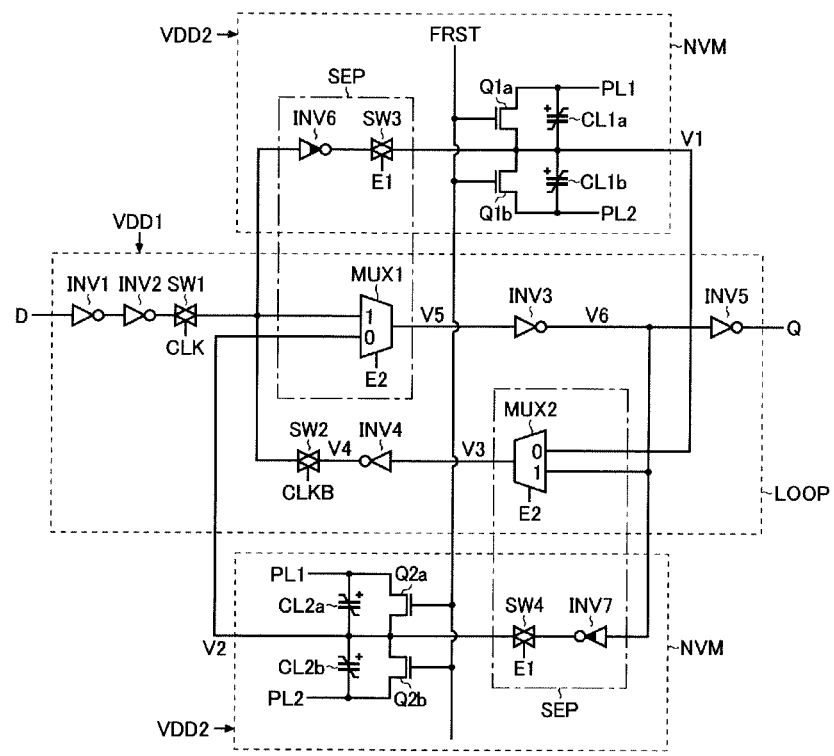
FIG. 1 is a circuit diagram illustrating an embodiment of a data holding device according to the present invention.

FIG. 1 is a circuit diagram illustrating an embodiment of a data holding device according to the present invention.

As illustrated in FIG. 1, the data holding device of the present embodiment is a latch circuit including inverters INV1 to INV7, pass switches SW1 to SW4, multiplexers MUX1 and MUX2, N-channel field-effective transistors Q1a, Q1b, Q2a and Q2b, and ferroelectric elements (ferroelectric capacitors) CL1a, CL1b, CL2a and CL2b.

An input end of the inverter INV1 is connected to a receiving end of the data signal (D). An output end of the inverter INV1 is connected to an input end of the inverter INV2. An output end of the inverter INV2 is connected to a first input end (1) of the multiplexer MUX1 via the pass switch SW1. An output end of the multiplexer MUX1 is connected to an input end of the inverter INV3. An output end of the inverter INV3 is connected to an input end of the inverter INV5. An output end of the inverter INV5 is connected to an outlet end of the output signal (Q). The first input end (1) of the multiplexer MUX2 is connected to the output end of the inverter INV3. An output end of the multiplexer MUX2 is connected to an input end of the inverter INV4. An output end of the inverter INV4 is connected to the first input end (1) of the multiplexer MUX1 via the pass switch SW2.

In this way, the data holding device of the present embodiment includes the loop structure portion LOOP that uses the two logic gate connected like a loop (inverters INV3 and INV4 in FIG. 1) so as to hold the input data signal D.

Note that the loop structure portion LOOP is driven by being supplied with the first power supply voltage VDD1 (e.g., 0.6 volts).

An input end of the inverter INV6 is connected to the first input end (1) of the multiplexer MUX1. An output end of the inverter INV6 is connected to a second input end (0) of the multiplexer MUX2 via the pass switch SW3. An input end of the inverter INV7 is connected to the first input end (1) of the multiplexer MUX2. An output end of the inverter INV7 is connected to a second input end (0) of the multiplexer MUX1 via the pass switch SW4.

A positive end of the ferroelectric element CL1a is connected to a first plate line PL1. A negative end of the ferroelectric element CL1a is connected to the second input end (0) of the multiplexer MUX2. A transistor Q1a is connected between the ends of the ferroelectric element CL1a. A gate of the transistor Q1a is connected to a receiving end of an F reset signal FRST.

A positive end of the ferroelectric element CL1b is connected to the second input end (0) of the multiplexer MUX2.

A negative end of the ferroelectric element CL1b is connected to a second plate line PL2. A transistor Q1b is connected between the ends of the ferroelectric element CL1b. A gate of the transistor Q1b is connected to the receiving end of the F reset signal FRST.

A positive end of the ferroelectric element CL2a is connected to the first plate line PL1. A negative end of the ferroelectric element CL2a is connected to the second input end (0) of the multiplexer MUX1. A transistor Q2a is connected between the ends of the ferroelectric element CL2a. A gate of the transistor Q2a is connected to the receiving end of the F reset signal FRST.

A positive end of the ferroelectric element CL2b is connected to the second input end (0) of the multiplexer MUX1. A negative end of the ferroelectric element CL2b is connected to the second plate line PL2. A transistor Q2b is connected between the ends of the ferroelectric element CL2b. A gate of the transistor Q2b is connected to the receiving end of the F reset signal FRST.

In this way, the data holding device of the present embodiment includes a nonvolatile storage portion NVM for storing the data D held by the loop structure portion LOOP, by using hysteresis characteristic of the ferroelectric elements (CL1a, CL1b, CL2a and CL2b) in a nonvolatile manner.

Note that the nonvolatile storage portion NVM is driven by being supplied with a second power supply voltage VDD2 (e.g., 1.2 volts) that is higher than the first power supply voltage VDD1.

In addition, among the structural elements described above, the pass switch SW1 is turned on and off in accordance with the clock signal CLK while the pass switch SW2 is turned on and off in accordance with the reverse clock signal CLKB (logical inversion signal of the clock signal CLK). In other words, the pass switch SW1 and the pass switch SW2 are turned on and off in an exclusive (complementary) manner to each other.

On the other hand, each of the pass switches SW3 and SW4 is turned on and off in accordance with the control signal E1. In addition, each of the multiplexers MUX1 and MUX2 is switched between the signal paths in accordance with the control signal E2. In other words, in the data holding device of the present embodiment, the multiplexers MUX1 and MUX2, the inverters INV6 and INV7, and the pass switches SW3 and SW4 function as a circuit separating portion SEP for electrically separating the loop structure portion LOOP and the nonvolatile storage portion NVM from each other.

Note that among the circuit elements constituting the circuit separating portion SEP, the multiplexers MUX1 and MUX2 included in the loop structure portion LOOP are driven by being supplied with the first power supply voltage VDD1, and the pass switches SW3 and SW4 included in the nonvolatile storage portion NVM are driven by being supplied with the second power supply voltage VDD2.

In addition, the inverters INV6 and INV7 are driven by being supplied with both the first power supply voltage VDD1 and the second power supply voltage VDD2, and have a function as a level shifter for converting a voltage level of the data D communicated between the loop structure portion LOOP and the nonvolatile storage portion NVM.

Figure 2:
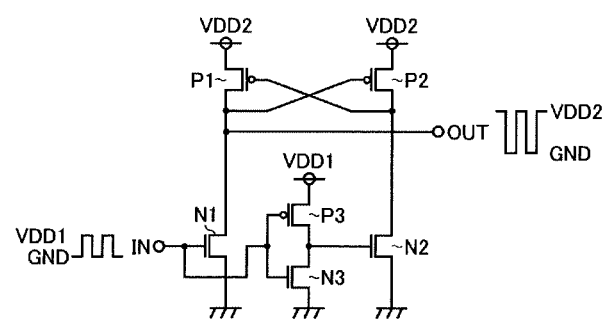
FIG. 2 is a circuit diagram illustrating a structural example of an inverter INV6 (as well as an inverter INV7) having a level shifting function.

FIG. 2 is a circuit diagram illustrating a structural example of an inverter INV6 (as well as an inverter INV7) having a level shifting function.

As illustrated in FIG. 2, the inverter INV6 (INV7) is constituted of a P-channel MOS field-effect transistors P1 to P3 and N-channel MOS field-effect transistors N1 to N3. A gate of the transistor N1 is connected to the input end IN. A source of the transistor N1 is connected to a ground end. A drain of the transistor N1 is connected to a drain of the transistor P1 and is also connected to the output end OUT. Each of sources of the transistors P1 and P2 is connected to a receiving end of the second power supply voltage VDD2. A gate of the transistor P1 is connected to a drain of the transistor P2. A gate of the transistor P2 is connected to the drain of the transistor P1. The drain of the transistor P2 is connected to a drain of the transistor N2. A source of the transistor N2 is connected to the ground end. Each of gates of the transistors P3 and N3 is connected to the input end IN. A source of the transistor P3 is connected to a receiving end of the first power supply voltage VDD1. A drain of the transistor P3 is connected to a drain of the transistor N3 and is also connected to a gate of the transistor N2. A source of the transistor N3 is connected to the ground end.

In the inverter INV6 (INV7) having the above-mentioned structure, if a logical signal of a high level (first power supply voltage VDD1) is supplied to the input end IN, the transistors N1 and P2 are tuned on while the transistors N2 and P1 are turned off. Therefore, a logical signal of a low level (ground voltage GND) is delivered from the output end OUT. On the contrary, if a logical signal of the low level (ground voltage GND) is supplied to the input end IN, the transistors N1 and P2 is turned off while the transistors N2 and P1 are turned on. Therefore, a logical signal of a high level (second power supply voltage VDD2) is delivered from the output end OUT. In other words, the inverter INV6 (INV7) reverses logic levels of the logical signal supplied to the input end IN and further raises the high level potential from the first power supply voltage VDD1 to the second power supply voltage VDD2 for output.

Next, an operation of the data holding device having the above-mentioned structure will be described in detail. Note that in the following description, node voltages at individual portions are denoted as below. A voltage at the connection node between the ferroelectric elements CL1a and CL1b is denoted by V1, a voltage at the connection node between the ferroelectric elements CL2a and CL2b is denoted by V2, a voltage at the input end of the inverter INV4 is denoted by V3, a voltage at the output end of the inverter INV4 is denoted by V4, a voltage at the input end of the inverter INV3 is denoted by V5, and a voltage at the output end of the inverter INV3 is denoted by V6.

Figure 3:
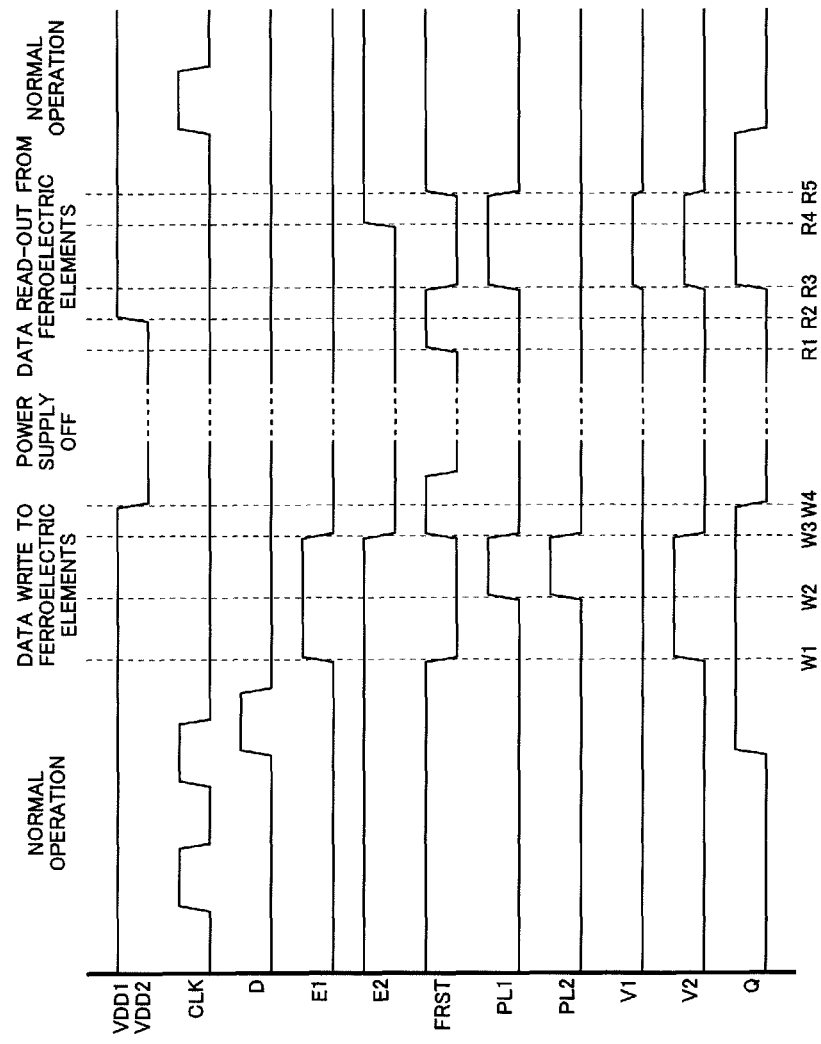
FIG. 3 is a timing chart illustrating an operational example of a data holding device according to the present invention.

FIG. 3 is a timing chart illustrating an operational example of the data holding device according to the present invention. From above in FIG. 3, there are illustrated voltage waveforms of the power supply voltages (VDD1 and VDD2), the clock signal CLK, the data signal D, the control signal E1, the control signal E2, the F reset signal FRST, the applied voltage to the first plate line PL1, the applied voltage to the second plate line PL2, the node voltage V1, the node voltage V2, and the output signal Q, in this order.

First, the normal operation of the data holding device will be described.

Until a time point W1, the F reset signal FRST is "1" (high level of VDD2), and the transistors Q1a, Q1b, Q2a and Q2b are turned on, so that each of the ferroelectric elements CL1a, CL1b, CL2a and CL2b is short-circuited at the ends. Therefore, no voltage is applied to the ferroelectric elements CL1a, CL1b, CL2a and CL2b. Note that each of the first plate line PL1 and the second plate line PL2 is "0" (low level of GND).

In addition, until the time point W1, the control signal E1 is "0", so that the pass switch SW3 and the pass switch SW4 are turned off. Therefore, the data write drivers (inverters INV6 and INV7 in the example of FIG. 1) are both disabled.

In addition, until the time point W1, the control signal E2 is "1" (VDD1), so that the first input ends (1) of the multiplexer MUX1 and the multiplexer MUX2 are selected. Therefore, the normal loop is formed in the loop structure portion LOOP.

Therefore, during the high level period of the clock signal CLK, the pass switch SW1 is turned on while the pass switch SW2 is turned off, so that the data signal D becomes the output signal Q as it is. On the other hand, during the low level period of the clock signal CLK, the pass switch SW1 is turned off while the pass switch SW2 is turned on. Therefore, the data signal D is latched at the falling edge of the clock signal CLK.

Figure 4:
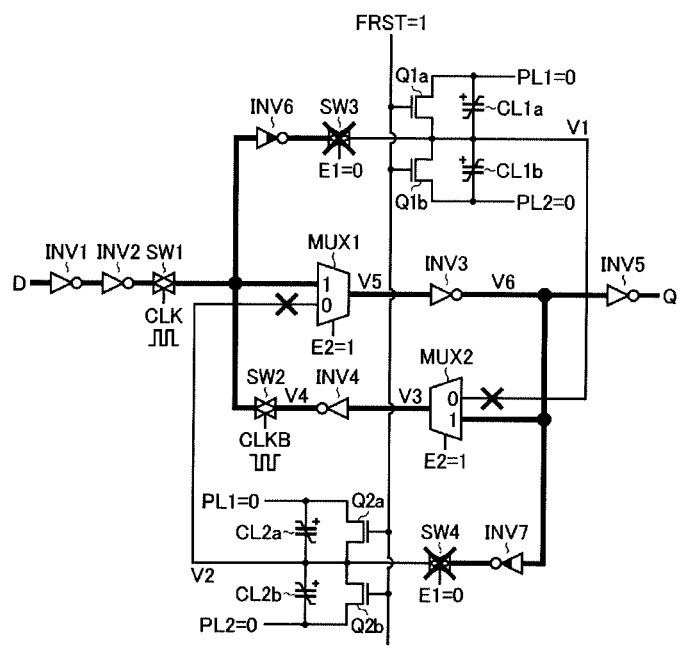
FIG. 4 is a circuit diagram illustrating a signal path in a normal operation.

Note that FIG. 4 is a circuit diagram illustrating a signal path (with thick lines in FIG. 4) in the normal operation described above.

Next, a data writing action in the ferroelectric element will be described.

During the time points W1 to W3, the clock signal CLK is "0" (GND), and the reverse clock signal CLKB is "1" (VDD1). Therefore, the first pass switch SW1 is turned off, and the second pass switch is turned on. In this way, logic levels of the clock signal CLK and the reverse clock signal CLKB are fixed in advance, so that stability of the data writing action in the ferroelectric element can be enhanced.

In addition, during the time points W1 to W3, the F reset signal FRST is "0" (GND), and the transistors Q1a, Q1b, Q2a and Q2b are turned off, so that a voltage can be applied to the ferroelectric elements CL1a, CL1b, CL2a and CL2b.

In addition, during the time points W1 to W3, the control signal E1 is "1" (VDD2) so that the pass switch SW3 and the pass switch SW4 are turned on. Therefore, each of the data write drivers (inverters INV6 and INV7 in the example of FIG. 1) is enabled.

Note that during the time points W1 to W3, the control signal E2 is "1" (VDD1) in the same manner as before, so that the first input ends (1) of the multiplexer MUX1 and the multiplexer MUX2 are selected. Therefore, the normal loop is formed in the loop structure portion LOOP.

In addition, during the time points W1 to W2 the first plate line PL1 and the second plate line PL2 are "0" (GND), and during the time points W2 to W3 the first plate line PL1 and the second plate line PL2 are "1" (VDD2). In other words, the same pulse voltage is applied to the first plate line PL1 and the second plate line PL2. By such the application of the pulse voltage, the remanent polarization state inside the ferroelectric element is set to either the inverted state or the non-inverted state.

With reference to the example of FIG. 3, more concrete description will be given below. At the time point W1, the output signal Q is "1" (VDD1). Therefore, the node voltage V1 becomes "0" (GND), and the node voltage V2 becomes "1" (VDD2). Therefore, during the time points W1 to W2 while the first plate line PL1 and the second plate line PL2 are "0" (GND), no voltage is applied between the ends of the ferroelectric elements CL1a and CL1b, a negative voltage is applied between the ends of the ferroelectric element CL2a, and a positive voltage is applied between the ends of the ferroelectric element CL2b. On the other hand, during the time points W2 to W3 while the first plate line PL1 and the second plate line PL2 are "1" (VDD2), no voltage is applied between the ends of the ferroelectric elements CL2a and CL2b, a positive voltage is applied between the ends of the ferroelectric element CL1a, and a negative voltage is applied between the ends of the ferroelectric element CL1b.

In this way, the pulse voltage is applied to the first plate line PL1 and the second plate line PL2, so that the remanent polarization state inside the ferroelectric element is set to either the inverted state or the non-inverted state. Note that the remanent polarization state becomes opposite between the ferroelectric elements CL1a and CL1b as well as between the ferroelectric elements CL2a and CL2b. In addition, also between the ferroelectric elements CL1a and CL2a as well as between the ferroelectric elements CL1b and CL2b, the remanent polarization state becomes opposite.

At the time point W3, the F reset signal FRST becomes "1" (VDD2) again, and the transistors Q1a, Q1b, Q2a and Q2b are turned on, so that each of the ferroelectric elements CL1a, CL1b, CL2a and CL2b is short-circuited at the ends. Therefore, no voltage can be applied to the ferroelectric elements CL1a, CL1b, CL2a and CL2b. In this case, each of the first plate line PL1 and the second plate line PL2 is "0" (GND).

In addition, at the time point W3, the control signal E1 becomes "0" (GND) again, so that the pass switch SW3 and the pass switch SW4 are turned off. Therefore, each of the data write drivers (inverters INV6 and INV7 in the example of FIG. 1) is disabled. Note that the control signal E2 is not minded but is "0" (GND) in the example of FIG. 3.

Then, at the time point W4, supply of the first power supply voltage VDD1 to the loop structure portion LOOP and supply of the second power supply voltage VDD2 to the nonvolatile storage portion NVM are both interrupted. In this case, the F reset signal FRST is maintained to be "1" (VDD2) from the time point W3, and the transistors Q1a, Q1b, Q2a and Q2b are turned on, so that each of the ferroelectric elements CL1a, CL1b, CL2a and CL2b is short-circuited at the ends. Therefore, no voltage is applied to the ferroelectric elements CL1a, CL1b, CL2a and CL2b. Even if a voltage fluctuation occurs when the power supply is interrupted, no voltage is applied to the ferroelectric elements CL1a, CL1b, CL2a and CL2b without intention, so that changing data can be avoided.

Figure 5:
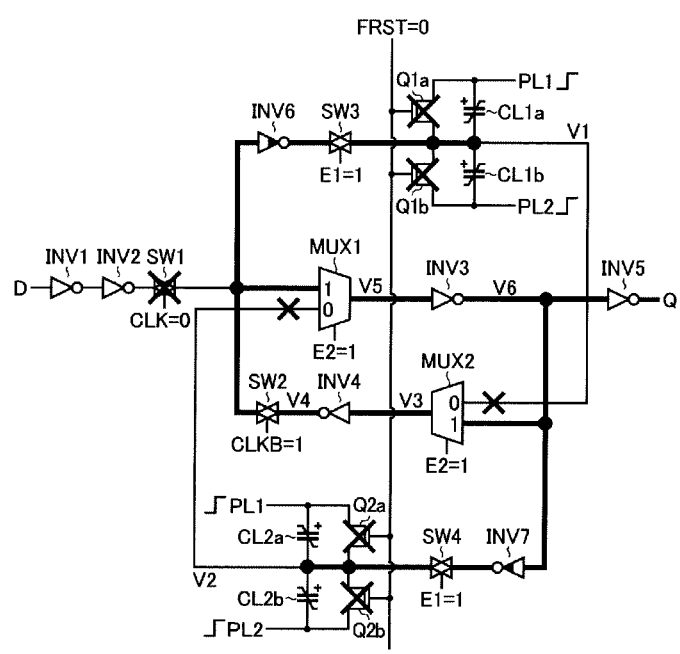
FIG. 5 is a circuit diagram illustrating a signal path in a data writing action.

Note that FIG. 5 is a circuit diagram illustrating a signal path (with thick lines in FIG. 5) in the above-mentioned data writing action (in particular, during the time points W1 to W3).

Next, a data reading action from the ferroelectric element will be described.

During the time points R1 to R5, the clock signal CLK is "0" (GND), and the reverse clock signal CLKB is "1" (VDD1). Therefore, the first pass switch SW1 is turned off, and the second pass switch SW2 is turned on. In this way, logic levels of the clock signal CLK and the reverse clock signal CLKB are fixed in advance, so that stability of the data reading action from the ferroelectric element can be enhanced.

At the time point R1, the F reset signal FRST is "1" (VDD1) first, and the transistors Q1a, Q1b, Q2a and Q2b are turned on, so that each of the ferroelectric elements CL1a, CL1b, CL2a and CL2b is short-circuited at the ends. Therefore, no voltage can be applied to the ferroelectric elements CL1a, CL1b, CL2a and CL2b. Even if a voltage fluctuation occurs when the power supply is turned on, no voltage is applied to the ferroelectric elements CL1a, CL1b, CL2a and CL2b without intention, so that changing data can be avoided.

Note that at the time point R1, each of the first plate line PL1 and the second plate line PL2 is "0" (low level of GND).

Figure 6:
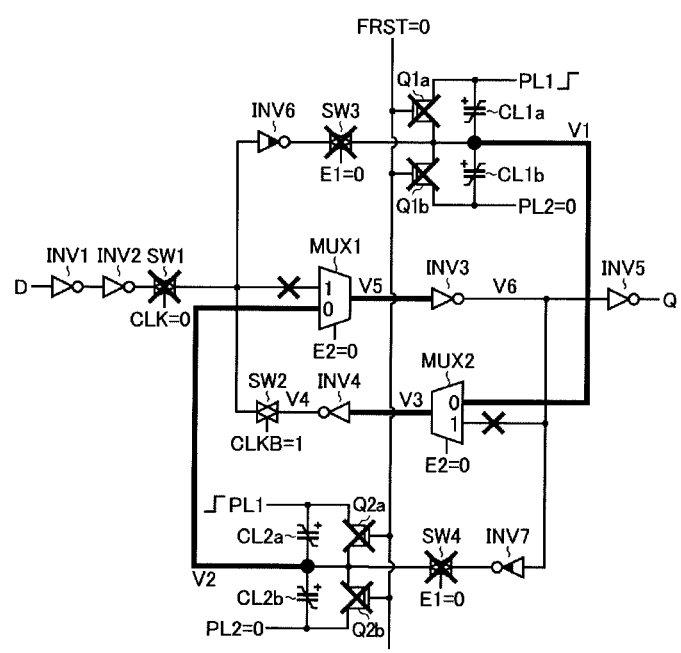
FIG. 6 is a circuit diagram illustrating a signal path in a data reading action.

At the time point R2, in the state where each of the control signals E1 and E2 is "0" (GND) (i.e., in the state where the data write drivers are disabled and the normal loop is disabled in the loop structure portion LOOP), the first power supply voltage VDD1 for the loop structure portion LOOP and the second power supply voltage VDD2 for the nonvolatile storage portion NVM are turned on. In this case, the signal line indicated by the thick line in FIG. 6 is in the floating state.

At the next time point R3, the F reset signal FRST becomes "0" (GND), so that the transistors Q1a, Q1b, Q2a and Q2b are turned off. Then, a voltage can be applied to the ferroelectric elements CL1a, CL1b, CL2a and CL2b while the second plate line PL2 is maintained to be "0" (GND) and the first plate line PL1 becomes "1" (VDD2). When such the pulse voltages are applied, voltage signals corresponding to the remanent polarization state in the ferroelectric element show up as the node voltage V1 and the node voltage V2.

With reference to an example of FIG. 3, concrete description will be given below. As the node voltage V1, a relatively low voltage signal (hereinafter a logic level thereof is denoted by WL (weak Low)) shows up. As the node voltage V2, a relatively high voltage signal (hereinafter a logic level thereof is denoted by WH (weak high)) shows up. In other words, a voltage difference occurs between the node voltage V1 and the node voltage V2 corresponding to a difference of remanent polarization state in the ferroelectric element.

In this case, during the time points R3 to R4, the control signal E2 is "0" (VDD1), and the second input ends (0) of the multiplexer MUX1 and the multiplexer MUX2 are selected. Therefore, a logic level of the node voltage V3 becomes WL, and a logic level of the node voltage V4 becomes WH. In addition, the logic level of the node voltage V5 becomes WH while the logic level of the node voltage V6 becomes WL. In this way, during the time points R3 to R4, the node voltages V1 to V6 at the individual portions of the device are still unstable (in the state where logic level inversion is not completed in the inverter INV3 and the inverter INV4 so that output logic levels thereof are not completely "0" (GND) or "1" (VDD1)).

At the next time point R4, the control signal E2 becomes "1" (VDD1) so that the first input ends (1) of the multiplexer MUX1 and the multiplexer MUX2 are selected, and the normal loop is formed in the loop structure portion LOOP. Along with this signal path switching, the output end of the inverter INV4 (having the logic level WH) is connected to the input end of the inverter INV3 (having the logic level WH), and the output end of the inverter INV3 (having the logic level WL) is connected the input end of the inverter INV4 (having the logic level WL). Therefore, no mismatch occurs in the signal logic level (WH or WL) of each node. After that, during the period while the normal loop is formed in the loop structure portion LOOP, the inverter INV3 receives the input of the logic level WL and tries to raise the output logic level to "1" (VDD1) while the inverter INV4 receives the input of the logic level WH and tries to lower the output logic level to "0" (GND). As a result, the output logic level of the inverter INV3 is secured to be "0" (GND) from the unstable logic level WL, and the output logic level of the inverter INV4 is secured to be "1" (VDD1) from the unstable logic level WH.

In this way, as the loop structure portion LOOP is made the normal loop at the time point R4, the signal read out from the ferroelectric element (the potential difference between the node voltage V1 and the node voltage V2) is amplified by the loop structure portion LOOP. Thus, the stored data before the power supply is turned off ("1" (VDD1) in the example of FIG. 2) is restored as the output signal Q.

After that, at the time point R5, the F reset signal FRST becomes "1" (VDD2) again so that the transistors Q1a, Q1b, Q2a and Q2b are turned on, and each of the ferroelectric elements CL1a, CL1b, CL2a and CL2b is short-circuited at the ends. Therefore, no voltage can be applied to the ferroelectric elements CL1a, CL1b, CL2a and CL2b. In this case, each of the first plate line PL1 and the second plate line PL2 is "0" (GND). Therefore, the data holding device is reset to the state similar to the state before the time point W1, i.e., to the normal operation state.

Note that FIG. 6 is a circuit diagram illustrating a signal path (with thick lines in FIG. 6) in the above-mentioned data reading action (particularly, during the time points R3 to R4).

As described above, the data holding device of the present embodiment includes the loop structure portion LOOP for holding data by using the logic gates (inverters INV3 and INV4 in FIG. 1) connected to each other like a loop, the nonvolatile storage portion NVM (CL1a, CL1b, CL2a, CL2b, Q1a, Q1b, Q2a and Q2b) for storing the data held in the loop structure portion LOOP, in a nonvolatile manner by using hysteresis characteristic of the ferroelectric elements, and the circuit separating portion SEP (MUX1, MUX2, INV6, INV7, SW3 and SW4) for electrically separating the loop structure portion LOOP and the nonvolatile storage portion NVM from each other. The circuit separating portion SEP has the structure for operating the loop structure portion LOOP electrically while maintaining the applied voltage to the ferroelectric elements to be constant in the normal operation of the data holding device.

In this way, instead of driving the ferroelectric elements CL1a, CL1b, CL2a and CL2b directly from the signal line of the loop structure portion LOOP, the data write drivers (inverters INV6 and INV7 in FIG. 1) that also function as buffers are disposed between the signal line of the loop structure portion LOOP and the ferroelectric elements CL1a, CL1b, CL2a and CL2b, so that the ferroelectric elements CL1a, CL1b, CL2a and CL2b cannot be load capacitance inside the loop structure portion LOOP.

In addition, the pass switches SW3 and SW4 are connected to the output ends of the data write drivers (inverters INV6 and INV7), so that the pass switches SW3 and SW4 are turned on in accordance with the control signal E1 only in the data writing action. Thus, it is possible that the ferroelectric elements CL1a, CL1b, CL2a and CL2b are not driven in the normal operation.

In addition, in the data reading action, input and output paths of the multiplexers MUX1 and MUX2 are switched in accordance with the control signal E2, so that connection or interruption between the logic gates (inverters INV3 and INV4 in FIG. 1) in the loop structure portion LOOP and the ferroelectric elements CL1a, CL1b, CL2a and CL2b can be controlled. Therefore, an increase of power consumption can be avoided because a specific node is in the floating state so that it is needless to add a clock line having a large load.

Note that the additional control signals E1 and E2 are necessary for the data holding device of the present embodiment, but these signals are not driven at all in the normal operation unlike the clock signal that is always driven. Therefore, there is little influence to power consumption of the data holding device.

In addition, the additional data write drivers (inverters INV6 and INV7) and the additional multiplexers MUX1 and MUX2 are necessary for the data holding device of the present embodiment, but an occupancy area of the data holding device in an arithmetic circuit of a central processing unit (CPU) or the like is as small as a few percent in most cases, so it can be said that an increase of the area hardly affect the entire arithmetic circuit.

In this way, the data holding device of the present embodiment does not drive the ferroelectric element wastefully in the normal operation, so that high speed and low power consumption at the same level as the nonvolatile data holding device can be achieved.

In other words, the data holding device can be handled in the same manner as the nonvolatile data holding device, a storage element portion of an existing circuit can be replaced by the data holding device of the present invention without redesigning timings, power consumption or the like. Therefore, the existing circuit can be easily made to be nonvolatile. As a result, for example, it is possible to realize a CPU or the like that is capable of interrupting power supply without erasing data in a standby mode and resuming the operation promptly when the power supply is turned on.

In addition, in the data holding device of the present embodiment, the loop structure portion LOOP and the nonvolatile storage portion NVM are driven by being supplied with the first and the second power supply voltages VDD1 and VDD2, respectively. The circuit separating portion SEP includes a level shifter for converting a voltage level of data D communicated between the loop structure portion LOOP and the nonvolatile storage portion NVM (inverters INV6 and INV7 having a level shifting function in the example of FIG. 1).

With such the structure, it is possible to achieve low voltage drive of the loop structure portion LOOP with the first power supply voltage VDD1 and appropriate drive of the nonvolatile storage portion NVM (more specifically, the ferroelectric elements CL1a, CL1b, CL2a and CL2b included in the nonvolatile storage portion NVM) with the second power supply voltage VDD2 that is higher than the first power supply voltage VDD1. Therefore, it is possible to provide the data holding device that can be appropriately incorporated in a low voltage drive device (ultra-low voltage processor or the like).

Figure 7:
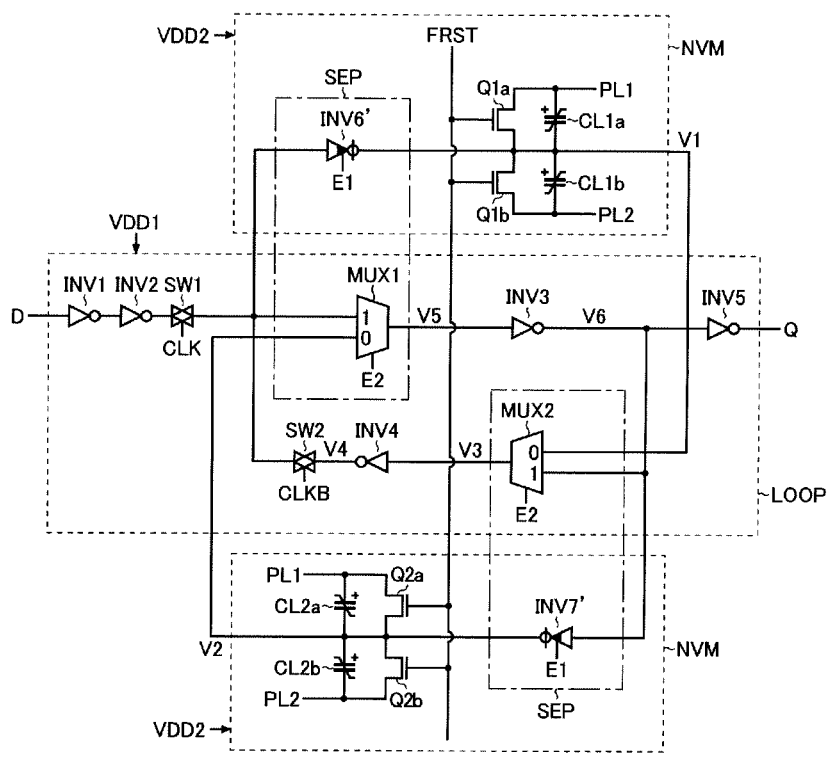
FIG. 7 is a circuit diagram illustrating a first variation example of the data holding device according to the present invention.

Note that the above-mentioned embodiment exemplifies the structure in which the inverter INV6 and the pass switch SW3 are combined, and the inverter INV7 and the pass switch SW4 are combined. However, the present invention is not limited to this structure. As illustrated in FIG. 7, it is possible to use three-state inverters INV6' and INV7' that can make the output state a high impedance state in accordance with the control signal E1, so that the pass switches SW3 and SW4 can be eliminated. In this case, the structure of the inverter INV6' (as well as the inverter INV7') is as illustrated in FIG. 8.

Figure 8:
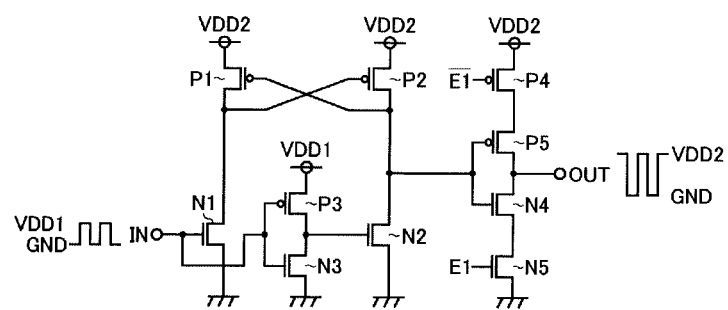
FIG. 8 is a circuit diagram illustrating a structural example of a three-state inverter INV6' (as well as inverter INV7') having the level shifting function.

FIG. 8 is a circuit diagram illustrating a structural example of the three-state inverter INV6' (as well as the inverter INV7') having the level shifting function.

As illustrated in FIG. 8, the three-state inverter INV6' (INV7') having the level shifting function can be easily realized by making some modifications to the inverter INV6 (INV7) described above. More specifically, in addition to the structure of FIG. 2, the three-state inverter INV6' (INV7') should be equipped with an additional output stage including P-channel MOS field-effect transistors P4 and P5, and N-channel MOS field-effect transistors N4 and N5. Further, the structure in which the output signal is delivered from the drain of the transistor P1 should be replaced by the structure in which the output signal is delivered from the above-mentioned output stage.

A source of the transistor P4 forming the above-mentioned output stage is connected to the receiving end of the second power supply voltage VDD2. A gate of the transistor P4 is connected to a receiving end of an inversion control signal E1-bar. A drain of the transistor P4 is connected to a source of the transistor P5. A drain of the transistor P5 is connected to a drain of the transistor N4 and is also connected to the output end OUT. Each of gates of the transistors P5 and N4 is connected to the drain of the transistor P2. A source of the transistor N4 is connected to the drain of the transistor N5. A source of the transistor N5 is connected to the ground end. A gate of the transistor N5 is connected to a receiving end of the control signal E1.

If the control signal E1 is the high level (second power supply voltage VDD2) in the three-state inverter INV6' (INV7') having the above-mentioned structure, when a logical signal of the high level (first power supply voltage VDD1) is supplied to the input end IN, the output end OUT delivers a logical signal of the low level (ground voltage GND). On the contrary, when a logical signal of the low level (ground voltage GND) is supplied to the input end IN, the output end OUT delivers a logical signal of the high level (second power supply voltage VDD2). In other words, if the control signal E1 is the high level, the inverter INV6' (INV7') reverses a logic level of the logical signal supplied to the input end IN and further raises the high level potential from the first power supply voltage VDD1 to the second power supply voltage VDD2 so as to delivers the signal. On the other hand, if the control signal E1 is the low level (GND), each of the transistors P4 and N5 is turned off, so that the output end OUT becomes a high impedance state. In other words, the inverter INV6' (INV7') can make the output end OUT the high impedance state regardless of the logical signal supplied to the input end IN if the control signal E1 is the low level (GND). Therefore, if the three-state inverters INV6' and INV7' are used, the pass switches SW3 and SW4 illustrated in FIG. 2 can be eliminated.

Figure 9:
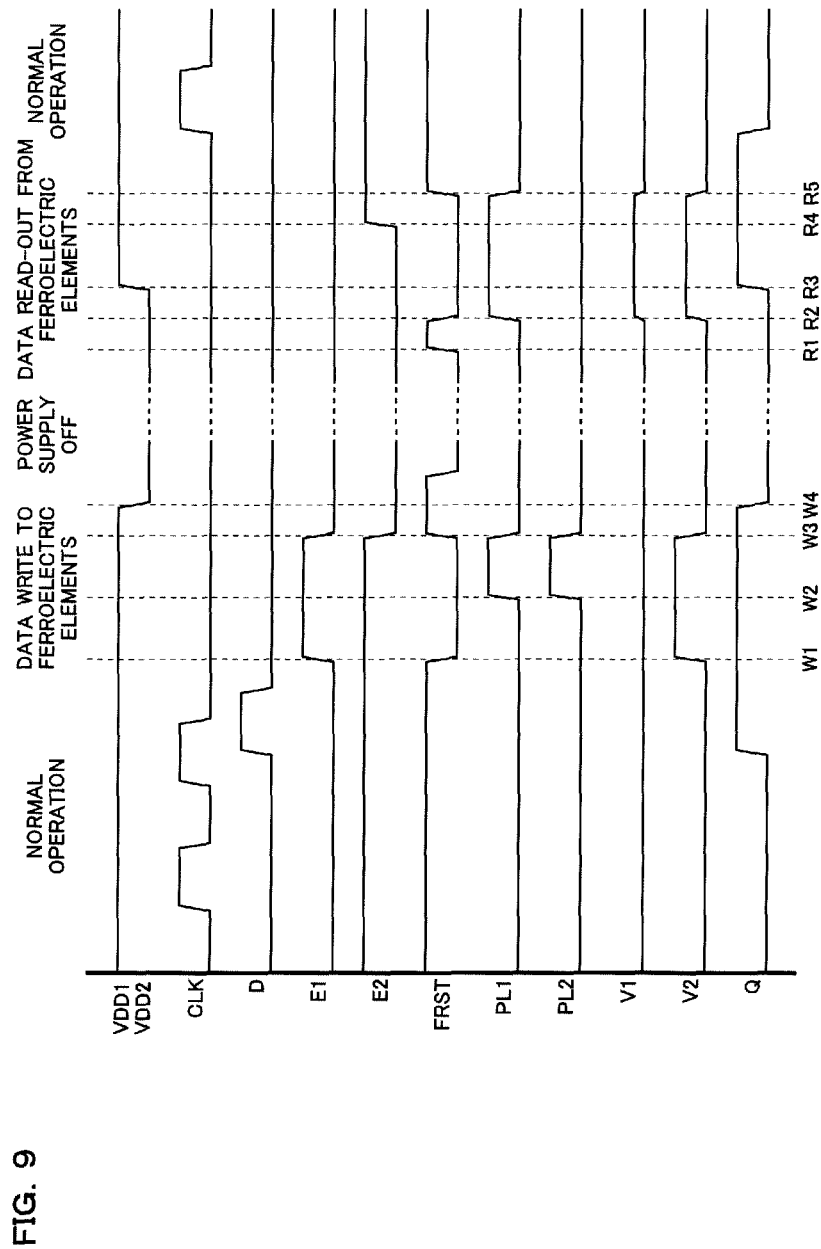
FIG. 9 is a timing chart illustrating another operational example of a data holding device according to the present invention.

Next, a variation example of the data reading action from the ferroelectric element will be described in detail with reference to FIG. 9. FIG. 9 is a timing chart illustrating another operational example of the data holding device according to the present invention, which illustrates voltage waveforms of the power supply voltages (VDD1 and VDD2), the clock signal CLK, the data signal D, the control signal E1, the control signal E2, the F reset signal FRST, the applied voltage of the first plate line PL1, the applied voltage of the second plate line PL2, the node voltage V1, the node voltage V2, and the output signal Q in this order from the top.

During the time points R1 to R5, the clock signal CLK is "0" (GND), and the reverse clock signal CLKB is "1" (VDD1). Therefore, the first pass switch SW1 is turned off, and the second pass switch is turned on. In this way, logic levels of the clock signal CLK and the reverse clock signal CLKB are fixed in advance, so that stability of the data reading action from the ferroelectric element can be enhanced.

At the time point R1, the F reset signal FRST is "1" (VDD2) first, and the transistors Q1a, Q1b, Q2a and Q2b are turned on, so that each of the ferroelectric elements CL1a, CL1b, CL2a and CL2b is short-circuited at the ends. Therefore, no voltage can be applied to the ferroelectric elements CL1a, CL1b, CL2a and CL2b. Even if a voltage fluctuation occurs when the power supply is turned on, no voltage is applied to the ferroelectric elements CL1a, CL1b, CL2a and CL2b without intention, so that changing data can be avoided.

Note that at the time point R1, each of the first plate line PL1 and the second plate line PL2 is "0" (low level of GND).

At the time point R2, the F reset signal FRST becomes "0" (GND), and the transistors Q1a, Q1b, Q2a and Q2b are turned off so as to be the state where a voltage can be applied to the ferroelectric elements CL1a, CL1b, CL2a and CL2b, while the first plate line PL1 becomes "1" (VDD2) in the state where the second plate line PL2 is remained to be "0" (GND). When such the pulse voltages are applied, voltage signals corresponding to the remanent polarization state in the ferroelectric element show up as the node voltage V1 and the node voltage V2.

With reference to the example illustrated in FIG. 9, concrete description will be added as below. WL shows up as the logic level of the node voltage V1, and WH shows up as the logic level of the node voltage V2. In other words, a voltage difference occurs between the node voltage V1 and the node voltage V2 corresponding to a difference of remanent polarization state in the ferroelectric element.

However, the power supply voltage VDD is not yet turned on during the time points R2 to R3, so each of the node voltages V3 to V6 of the individual portions of the loop structure portion LOOP is "0" (GND), thereby the output signal Q is "0" (GND).

At the next time point R3, the first power supply voltage VDD1 is supplied to the loop structure portion LOOP while the second power supply voltage VDD2 is supplied to the nonvolatile storage portion NVM in the state where each of the control signals E1 and E2 is "0" (GND), i.e., in the state where the data write driver is disabled, and the normal loop is disabled in the loop structure portion LOOP. In this case, the signal line indicated by the thick line in FIG. 6 is in the floating state.

Note that during the time points R3 to R4, the control signal E2 becomes "0" (GND) so that the second input ends (0) of the multiplexer MUX1 and the multiplexer MUX2 are selected, and therefore the logic level of the node voltage V3 becomes WL while the logic level of the node voltage V4 becomes WH. In addition, the logic level of the node voltage V5 becomes WH while the logic level of the node voltage V6 becomes WL. In this way, during the time points R3 to R4, the node voltages V1 to V6 of the individual portions of the device are still in an unstable state (the state where the logic level inversion is not completed in the inverter INV3 and the inverter INV4 so that output logic levels thereof are not completely "0" (GND) or "1" (VDD1)).

At the next time point R4, the control signal E2 becomes "1" (VDD1) so that the first input ends (1) of the multiplexer MUX1 and the multiplexer MUX2 are selected, and the normal loop is formed in the loop structure portion LOOP. Along with this signal path switching, the output end of the inverter INV4 (having the logic level WH) is connected to the input end of the inverter INV3 (having the logic level WH), and the output end of the inverter INV3 (having the logic level WL) is connected the input end of the inverter INV4 (having the logic level WL). Therefore, no mismatch occurs in the signal logic level (WH or WL) of each node. After that, during the period while the normal loop is formed in the loop structure portion LOOP, the inverter INV3 receives the input of the logic level WL and tries to raise the output logic level to "1" (VDD1) while the inverter INV4 receives the input of the logic level WH and tries to lower the output logic level to "0" (GND). As a result, the output logic level of the inverter INV3 is secured to be "0" (GND) from the unstable logic level WL, and the output logic level of the inverter INV4 is secured to be "1" (VDD1) from the unstable logic level WH.

In this way, as the loop structure portion LOOP is made the normal loop at the time point R4, the signal read out from the ferroelectric element (the potential difference between the node voltage V1 and the node voltage V2) is amplified by the loop structure portion LOOP. Thus, the stored data before the power supply is turned off ("1" (VDD1) in the example of FIG. 9) is restored as the output signal Q.

After that, at the time point R5, the F reset signal FRST becomes "1" (VDD2) again so that the transistors Q1a, Q1b, Q2a and Q2b are turned on, and each of the ferroelectric elements CL1a, CL1b, CL2a and CL2b is short-circuited at the ends. Therefore, no voltage can be applied to the ferroelectric elements CL1a, CL1b, CL2a and CL2b. In this case, each of the first plate line PL1 and the second plate line PL2 is "0" (GND). Therefore, the data holding device is reset to the state similar to the state before the time point W1, i.e., to the normal operation state.

As described above, the data reading action in FIG. 9 is different from the data reading action of FIG. 3, and starts to derive the voltage signals (node voltages V1 and V2) corresponding to the remanent polarization state inside the ferroelectric element before the first power supply voltage VDD1 and the second power supply voltage VDD2 are turned on. With this structure, it is possible to reduce operation steps after the first power supply voltage VDD1 and the second power supply voltage VDD2 are turned on (the operational example of FIG. 3 requires three steps (time points R3, R4 and R5) while the operational example of FIG. 9 requires only two steps (time points R4 and R5)), so that time necessary for resetting to the normal operation can be shortened.

Next, characteristics of the ferroelectric element that is used for the data holding device of the present embodiment will be described in detail.

Figure 10:
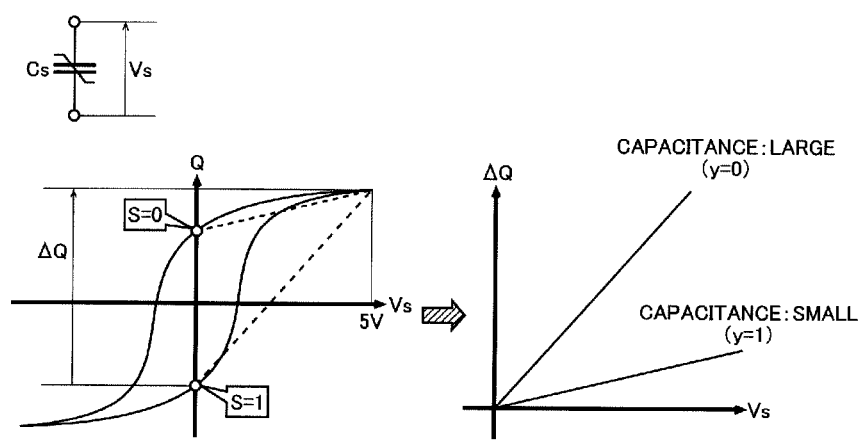
FIG. 10 is a diagram illustrating characteristics of the ferroelectric element.

FIG. 10 is a diagram illustrating characteristics of the ferroelectric element. Note that the upper section in FIG. 10 schematically illustrates a manner of applying the voltage Vs to the ferroelectric element Cs. In addition, the lower left section in FIG. 10 illustrates a hysteresis characteristic of the ferroelectric element Cs, and the lower right section illustrates a capacitance characteristic of the ferroelectric element Cs.

As illustrated in FIG. 10, the ferroelectric element Cs has a capacitance characteristic that changes in accordance with the remanent polarization state when the voltage Vs is applied between ends thereof. Specifically, when the positive voltage Vs is applied between the ends of the ferroelectric element Cs so that the ferroelectric element Cs becomes the non-inverted state (S=0), a capacitance value thereof decreases. On the contrary, when the negative voltage Vs is applied between the ends of the ferroelectric element Cs so that the ferroelectric element Cs becomes the inverted state (S=1), a capacitance value thereof increases. Therefore, in order to read out data stored in the ferroelectric element Cs, it is necessary to convert a difference of the above-mentioned capacitance value into a voltage value.

Therefore, the data holding device of the present embodiment reads out data from the nonvolatile storage portion NVM by using a capacitive coupling between the ferroelectric element in the non-inverted state (S=0) and the ferroelectric element in the inverted state (S=1).

Figure 11:
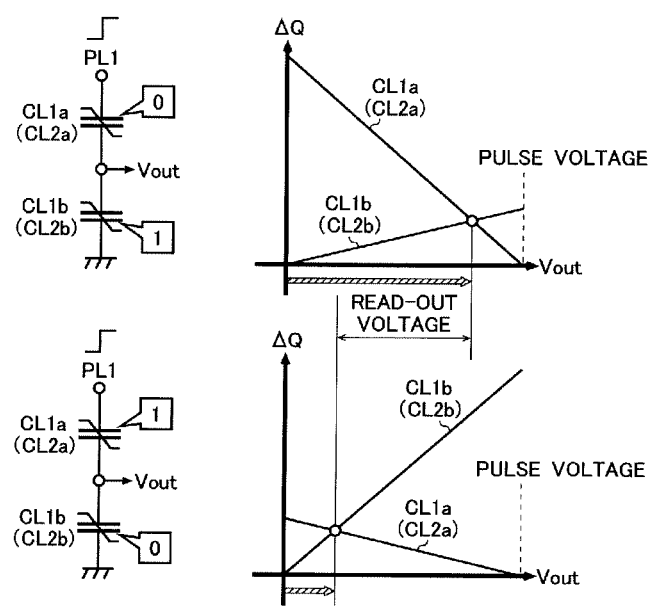
FIG. 11 is a diagram illustrating a data reading method using the capacitive coupling between the ferroelectric elements.

FIG. 11 is a diagram illustrating a data reading method using the capacitive coupling between the ferroelectric elements. Note that the upper section in FIG. 11 illustrates the capacitance characteristic when the ferroelectric element CL1a (ferroelectric element CL2a) is in the inverted state (S=1) while the ferroelectric element CL1b (ferroelectric element CL2b) is in the non-inverted state (S=0). On the contrary, the lower section in FIG. 11 illustrates the capacitance characteristic when the ferroelectric element CL1a (ferroelectric element CL2a) is in the non-inverted state (S=0) while the ferroelectric element CL1b (ferroelectric element CL2b) is in the inverted state (S=1).

As described above, when data is written in the ferroelectric element, the remanent polarization state becomes opposite between the ferroelectric elements CL1a and CL1b as well as between the ferroelectric elements CL2a and CL2b. Therefore, the capacitance characteristic has the following relationship. The larger one of the capacitance values is, the smaller the other capacitance value is.

Therefore, two ferroelectric elements CL1a and CL1b, as well as ferroelectric elements CL2a and CLK2b having opposite remanent polarization states are connected in series, and a pulse voltage is applied to an end thereof. Then, the node voltages V1 and V2 appearing at the connection nodes between the elements (that is a voltage value determined by a ratio of capacitance values and is referred to as a read-out voltage Vout in FIG. 11) are detected. Thus, a read out margin can be substantially improved with amplitude of the read-out voltage Vout being secured up to near 1 volt.

In addition, the data holding device of the present embodiment compares the node voltage V1 corresponding to a capacitance ratio between the ferroelectric elements CL1a and CL1b with the node voltage Vb corresponding to a capacitance ratio between the ferroelectric elements CL2a and CL2b, so as to perform the 0-1 decision of the data read out from the nonvolatile storage portion NVM. Therefore, it is not necessary to set a threshold value of the inverter exactly.

Figure 12:
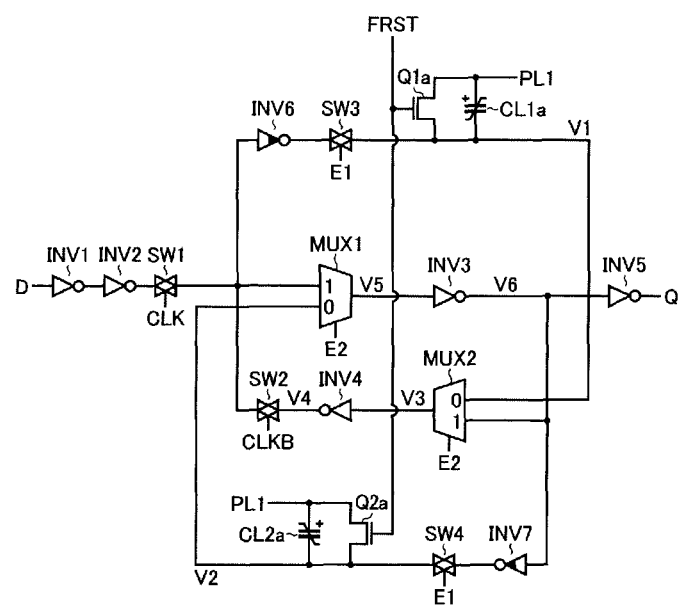
FIG. 12 is a circuit diagram illustrating a second variation example of the data holding device according to the present invention.
Figure 13:
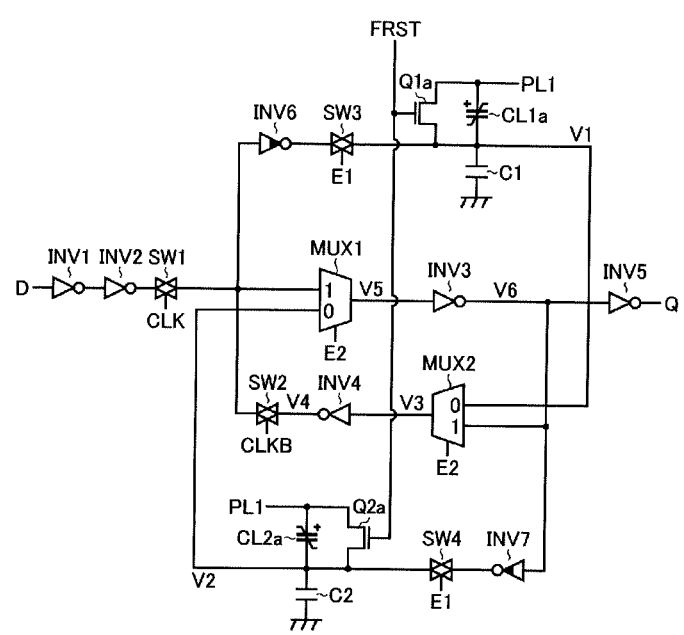
FIG. 13 is a circuit diagram illustrating a third variation example of the data holding device according to the present invention.

In this way, the data holding device of the present embodiment uses the data reading method utilizing the capacitive coupling between the ferroelectric elements, but the present invention is not limited to this structure. It is possible to adopt a structure illustrated in FIG. 12 (second variation example) in which data is read out from the nonvolatile storage portion NVM by utilizing a capacitive coupling between the ferroelectric element CL1a or CL2a and the gate capacitance of the transistor that constitutes the inverter INV3 or INV4 (in other words, the structure obtained by eliminating the ferroelectric elements CL1b and CL2b, and the transistors Q1b and C2b from the structure of FIG. 1). Alternatively, it is possible to adopt a structure illustrated in FIG. 13 (third variation example) in which data is read out from the nonvolatile storage portion NVM by utilizing a capacitive coupling between the ferroelectric element CL1a or CL1b and other capacitance element C1 or C2.

Figure 14:
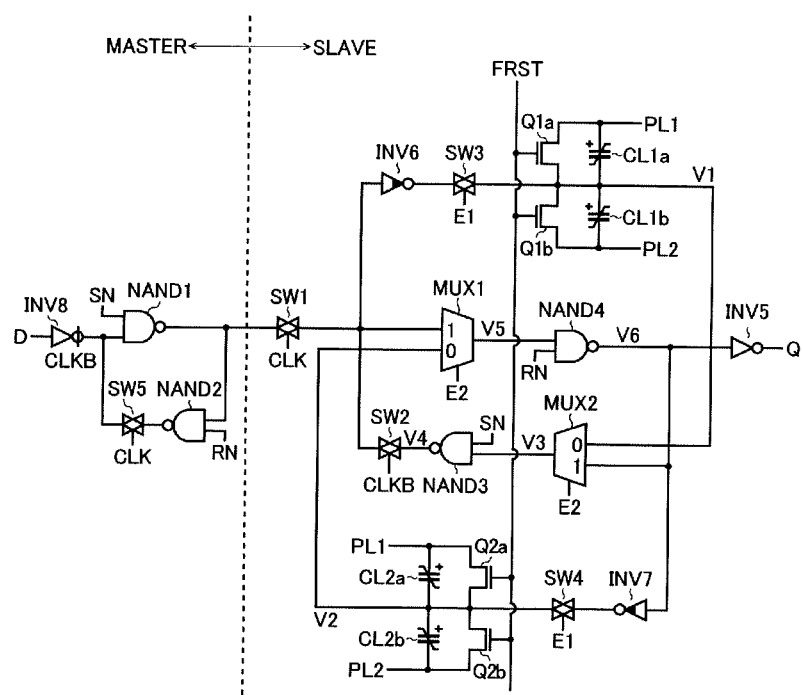
FIG. 14 is a circuit diagram illustrating an application example to a D flip flop.

FIG. 14 is a circuit diagram illustrating an example of an application to a D flip flop (register) having a set/reset function.

As illustrated in FIG. 14, when the D flip flop is constituted, a latch circuit is connected in series to a two-stage set (a master and a slave), but it is not necessary that both the master and the slave are nonvolatile. It is sufficient if the present invention is applied to only the latch circuit on the slave side.

Figure 15:
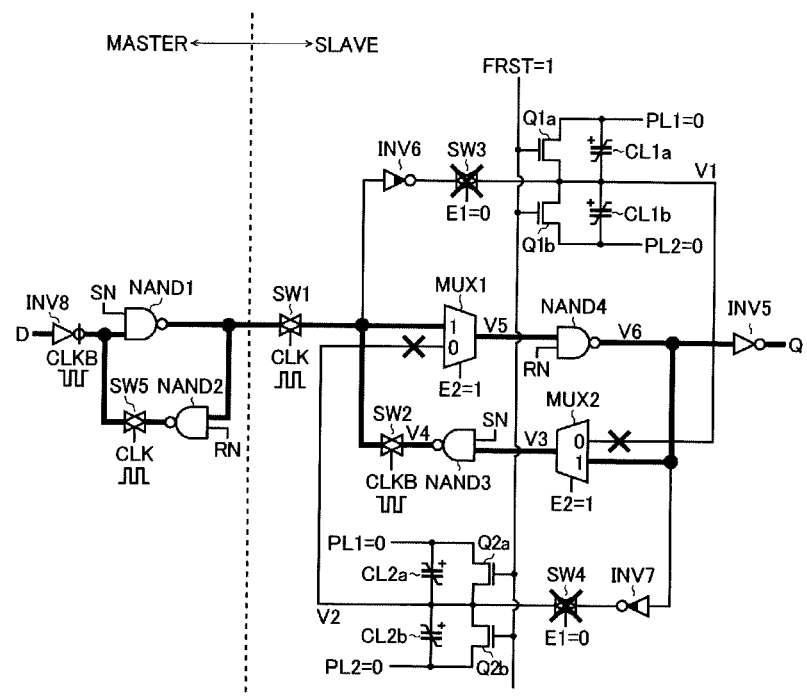
FIG. 15 is a circuit diagram illustrating a signal path in a normal operation.
Figure 16:
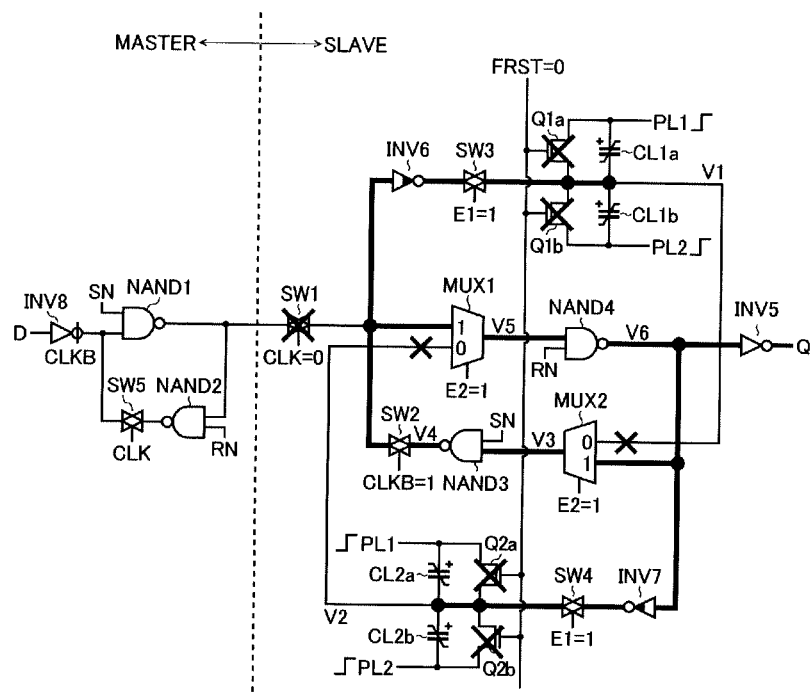
FIG. 16 is a circuit diagram illustrating a signal path in a data writing action.
Figure 17:
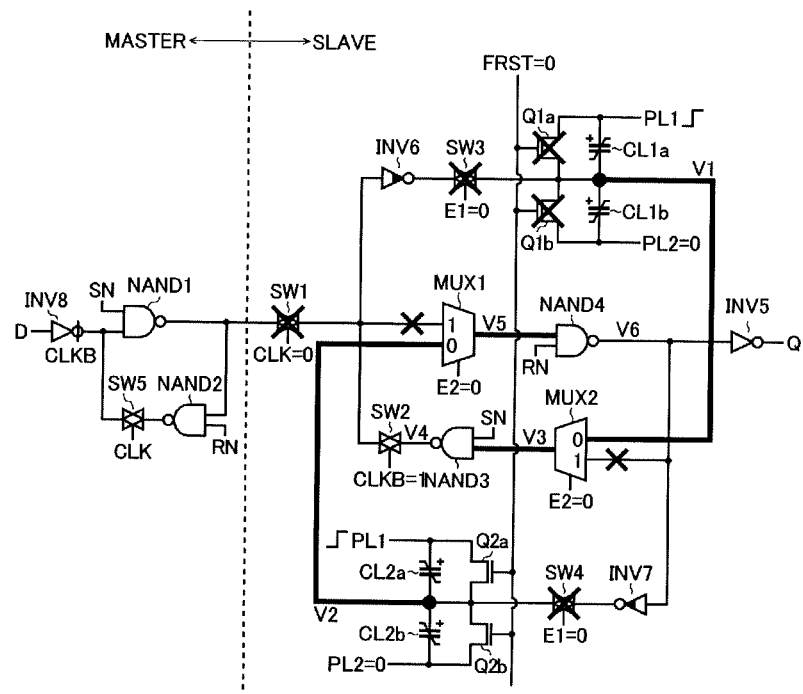
FIG. 17 is a circuit diagram illustrating a signal path in a data reading action.

In addition, the normal operation, the data writing action in the ferroelectric element, and the data reading action from the ferroelectric element are the same as described above except that the latch circuit on the master side is connected. The signal path in each operation also does not specially require overlapping description as illustrated in FIGS. 15 to 17.

However, the D flip flop illustrated in FIG. 14 uses not the inverters but the NOT-AND circuits NAND1 to NAND4 as the logic gates forming the loop structure portion so as to realize the set/reset function. Note that if a set signal SN supplied to the NOT-AND circuits NAND1 and NAND3 is "0" (GND), the output signal Q is forced to be "1" (VDD1). If a reset signal SN supplied to the NOT-AND circuits NAND2 and NAND4 is "0" (GND), the output signal Q is forced to be "0" (GND). Therefore, the set signal SN and the reset signal RN are required to be "1" (VDD1) when data is written or read.

Figure 18:
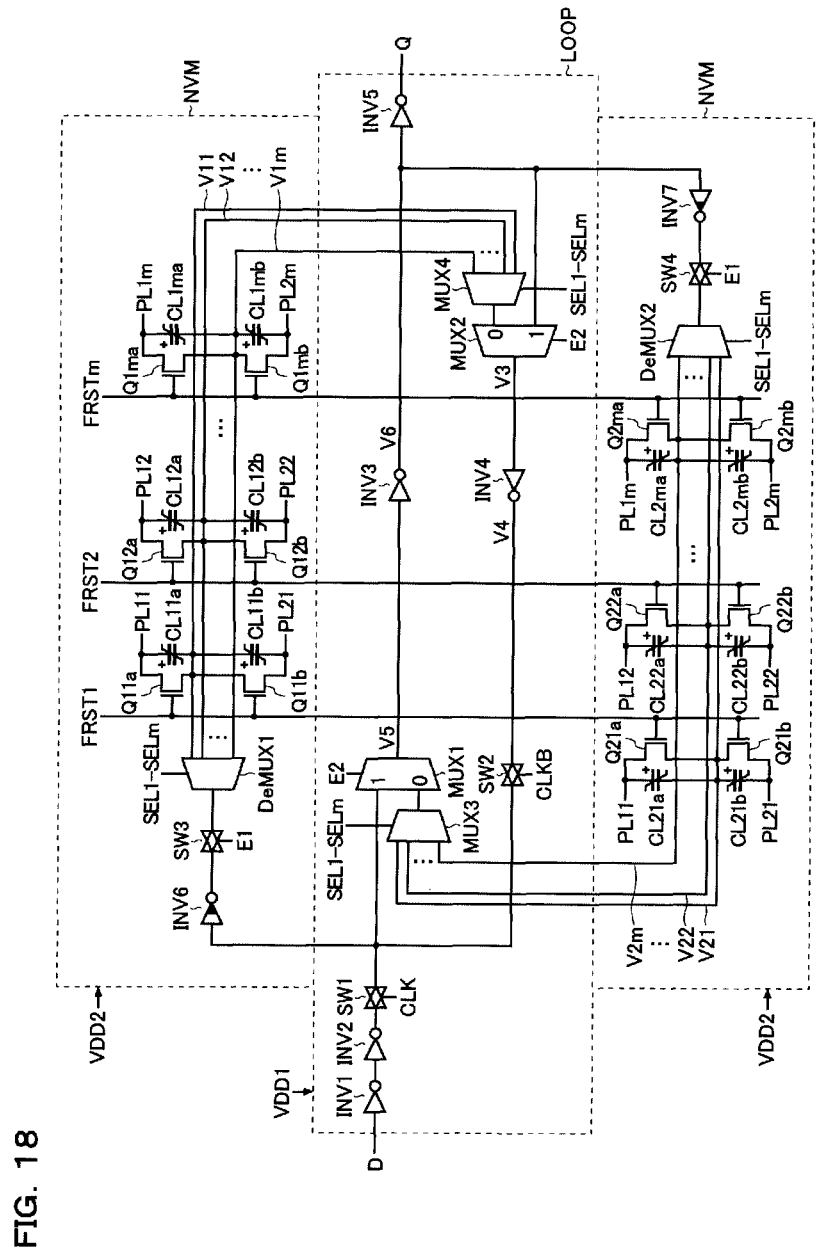
FIG. 18 is a circuit diagram illustrating a fourth variation example of the data holding device according to the present invention.

Next, a fourth variation example of the data holding device according to the present invention will be described in detail with reference to FIG. 18. FIG. 18 is a circuit diagram illustrating a fourth variation example of the data holding device according to the present invention.

The data holding device illustrated in FIG. 18 is a latch circuit including inverters INV1 to INV7, pass switches SW1 to SW4, multiplexers MUX1 to MUX4, demultiplexers DeMUX1 and DeMUX2, N-channel field-effective transistors Q11a-Q1ma, Q11b-Q1mb, Q21a-Q2ma, and Q21b-Q2mb, and ferroelectric elements (ferroelectric capacitors) CL11a-CL1ma, CL11b-CL1mb, CL21a-CL2ma, and CL21b-CL2mb.

An input end of the inverter INV1 is connected to a receiving end of the data signal (D). An output end of the inverter INV1 is connected to an input end of the inverter INV2. An output end of the inverter INV2 is connected to a first input end (1) of the multiplexer MUX1 via the pass switch SW1. An output end of the multiplexer MUX1 is connected to an input end of the inverter INV3. An output end of the inverter INV3 is connected to an input end of the inverter INV5. An output end of the inverter INV5 is connected to an outlet end of the output signal (Q). The first input end (1) of the multiplexer MUX2 is connected to the output end of the inverter INV3. An output end of the multiplexer MUX2 is connected to an input end of the inverter INV4. An output end of the inverter INV4 is connected to the first input end (1) of the multiplexer MUX1 via the pass switch SW2.

In this way, the data holding device of the present embodiment includes the loop structure portion LOOP that uses the two logic gate connected like a loop (inverters INV3 and INV4 in FIG. 18) so as to hold the input data signal D.

Note that the loop structure portion LOOP is driven by being supplied with the first power supply voltage VDD1 (e.g., 0.6 volts).

An input end of the inverter INV6 is connected to the first input end (1) of the multiplexer MUX1. An output end of the inverter INV6 is connected to an input end of the demultiplexer DeMUX1 via the pass switch SW3. A first output end to an m-th output end of the demultiplexer DeMUX1 are connected to a first input end to an m-th input end of the multiplexer MUX4, respectively. An output end of the multiplexer MUX4 is connected to a second input end (0) of the multiplexer MUX2.

An input end of the inverter INV7 is connected to the first input end (1) of the multiplexer MUX2. An output end of the inverter INV7 is connected to an input end of the demultiplexer DeMUX2 of the pass switch SW4. A first output end to an m-th output end of the demultiplexer DeMUX2 are connected to a first input end to an m-th input end of the multiplexer MUX3, respectively. The output end of the multiplexer MUX3 is connected to a second input end (0) of the multiplexer MUX1.

Positive ends of the ferroelectric elements CL11a-CL1ma are connected to plate lines PL11-PL1m, respectively. Negative ends of the ferroelectric elements CL11a-CL1ma are connected to a first output end to an m-th output end of the demultiplexer DeMUX1, respectively. The transistors Q11a-Q1ma are connected between the ends of the ferroelectric elements CL11a to 1ma, respectively. Gates of the transistors Q11a-Q1ma are connected to receiving ends of F reset signals FRST1-FRSTm, respectively.

Positive ends of the ferroelectric elements CL11b-CL1mb are connected to a first output end to an m-th output end of the demultiplexer DeMUX1, respectively. Negative ends of the ferroelectric elements CL11b-CL1mb are connected to plate lines PL21-PL2m, respectively. The transistors Q11b-Q1mb are connected between the ends of the ferroelectric elements CL11b-CL1mb, respectively. Gates of the transistors Q11b-Q1mb are connected to receiving ends of the F reset signals FRST1-FRSTm, respectively.

Positive ends of the ferroelectric elements CL21a-CL2ma are connected to plate lines PL11-PL1m, respectively. Negative ends of the ferroelectric elements CL21a-CL2ma are connected to a first output end to an m-th output end of the demultiplexer DeMUX2, respectively. The transistors Q21a-Q2ma are connected between the ends of the ferroelectric elements CL21a-CL2ma, respectively. Gate of the transistors Q21a-Q2ma are connected to receiving ends of the F reset signals FRST1-FRSTm, respectively.

Positive ends of the ferroelectric elements CL21b-CL2mb are connected to a first output end to an m-th output end of the demultiplexer DeMUX2, respectively. Negative ends of the ferroelectric elements CL21b-CL2mb are connected to the plate lines PL21-PL2m, respectively. The transistors Q21b-Q2mb are connected between the ends of the ferroelectric elements CL21b-CL2mb, respectively. Gates of the transistors Q21b-Q2mb are connected to receiving ends of the F reset signals FRST1-FRSTm, respectively.

As described above, the data holding device of the present embodiment includes the nonvolatile storage portion NVM that uses hysteresis characteristics of the ferroelectric elements (CL11a-CL1ma, CL11b-CL1mb, CL21a-CL2ma, and CL21b-CL2mb) so as to store the data D held in the loop structure portion LOOP, in a nonvolatile manner.

Note that the nonvolatile storage portion NVM is driven by being supplied with a second power supply voltage VDD2 (e.g., 1.2 volts) that is higher than the first power supply voltage VDD1.

In addition, among the structural elements described above, the pass switch SW1 is turned on and off in accordance with the clock signal CLK while the pass switch SW2 is turned on and off in accordance with the reverse clock signal CLKB (logical inversion signal of the clock signal CLK). In other words, the pass switch SW1 and the pass switch SW2 are turned on and off in an exclusive (complementary) manner to each other.

On the other hand, each of the pass switches SW3 and SW4 is turned on and off in accordance with the control signal E1. In addition, each of the multiplexers MUX1 and MUX2 is switched between the signal paths in accordance with the control signal E2. In addition, each of the multiplexers MUX3 and MUX4 and the demultiplexers DeMUX1 and DeMUX2 is switched between the signal paths in accordance with the control signals SEL1-SELm. In other words, in the data holding device of the present embodiment, the multiplexers MUX1 to MUX4, the demultiplexers DeMUX1 and DeMUX2, the inverters INV6 and INV7, and the pass switches SW3 and SW4 function as the circuit separating portion SEP for electrically separating the loop structure portion LOOP from the nonvolatile storage portion NVM.

Note that among the circuit elements forming the circuit separating portion SEP, the multiplexers MUX1 to MUX4 included in the loop structure portion LOOP is driven by being supplied with the first power supply voltage VDD1, and the demultiplexers DeMUX1 and DeMUX2, and the pass switches SW3 and SW4 included in the nonvolatile storage portion NVM are driven by being supplied with the second power supply voltage VDD2.

In addition, the inverters INV6 and INV7 are driven by being supplied with both the first power supply voltage VDD1 and the second power supply voltage VDD2, and have a function as a level shifter for converting a voltage level of the data D communicated between the loop structure portion LOOP and the nonvolatile storage portion NVM. Note that the circuit structure of the inverters INV6 and INV7 is already described, so overlapping description will be omitted. In addition, as illustrated in FIG. 7, the three-state inverters INV6' and INV7' may be used instead of the inverter INV6, the pass switch SW3, the inverter INV7 and the pass switch SW4.

In this way, the data holding device having the above-mentioned structure is extended from the structure illustrated in FIG. 1 so that the data D is stored by m bits (m 2), and includes a first storage area to an m-th storage area that can be selected in accordance with control signals SEL1-SELm. Note that the description will be added below with reference to the example illustrated in FIG. 18. An x-th storage area ($1 \leq x \leq m$) is formed of ferroelectric elements CL1xa, CL1xb, CL2xa and CL2xb, and transistors Q1xa, Q1xb, Q2xa and Q2xb. However, the present invention is not limited to this structure, and it is also possible to make modification similarly to FIG. 12 or 13.

Next, an operation of the data holding device having the above-mentioned structure will be described in detail. Note that in the following description, node voltages at individual portions are denoted as below. Voltages that appear at a first output end to an m-th output end of the demultiplexer DeMUX1 (a first input end to an m-th input end of the multiplexer MUX4) are denoted by V11 to V1m, voltages that appear at a first output end to an m-th output end of the demultiplexer DeMUX2 (a first input end to an m-th input end of the multiplexer MUX3) are denoted by V21 to V2m, a voltage that appears at an input end of the inverter INV4 is denoted by V3, a voltage that appears at an output end of the inverter INV4 is denoted by V4, a voltage that appears at an input end of the inverter INV3 is denoted by V5, and a voltage that appears at an output end of the inverter INV3 is denoted by V6.

Figure 19:
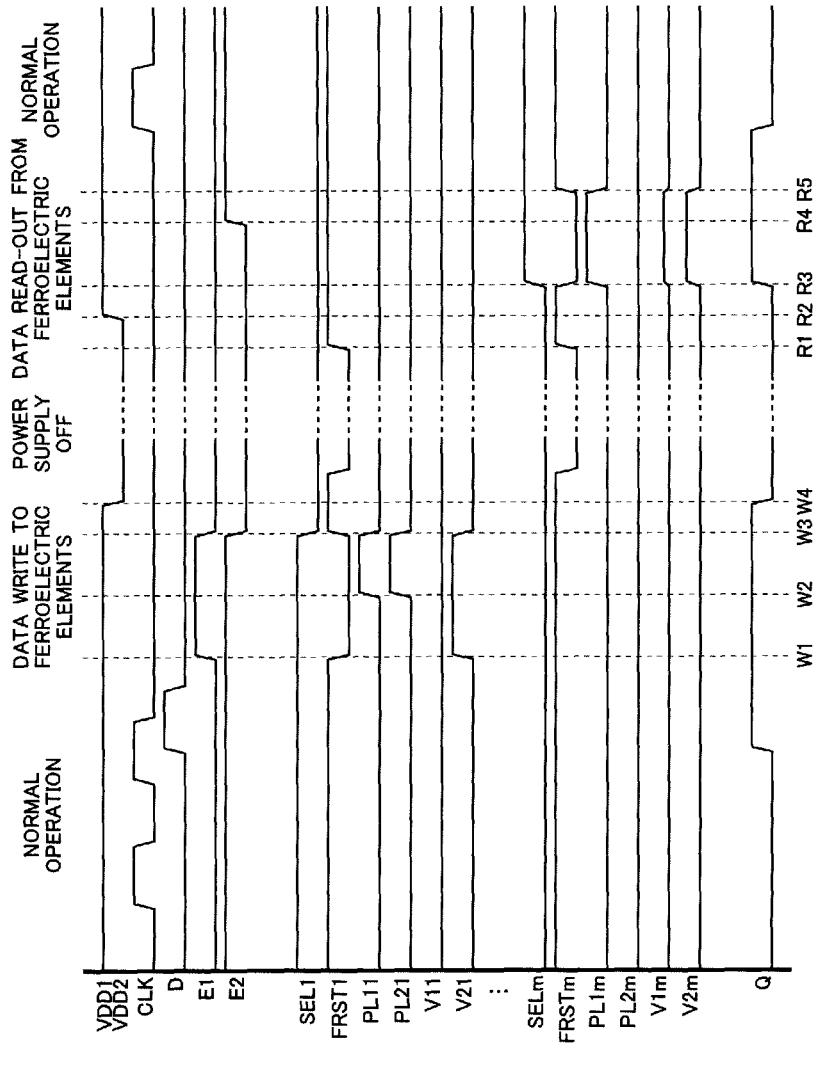
FIG. 19 is a timing chart illustrating an operational example of a data holding device according to the present invention.

FIG. 19 is a timing chart illustrating an operational example of the data holding device according to the present invention (an operation of writing the data D in the first storage area and reading out the data D from the m-th storage area), and illustrates voltage waveforms of the power supply voltages (VDD1 and VDD2), the clock signal CLK, the data signal D, the control signal E1, the control signal E2, the control signal SEL1, the F reset signal FRST1, the applied voltage of the plate line PL11, the applied voltage of the plate line PL21, the node voltage V11, the node voltage V21, the control signal SELm, the F reset signal FRSTm, the applied voltage of the plate line PL1m, the applied voltage of the plate line PL2m, the node voltage V1m, the node voltage V2m, and the output signal Q in this order from the top.

Note that the control signal SELy, the F reset signal FRSTy, the applied voltage of the plate line PL1y, the applied voltage of the plate line PL2y, the node voltage V1y, and the node voltage V2y concerning a y-th storage area (1<y<m) that is not selected as a write destination or a read source of the data D are the same as those of the m-th storage area that is not selected as a write destination of the data D during the writing action of the data D, and are the same as those of the first storage area that is not selected as a read source of the data D during the reading action of the data D. Therefore, illustration and description thereof will be omitted appropriately.

First, the normal operation of the data holding device will be described.

Until the time point W1, the F reset signals FRST1-FRSTm are all "1" (high level of VDD2), and transistors Q11a-Q1ma, Q11b-Q1mb, Q21a-Q2ma, and Q21b-Q2mb are all turned on, so that each of the ferroelectric elements CL11a-CL1ma, CL11b-CL1mb, CL21a-CL2ma, and CL21b-CL2mb is short-circuited at the ends. Therefore, no voltage can be applied to the ferroelectric elements CL11a-CL1ma, CL11b-CL1mb, CL21a-CL2ma, and CL21b-CL2mb. Note that each of the plate lines PL11-PL1m and the plate lines PL21-PL2m is "0" (low level of GND).

In addition, until the time point W1, the control signal E1 is "0", so that the pass switch SW3 and the pass switch SW4 are turned off. Therefore, the data write drivers (inverters INV6 and INV7 in the example of FIG. 18) are both disabled.

In addition, until the time point W1, the control signal E2 is "1" (VDD1), so that the first input ends (1) of the multiplexer MUX1 and the multiplexer MUX2 are selected. Therefore, the normal loop is formed in the loop structure portion LOOP.

Therefore, during the high level period of the clock signal CLK, the pass switch SW1 is turned on while the pass switch SW2 is turned off, so that the data signal D becomes the output signal Q as it is. On the other hand, during the low level period of the clock signal CLK, the pass switch SW1 is turned off while the pass switch SW2 is turned on. Therefore, the data signal D is latched at the falling edge of the clock signal CLK.

Next, the data writing action in the first storage area will be described.

During the time points W1 to W3, the clock signal CLK is "0" (GND) while the reverse clock signal CLKB is "1" (VDD1). Therefore, the first pass switch SW1 is turned off while the second pass switch is turned on. In this way, logic levels of the clock signal CLK and the reverse clock signal CLKB are fixed in advance, so that stability of the data writing action in the ferroelectric element can be enhanced.

In addition, during the time points W1 to W3, the control signal SEL1 is "1" (VDD2) while the other control signals SEL2 to SELm are "0" (GND) so as to select the first storage area as the write destination of the data D. Thus, the demultiplexers DeMUX1 and DeMUX2 become the state where the signal path connecting the input end and the first output end is selected, while the multiplexers MUX3 and MUX4 become the state where the signal path connecting the output end and the first input end is selected.

In addition, during the time points W1 to W3, the F reset signal FRST1 is "0" (GND) so that the transistors Q11a, Q11b, Q21a and Q21b are turned off. Therefore, a voltage can be applied to the ferroelectric elements CL11a, CL11b, CL21a and CL21b.

On the other hand, the F reset signals FRST2 to FRSTm are kept to be "1" (VDD2), so that changing data can be avoided in the second storage area to the m-th storage area.

In addition, during the time points W1 to W3, the control signal E1 is "1" (VDD2) so that the pass switch SW3 and the pass switch SW4 are turned on. Therefore, each of the data write drivers (inverters INV6 and INV7 in the example of FIG. 18) is enabled.

Note that during the time points W1 to W3, the control signal E2 is "1" (VDD1) in the same manner as before, so that the first input ends (1) of the multiplexer MUX1 and the multiplexer MUX2 are selected. Therefore, the normal loop is formed in the loop structure portion LOOP.

In addition, the plate lines PL11 and PL21 are "0" (GND) during the time points W1 to W2, and the plate lines PL11 and PL21 are "1" (VDD2) during the time points W2 to W3. In other words, the same pulse voltage is applied to the plate lines PL11 and PL21. By such the application of the pulse voltage, the remanent polarization state inside the ferroelectric element is set to either the inverted state or the non-inverted state.

Specific description will be added as below with reference to the example of FIG. 19. The output signal Q is "1" (VDD1) at the time point W1, so the node voltage V11 becomes "0" (GND) while the node voltage V21 becomes "1" (VDD1). Therefore, during the time points W1 to W2, while the plate lines PL11 and PL21 are both "0" (GND), no voltage is applied between the ends of the ferroelectric elements CL11a and CL11b. A negative voltage is applied between the ends of the ferroelectric element CL21a, and a positive voltage is applied between the ends of the ferroelectric element CL21b. On the other hand, during the time points W2 to W3, while the plate lines PL11 and PL21 are both "1" (VDD2), no voltage is applied between the ends of the ferroelectric elements CL21a and CL21b. A positive voltage is applied between the ends of the ferroelectric element CL11a, and a negative voltage is applied between the ends of the ferroelectric element CL11b.

In this way, when the pulse voltage is applied to the plate lines PL11 and PL21, the remanent polarization state inside the ferroelectric element is set to either the inverted state or the non-inverted state. Note that the remanent polarization state becomes opposite between the ferroelectric elements CL11a and CL11b as well as between the ferroelectric elements CL21a and CL21b. In addition, the remanent polarization state becomes opposite also between the ferroelectric elements CL11a and CL21a as well as between the ferroelectric elements CL11b and CL21b.

Note that during the time points W1 to W3, each of the plate lines PL12 to PL1m and PL22 to PL2m is kept to be "0" (GND).

At the time point W3, the F reset signal FRST1 becomes "1" (VDD2) again, so that the transistors Q11a, Q11b, Q21a and Q21b are turned on, and each of the ferroelectric elements CL11a, CL11b, CL21a and CL21b is short-circuited at the ends. Therefore, no voltage can be applied to the ferroelectric elements CL11a, CL11b, CL21a and CL21b. In this case, each of the plate lines PL11 and PL21 is "0" (GND). In addition, the control signal SEL1 is also "0" (GND).

In addition, at the time point W3, the control signal E1 becomes "0" (GND) again, so that the pass switch SW3 and the pass switch SW4 are turned off. Therefore, each of the data write drivers (inverters INV6 and INV7 in the example of FIG. 18) is disabled. Note that the control signal E2 is not minded but is "0" (GND) in the example of FIG. 19.

In addition, at the time point W3, the F reset signals FRST2-FRSTm are all kept to be "1" (VDD2), and the control signals SEL2-SELm, the plate lines PL12-PL1m and PL22-PL2m are all kept to be "0" (GND).

Further, at the time point W4, supply of the first power supply voltage VDD1 to the loop structure portion LOOP and supply of the second power supply voltage VDD2 to the nonvolatile storage portion NVM are both interrupted. In this case, the F reset signals FRST1-FRSTm are all kept to be "1" (VDD2) from the time before the first power supply voltage VDD1 and the second power supply voltage VDD2 are cut off. The transistors Q11a-Q1ma, Q11b-Q1mb, Q21a-Q2ma and Q21b-Q2mb are turned on, so that each of the ferroelectric elements CL11a-CL1ma, CL11b-CL1mb, CL21a-CL2ma and CL21b-CL2mb is short-circuited at the ends. Therefore, no voltage can be applied to the ferroelectric elements CL11a-CL1ma, CL11b-CL1mb, CL21a-CL2ma and CL21b-CL2mb. Even if a voltage fluctuation occurs when the power supply is interrupted, no voltage is applied to the ferroelectric elements CL11a-CL1ma, CL11b-CL1mb, CL21a-CL2ma and CL21b-CL2mb without intention, so that changing data can be avoided.

Next, the data reading action from the m-th storage area will be described.

During the time points R1 to R5, the clock signal CLK is "0" (GND), and the reverse clock signal CLKB is "1" (VDD1). Therefore, the first pass switch SW1 is turned off, and the second pass switch is turned on. In this way, logic levels of the clock signal CLK and the reverse clock signal CLKB are fixed in advance, so that stability of the data reading action from the ferroelectric element can be enhanced.

At the time point R1, all the F reset signals FRST1-FRSTm are "1" (VDD2) first, and the transistors Q11a-Q1ma, Q11b-Q1mb, Q21a-Q2ma and Q21b-Q2mb are turned on, so that each of the ferroelectric elements CL11a-CL1ma, CL11b-CL1mb, CL21a-CL2ma and CL21b-CL2mb is short-circuited at the ends. Therefore, no voltage can be applied to the ferroelectric elements CL11a-CL1ma, CL11b-CL1mb, CL21a-CL2ma and CL21b-CL2mb. Even if a voltage fluctuation occurs when the power supply is turned on, no voltage is applied to the ferroelectric elements CL11a-CL1ma, CL11b-CL1mb, CL21a-CL2ma and CL21b-CL2mb without intention, so that changing data can be avoided.

Note that at the time point R1, each of the plate lines PL11-PL1m and the plate lines PL21-PL2m is "0" (low level of GND).

At the time point R2, in the state where each of the control signals E1 and E2 is "0" (GND) (i.e., in the state where the data write drivers are disabled and the normal loop is disabled in the loop structure portion LOOP), the first power supply voltage VDD1 for the loop structure portion LOOP and the second power supply voltage VDD2 for the nonvolatile storage portion NVM are turned on.

At the next time point R3, the control signal SELm becomes "1" (VDD2) so as to select the m-th storage area as a read source of the data D, and other control signals SEL1 to SEL(m−1) become "0" (GND). Thus, the demultiplexers DeMUX1 and DeMUX2 become the state where the signal path connecting the input end and the m-th output end is selected, while the multiplexers MUX3 and MUX4 become the state where the signal path connecting the output end and the m-th input end is selected.

In addition, at the time point R3, the F reset signal FRSTm becomes "0" (GND), so that the transistors Q1ma, Q1mb, Q2ma and Q2mb are turned off. Therefore, a voltage can be applied to the ferroelectric elements CL1ma, CL1mb, CL2ma and CL2mb, and the plate line PL1m becomes "1" (VDD2) while the plate line PL2m is kept to be "0" (GND). By such the application of the pulse voltage, voltage signals corresponding to the remanent polarization state inside the ferroelectric element appear as the node voltage V1m and the node voltage V2m.

With reference to an example of FIG. 19 (in the case where the data D of the logic level "1" is stored in the third storage area), concrete description will be given below. WL appears as a logic level of the node voltage V1m while WH appears as a logic level of the node voltage V2m. In other words, a voltage difference corresponding to a difference of the remanent polarization state in the ferroelectric element occurs between the node voltage V1m and the node voltage V2m.

In this case, during the time points R3 to R4, the control signal E2 is "0" (GND), and the second input ends (0) of the multiplexer MUX1 and the multiplexer MUX2 are selected. Therefore, the logic level of the node voltage V3 becomes WL while the logic level of the node voltage V4 becomes WH. In addition, the logic level of the node voltage V5 becomes WH while the logic level of the node voltage V6 becomes WL. In this way, during the time points R3 to R4, the node voltages V1m, V2m, and V3 to V6 of the individual portions of the device are still unstable state (the state where the logic level inversion is not completed in the inverter INV3 and the inverter INV4 so that output logic levels thereof are not completely "0" (GND) or "1" (VDD1)).

Note that at the time point R3, each of the F reset signals FRST1 to FRST(m−1) is kept to be "1" (VDD2), so that the control signals SEL1 to SEL(m−1) and plate lines PL11 to PL1(m−1) and PL21 to PL2(m−1) are all kept to be "0" (GND).

At the next time point R4, the control signal E2 becomes "1" (VDD1) so that the first input ends (1) of the multiplexer MUX1 and the multiplexer MUX2 are selected, and the normal loop is formed in the loop structure portion LOOP. Along with this signal path switching, the output end of the inverter INV4 (having the logic level WH) is connected to the input end of the inverter INV3 (having the logic level WH), and the output end of the inverter INV3 (having the logic level WL) is connected the input end of the inverter INV4 (having the logic level WL). Therefore, no mismatch occurs in the signal logic level (WH or WL) of each node. After that, during the period while the normal loop is formed in the loop structure portion LOOP, the inverter INV3 receives the input of the logic level WL and tries to raise the output logic level to "1" (VDD1) while the inverter INV4 receives the input of the logic level WH and tries to lower the output logic level to "0" (GND). As a result, the output logic level of the inverter INV3 is secured to be "0" (GND) from the unstable logic level WL, and the output logic level of the inverter INV4 is secured to be "1" (VDD1) from the unstable logic level WH.

In this way, at the time point R4, as the loop structure portion LOOP becomes the normal loop, the signal read out from the ferroelectric element (potential difference between the node voltage V1m and the node voltage V2m) is amplified by the loop structure portion LOOP. Thus, the stored data in the third storage area ("1" (VDD1) in the example of FIG. 19) is restored as the output signal Q.

After that, at the time point R5, the F reset signal FRSTm becomes "1" (VDD2) again, so that the transistors Q1ma, Q1mb, Q2ma and Q2mb are turned on. Therefore, each of the ferroelectric elements CL1ma, CL1mb, CL2ma and CL2mb is short-circuited at the ends, so that no voltage can be applied to the ferroelectric elements CL1ma, CL1mb, CL2ma and CL2mb. In this case, each of the plate line PL1m and the plate line PL2m is "0" (GND). Therefore, the data holding device is reset to the state similar to the state before the time point W1, i.e., to the normal operation state.

As described above, in the data holding device of the third variation example, the nonvolatile storage portion NVM for storing the data D held in the loop structure portion LOOP in a nonvolatile manner by using the hysteresis characteristic of the ferroelectric element includes m storage areas that uses the ferroelectric element and selects an storage area for use to be a write destination or a read source of the data D in accordance with the predetermined control signals SEL1-SELm. With such the structure, it is possible to realize the data holding device that is capable of switching a plurality of data D arbitrarily for use.

Note that the ferroelectric element is separated from the signal line in the normal operation of the data holding device, so a deterioration of performance (such as a decrease of speed or an increase of power consumption) of the data holding device is not caused by the increase of ferroelectric elements.

Figure 20:
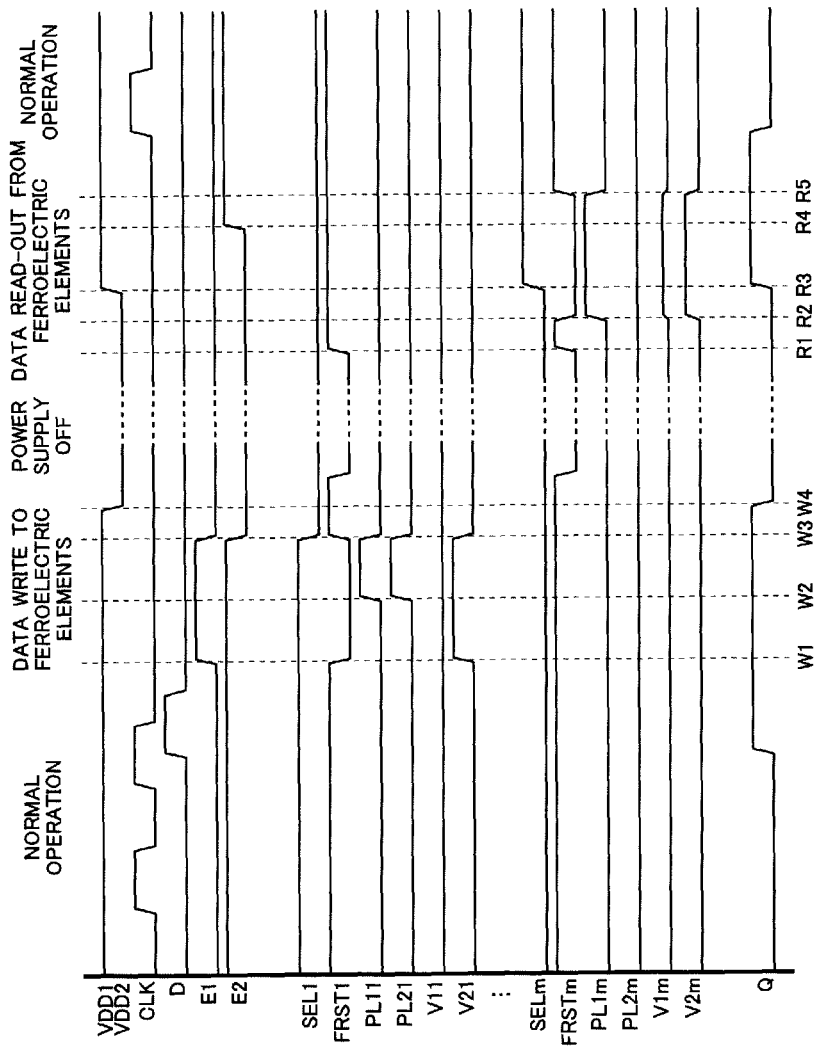
FIG. 20 is a timing chart illustrating another operational example of a data holding device according to the present invention.

Next, a variation example of the data reading action from the third storage area will be described in detail with reference to FIG. 20. FIG. 20 is a timing chart illustrating another operational example of the data holding device according to the present invention, in which voltage waveforms of the power supply voltages (VDD1 and VDD2), the clock signal CLK, the data signal D, the control signal E1, the control signal E2, the control signal SEL1, the F reset signal FRST1, the applied voltage of the plate line PL11, the applied voltage of the plate line PL21, the node voltage V11, the node voltage V21, the control signal SELm, the F reset signal FRSTm, the applied voltage of the plate line PL1m, the applied voltage of the plate line PL2m, the node voltage V1m, the node voltage V2m and the output signal Q are illustrated in this order from the top.

Note that the control signal SELy, the F reset signal FRSTy, the applied voltage of the plate line PL1y, the applied voltage of the plate line PL2y, the node voltage V1y, and the node voltage V2y concerning a y-th storage area (1<y<m) that is not selected as a write destination or a read source of the data D are the same as those of the m-th storage area that is not selected as a write destination of the data D during the writing action of the data D, and are the same as those of the first storage area that is not selected as a read source of the data D during the reading action of the data D. Therefore, illustration and description thereof will be omitted appropriately.

During the time points R1 to R5, the clock signal CLK is "0" (GND), and the reverse clock signal CLKB is "1" (VDD1). Therefore, the first pass switch SW1 is turned off, and the second pass switch is turned on. In this way, logic levels of the clock signal CLK and the reverse clock signal CLKB are fixed in advance, so that stability of the data reading action from the ferroelectric element can be enhanced.

At the time point R1, the F reset signals FRST1-FRSTm are "1" (VDD2) first, and the transistors Q11a-Q1ma, Q11b-Q1mb, Q21a-Q2ma and Q21b-Q2mb are turned on, so that each of the ferroelectric elements CL11a-CL1ma, CL11b-CL1mb, CL21a-CL2ma and CL21b-CL2mb is short-circuited at the ends. Therefore, no voltage can be applied to the ferroelectric elements CL11a-CL1ma, CL11b-CL1mb, CL21a-CL2ma and CL21b-CL2mb. Even if a voltage fluctuation occurs when the power supply is turned on, no voltage is applied to the ferroelectric elements CL11a-CL1ma, CL11b-CL1mb, CL21a-CL2ma and CL21b-CL2mb without intention, so that changing data can be avoided.

Note that at the time point R1, each of the plate lines PL11-PL1m and the plate lines PL21-PL2m is "0" (low level of GND).

At the time point R2, the F reset signal FRSTm becomes "0" (GND) so that the transistors Q1ma, Q1mb, Q2ma and Q2mb are turned off, and a voltage can be applied to the ferroelectric elements CL1ma, CL1mb, CL2ma and CL2mb. On the other hand, the plate line PL1m becomes "1" (VDD2) while the plate line PL2m is kept to be "0" (GND). By such the application of the pulse voltage, voltage signals corresponding to the remanent polarization state inside the ferroelectric element appear as the node voltage V1m and the node voltage V2m.

With reference to an example of FIG. 20 (in the case where the data D of the logic level "1" is stored in the third storage area), concrete description will be given below. WL appears as a logic level of the node voltage V1m while WH appears as a logic level of the node voltage V2m. In other words, a voltage difference corresponding to a difference of the remanent polarization state in the ferroelectric element occurs between the node voltage V1m and the node voltage V2m.

However, the first power supply voltage VDD1 is not yet turned on during the time points R2 to R3, so each of the node voltages V3 to V6 of the individual portions of the loop structure portion LOOP is "0" (GND), thereby the output signal Q is "0" (GND).

At the next time point R3, the control signal SELm becomes "1" (VDD2) so as to select the m-th storage area as a read source of the data D, and other control signals SEL1 to SEL(m−1) become "0" (GND). Thus, the demultiplexers DeMUX1 and DeMUX2 become the state where the signal path connecting the input end and the m-th output end is selected, while the multiplexers MUX3 and MUX4 become the state where the signal path connecting the output end and the m-th input end is selected.

In addition, at the time point R3, in the state where the control signals E1 and E2 are both "0" (GND) (i.e., in the state where the data write drivers are disabled and the normal loop is disabled in the loop structure portion LOOP), the first power supply voltage VDD1 for the loop structure portion LOOP and the second power supply voltage VDD2 for the nonvolatile storage portion NVM are turned on.

Note that during the time points R3 to R4, the control signal E2 becomes "0" (GND) so that the second input ends (0) of the multiplexer MUX1 and the multiplexer MUX2 are selected, and therefore the logic level of the node voltage V3 becomes WL while the logic level of the node voltage V4 becomes WH. In addition, the logic level of the node voltage V5 becomes WH while the logic level of the node voltage V6 becomes WL. In this way, during the time points R3 to R4, the node voltages V1 to V6 of the individual portions of the device are still in an unstable state (the state where the logic level inversion is not completed in the inverter INV3 and the inverter INV4 so that output logic levels thereof are not completely "0" (GND) or "1" (VDD1)).

At the next time point R4, the control signal E2 becomes "1" (VDD1) so that the first input ends (1) of the multiplexer MUX1 and the multiplexer MUX2 are selected, and the normal loop is formed in the loop structure portion LOOP. Along with this signal path switching, the output end of the inverter INV4 (having the logic level WH) is connected to the input end of the inverter INV3 (having the logic level WH), and the output end of the inverter INV3 (having the logic level WL) is connected the input end of the inverter INV4 (having the logic level WL). Therefore, no mismatch occurs in the signal logic level (WH or WL) of each node. After that, during the period while the normal loop is formed in the loop structure portion LOOP, the inverter INV3 receives the input of the logic level WL and tries to raise the output logic level to "1" (VDD1) while the inverter INV4 receives the input of the logic level WH and tries to lower the output logic level to "0" (GND). As a result, the output logic level of the inverter INV3 is secured to be "0" (GND) from the unstable logic level WL, and the output logic level of the inverter INV4 is secured to be "1" (VDD1) from the unstable logic level WH.

In this way, at the time point R4, as the loop structure portion LOOP becomes the normal loop, the signal read out from the ferroelectric element (potential difference between the node voltage V1$m$ and the node voltage V2$m$) is amplified by the loop structure portion LOOP. Thus, the stored data in the third storage area ("1" (VDD1) in the example of FIG. 20) is restored as the output signal Q.

After that, at the time point R5, the F reset signal FRSTm becomes "1" (VDD2) again, so that the transistors Q1$ma$, Q1$mb$, Q2$ma$ and Q2$mb$ are turned on. Therefore, each of the ferroelectric elements CL1$ma$, CL1$mb$, CL2$ma$ and CL2$mb$ is short-circuited at the ends, so that no voltage can be applied to the ferroelectric elements CL1$ma$, CL1$mb$, CL2$ma$ and CL2$mb$. In this case, each of the plate line PL1$m$ and the plate line PL2$m$ is "0" (GND). Therefore, the data holding device is reset to be the normal operation state that is the same as the state before the time point W1.

As described above, the data reading action of FIG. 20 is different from the data reading action of FIG. 19 in that the former starts to derive the voltage signals (node voltages V1$m$ and V2$m$) corresponding to the remanent polarization state inside the ferroelectric element before the first power supply voltage VDD1 and the second power supply voltage VDD2 are turned on. With this structure, it is possible to reduce operation steps after the first power supply voltage VDD1 and the second power supply voltage VDD2 are turned on (the operational example of FIG. 19 requires three steps (time points R3, R4 and R5) while the operational example of FIG. 20 requires only two steps (time points R4 and R5)), so that time necessary for resetting to the normal operation can be shortened.

Figure 21:
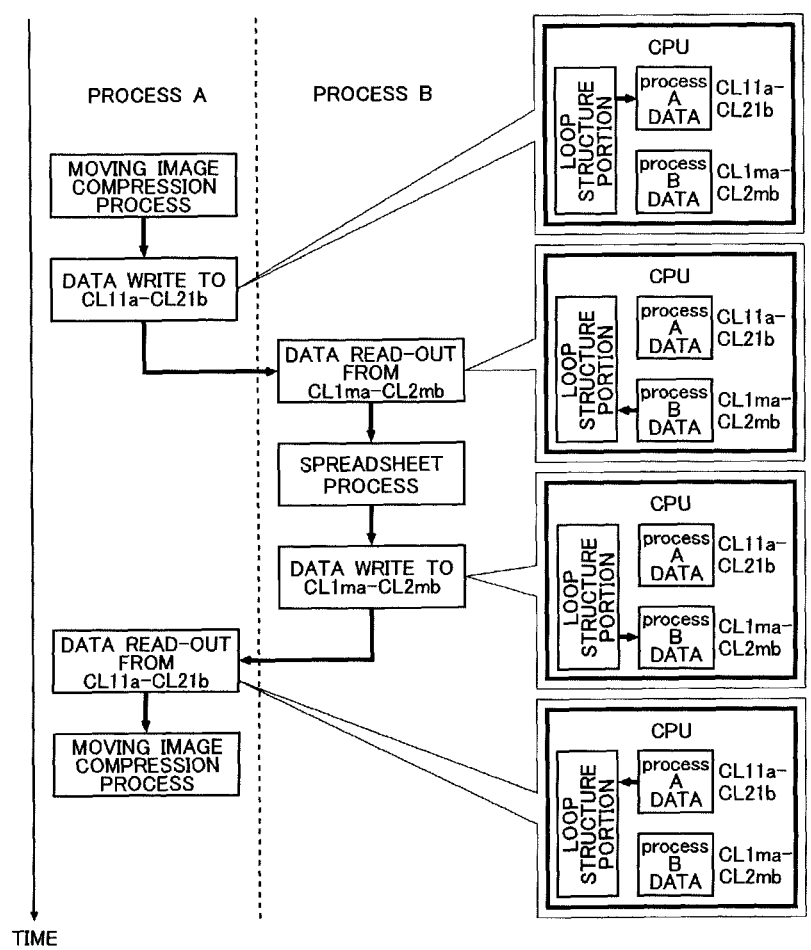
FIG. 21 is a schematic diagram illustrating an example of a process switching action by exchanging data.

Next, a process switching action in the case where the data holding device of the fourth variation example is applied to a CPU will be described with reference to FIG. 21. FIG. 21 is a schematic diagram illustrating an example of the process switching action by exchanging data, which schematically illustrates a manner of exchanging a process A (e.g., moving image compression process) and a process B (e.g., a spreadsheet process) alternately by exchanging the first storage area and the m-th storage area of the data holding device arbitrarily. Note that the left part of FIG. 21 illustrates a manner of exchanging the process A and the process B alternately with the vertical axis as a time axis, while the right part of FIG. 21 schematically illustrates operational state of the data holding device that is used inside the CPU.

When the process A is switched to the process B, the data holding device writes the data DA concerning the process A in the first storage area (CL11$a$-CL21$b$) and reads out the data DB concerning the process B from the m-th storage area (CL1$ma$-CL2$mb$), so as to perform a data exchange process of data stored in the data holding device. On the other hand, when the process B is switched to the process A in the opposite manner to the above description, the data holding device writes the data DB concerning the process B in the m-th storage area (CL1$ma$-CL2$mb$) and reads out the data DA concerning the process A from the first storage area (CL11$a$-CL21$b$), so as to perform the data exchange process of data stored in the data holding device. By this data exchange process, it is possible to exchange instantly the processes executed by the CPU.

Note that the power supply off period illustrated in FIGS. 19 and 20 is not always necessary when the process switching of the CPU is performed by exchanging data.

Next, a layout of a cell pattern of the ferroelectric element will be described in detail with reference to FIGS. 22 to 25. FIGS. 22 to 25 are schematic diagrams respectively illustrating of a first layout example to a fourth layout example of the cell pattern of the ferroelectric element. Note that each of reference signs a to d in FIGS. 22 to 25 indicates the ferroelectric element, and each of reference signs x and y indicates a distance between the elements.

When a plurality of ferroelectric elements are formed on a semiconductor substrate, the ferroelectric elements are designed to have the same shape (e.g., a square shape or a rectangle shape viewed from the top) at the layout stage. However, an actual element shape formed on the semiconductor substrate via a masking process and an etching process does not become the same shape as designed in most cases because of characteristics of the process.

Figure 22:
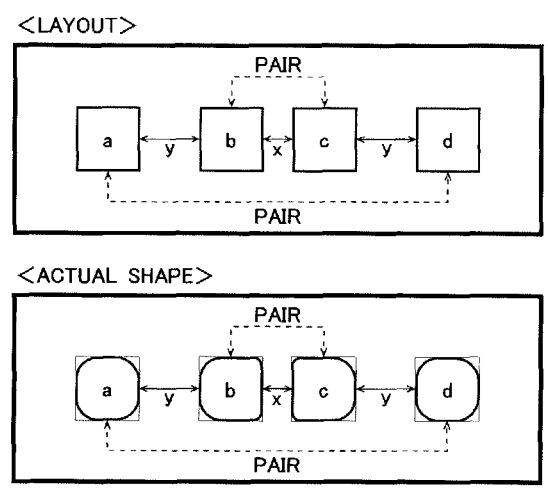
FIG. 22 is a schematic diagram illustrating a first layout example of a cell pattern.
Figure 25:
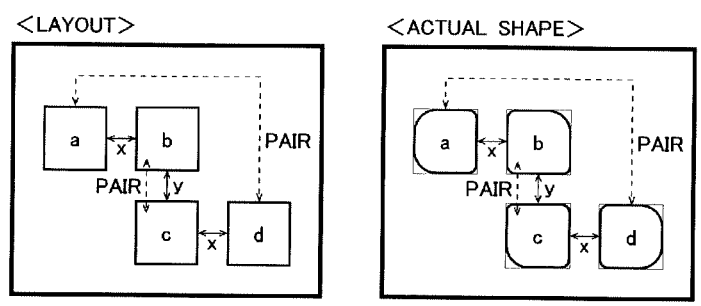
FIG. 25 is a schematic diagram illustrating a fourth layout example of a cell pattern.

For instance, in FIG. 22, each of the ferroelectric elements a and d has four sides that are not close to other elements, so that corner portions of the element are etched easily. Therefore, the actual element shape formed on the semiconductor substrate has four corner portions that are all rounded relatively largely. On the other hand, each of the ferroelectric elements b and c has a side facing closely to each other, so the corner portions of the element including the side are hardly etched. The actual element shape formed on the semiconductor substrate has four corner portions two of which are opposed to each other and are rounded relatively small, while other two corner portions are rounded relatively largely. The above description is also true for the example of FIGS. 23 to 25.

In this way, the actual element shape formed on the semiconductor substrate has different etched amount of four corners in accordance with a density of the elements. A pair of the ferroelectric element CL1$a$ and the ferroelectric element CL1$b$, as well as a pair of the ferroelectric element CL2$a$ and the ferroelectric element CL2$b$ should be arranged so that the actual shapes formed on the semiconductor substrate become equal to each other.

In case of the example of FIG. 22, the ferroelectric elements a and d constitute a first pair while the ferroelectric elements b and c constitute a second pair. In addition, in case of the example of FIG. 23, the ferroelectric elements a and b may constitute a first pair while the ferroelectric elements c and d may constitute a second pair (see (a) in FIG. 23). Alternatively, the ferroelectric elements a and c may constitute a first pair while the ferroelectric elements b and d may constitute a second pair (see (b) in FIG. 23). In addition, in case of the example of FIG. 24, the ferroelectric elements a and c may constitute a first pair while the ferroelectric elements b and d may constitute a second pair (see (a) in FIG. 24). Alternatively, the ferroelectric elements a and b may constitute a first pair while the ferroelectric elements c and d may constitute a second pair (see (b) in FIG. 24). Alternatively, the ferroelectric elements a and d may constitute a first pair while the ferroelectric elements b and c may constitute a second pair (see (c) in FIG. 24). In addition, in case of the example of FIG. 25, the ferroelectric elements a and d constitute a first pair while the ferroelectric elements b and c constitute a second pair.

By performing such the layout of the cell pattern, shapes (areas) of the ferroelectric elements to constitute a pair can be equalized so that matching between them can be enhanced, thereby data holding characteristic of the data holding device can be improved.

In addition, as illustrated in FIG. 18, the above description is true also for the case in which a plurality of storage areas are provided. In this case, it is important to equalize shapes (areas) of pairs of the ferroelectric elements CL11a-CL1ma and the ferroelectric elements CL11b-CL1mb as well as pairs of the ferroelectric elements CL21a-CL1ma and the ferroelectric elements CL21b-CL2mb.

Figure 26:
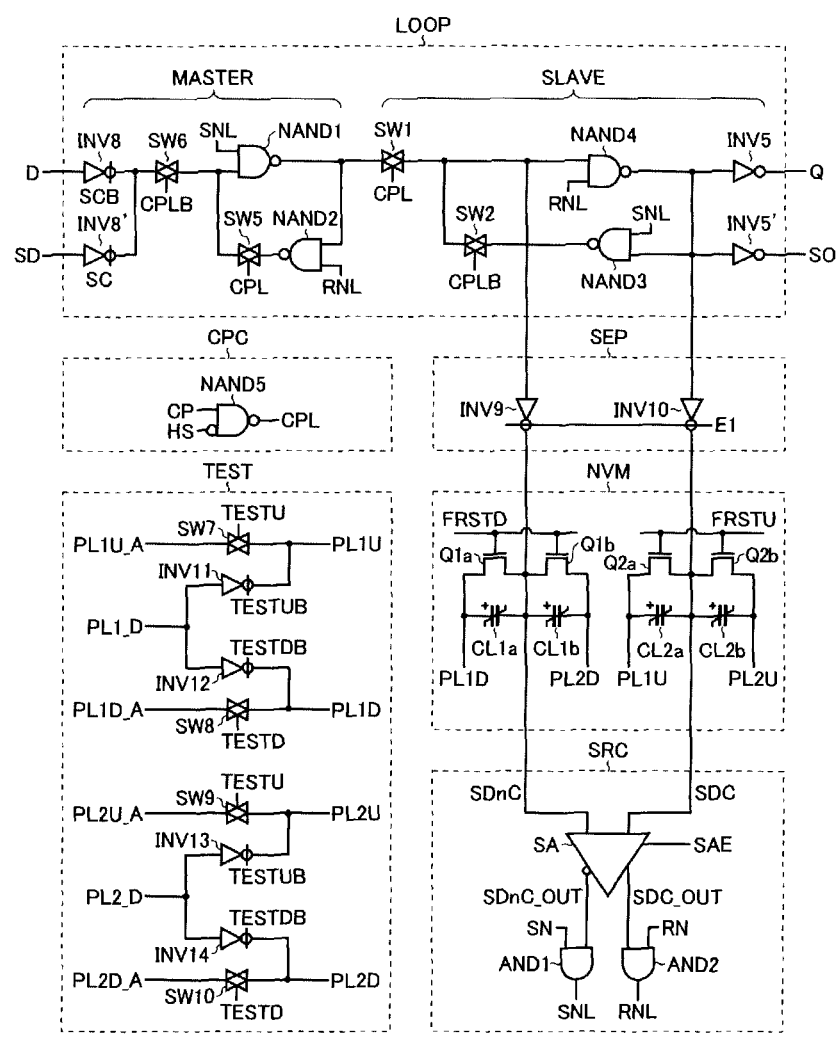
FIG. 26 is a circuit diagram illustrating a fifth variation example of the data holding device according to the present invention.

Next, a fifth variation example of the data holding device according to the present invention will be described in detail with reference to FIG. 26. FIG. 26 is a circuit diagram illustrating a fifth variation example of the data holding device according to the present invention. Note that the explanation up to this point illustrates examples of a structure wherein the loop structure portion LOOP and the nonvolatile storage portion NVM are each supplied with different power supply voltages. However, the structure of the present invention is not limited to this example, and may be configured so that the loop structure portion LOOP and the nonvolatile storage portion NVM are both supplied with the same power supply voltage. Therefore, the explanation of the fifth variation example that follows will not allude to the conformity or non-conformity of the power supply voltages supplied to the loop structure portion LOOP and the nonvolatile storage portion NVM. Rather, focus will be placed on other portions that are different from the previously explained structures.

The data holding device of the present variation example of the present invention includes a loop structure portion LOOP and a nonvolatile storage portion NVM, and a circuit separating portion SEP as illustrated in FIG. 26. The device also includes a set/reset controller SRC, a clock pulse controller CPC, and a test circuit portion TEST, and functions as a D flip flop (register) with set/reset functionality.

The loop structure portion LOOP includes NOT-AND circuits NAND1 to NAND4; pass switches SW1, SW2, SW5, and SW6; inverters INV5 and INV5; and three-state inverters INV8 and INV8'.

An input end of the inverter INV8 is connected to an input end of the data D. An input end of the inverter INV8' is connected to an input end of the scan data SD. An output end of both of the inverters INV8 and INV8' is connected to a first input end of the NOT-AND circuit NAND1 via the pass switch SW6. A second input end of the NOT-AND circuit NAND1 is connected to an input end of the internal set signal SNL. An output end of the NOT-AND circuit NAND1 is connected to a first input end of the NOT-AND circuit NAND2, and passing through the pass switch SW1 is also connected to a first input end of the NOT-AND circuit NAND4. A second input end of the NOT-AND circuit NAND2 is connected to an input end of the internal reset signal RNL. An output end of the NOT-AND circuit NAND2 is connected to the first input end of the NOT-AND circuit NAND 1 via a pass switch SW5.

A second input end of the NOT-AND circuit NAND4 is connected to the input end of the internal reset signal RNL. The output end of the NOT-AND circuit NAND4 is connected to an output end of the output data Q via an inverter INV5, and is connected to an output end of the scan output data SO via an inverter INV5'. In addition, the output end of the NOT-AND circuit NAND4 is connected to a first input end of the NOT-AND circuit NAND3. A second input end of the NOT-AND circuit NAND3 is connected to an input end of the internal set signal SNL. The output end of the NOT-AND circuit NAND3 is connected to a first input end of the NOT-AND circuit NAND4 via the pass switch SW2.

A control end of the inverter INV8 is connected to an input end of the reverse scan control signal SCB (a logical inversion signal of the scan control signal SCB). A control end of the inverter INV8' is connected to an input end of the scan control signal SC. Consequently, the inverter INV8 and the inverter INV8' have their respective output ends set to a high impedance state in an exclusive (complementary) manner to each other.

A control end of the pass switch SW1 and a control end of the pass switch SW5 are both connected to an input end of the internal clock signal CPL. A control end of the pass switch SW2 and a control end of the pass switch SW6 are both connected to an input end of the reverse internal clock signal CPLB (a logical inversion signal of the internal clock signal CPL). Therefore, the pass switches SW1 and SW5 and pass switches SW2 and SW6 are turned on and off in an exclusive (complementary) manner to each other. More specifically, when the pass switch SW1 and the pass switch SW5 are turned on, the pass switches SW2 and SW6 are turned off, and conversely when the pass switches SW1 and SW5 are turned off, the pass switches SW2 and SW6 are turned on.

In this way, the basic structure of the loop structure portion LOOP in the data holding device of the present variation example is the same as in the embodiment described above, that is, the input data signal D is held using a logic gate (the NOT-AND circuit NAND1 and NAND2 on the master side, as well as the NOT-AND circuit NAND3 and NAND 4 on the slave side) connected in a loop. However, the loop structure portion LOOP that forms the data holding device of the present variation example has characteristics such as the absence of the multiplexers MUX1 and MUX2, the fact that clock stop processing is not required when data is saved and restored, and the presence of serial data input/output functionality using a SCAN-PASS [test circuit].

The nonvolatile storage portion NVM includes ferroelectric elements CL1a, CL1b, CL2a, and CL2b; and N-channel MOS field-effect transistors Q1a, Q1b, Q2a, and Q2b.

A positive end of the ferroelectric element CL1a is connected to a first plate line PL1D of the D system. A negative end of the ferroelectric element CL1a is connected, via the circuit separating portion SEP (the inverter INV9), to a first input end of the NOT-AND circuit NAND4 that forms the loop structure portion LOOP. A transistor Q1a is connected between both ends of the ferroelectric element CL1a. A gate of the transistor Q1 is connected to the receiving end of the F reset signal FRSTD of the D system.

A positive end of the ferroelectric element CL1b is connected, via the circuit separating portion SEP (the inverter INV9), to a first input end of the NOT-AND circuit NAND4 that comprises the loop structure portion LOOP. A negative end of the ferroelectric element CL1b is connected to a second plate line PL2D of the D system. A transistor Q1b is connected between both ends of the ferroelectric element CL1b. A gate of the transistor Q1b is connected to a receiving end of the F reset signal FRSTD of the D system.

A positive end of the ferroelectric element CL2 is connected to the first plate line PL1U of the U system. A negative end of the ferroelectric element CL2 is connected, via the circuit separating portion SEP (the inverter 10), to a first input end of the NOT-AND circuit NAND3 that comprises the loop structure unit LOOP. A transistor Q2a is connected between the ends of the ferroelectric element CL2. A gate of the transistor Q2 is connected to a receiving end of the F reset signal FRSTU of the U system.

A negative end of the ferroelectric element CL2b is connected, via the circuit separating portion SEP (the inverter 10), to a first input end of the NOT-AND circuit NAND3 that comprises the loop structure portion LOOP. A negative end of the ferroelectric element CLO2b is connected to a second plate line PL2U of the U system. A transistor Q2b is connected between the ends of the ferroelectric element CL2b. A gate of the transistor Q2b is connected to a receiving end of the F reset signal FRSTU of the U system.

In this way, the fundamental structure of the nonvolatile storage portion NVM in the data holding device of the present variation example is the same as that of the previously described embodiment, that is, the data D held in the loop structure portion LOOP in a nonvolatile manner is stored by using the hysteresis characteristics of the ferroelectric element (CL1a, CL1b, CL2a, CL2b). However, the nonvolatile storage portion NVM that forms the data holding device of the present variation example has characteristics such as the inclusion of two systems (the U system and the D system) of each of a first plate line, a second plate line, and an F reset signal line in order to use a test circuit portion TEST to evaluate the characteristics of the ferroelectric elements (CL1a, CL1b, CL2a, CL1b)

The circuit separating portion SEP includes three state inverters INV9 and INV10 as a means of electrically separating the loop structure portion LOOP and the nonvolatile storage portion NVM. An output end of the inverters INV9 and INV10 are both set to a high impedance state in accordance to a control signal E1.

The set/reset control unit SRC includes a sense amplifier (a differential amplifier) SA and AND circuits AND1 and AND2. A first input end of the sense amplifier SA is connected to the D system output end (the connection node between the negative end of the ferroelectric element CL1a and the positive end of the ferroelectric element CL1b) of the nonvolatile storage portion NVM. A second input end of the sense amplifier SA is connected to the U system output end (the connection node between the negative end of the ferroelectric element CL2a and the positive end of the ferroelectric element CL2b) of the nonvolatile storage portion NVM. A first output end (inverted form) of the sense amplifier SA is connected to a first input end of the AND circuit AND1. A second input end of the AND circuit AND1 is connected to an input end of the external set signal SN. An output end of the AND circuit AND1 functions as the output end of the internal set signal SNL. A second output end of the sense amplifier is connected to a first input end of the AND circuit AND2. A second input end of the AND circuit AND2 is connected to an input end of the exterior reset signal RN. The output end of the AND circuit AND2 functions as the output end of the internal reset signal RNL. A control end of the sense amplifier SA is connected to an input end of the sense amplifier enable signal SAE. Note that the specific operations of the set/reset controller SRC having the above structure will be explained in detail later.

The clock pulse controller CPC includes a NOT-AND circuit NAND5. A first input end of the NOT-AND circuit NAND5 is connected to an input end of the external clock signal CP. A second input end (inverted input form) of the NOT-AND circuit NAND5 is connected to an input end of the data holding control signal HS. An output end of the NOT-AND circuit NAND5 functions as the output end of the internal clock signal CPL. Consequently, when the data holding control signal HS is high level (when the clock is non-functional), the internal clock signal CPL always becomes a high level signal, without relying on the external clock signal CP. When the data holding control signal HS is low level (when the clock is functioning), the internal clock signal CPL becomes a logical inversion signal of the external clock signal CP.

The test circuit portion TEST includes three state inverters INV11 to INV14 and pass switches SW7 to SW10.

An input end of both the inverter INV11 and of the inverter INV12 are connected to a first digital plate line PL1_D. An output end of the inverter INV11 is connected to a first plate line PL1U of the U system. An output end of the inverter INV12 is connected to a first plate line PL1D of the D system. A control end of the inverter INV11 is connected to an input end of the inverse analog enable signal TESTUB (the logical inversion signal of the analog enable signal TESTU) of the U system. A control end of the inverter INV12 is connected to an input end of the inverse analog enable signal TESTDB (the logical inversion signal of the analog enable signal TESTD) of the D system.

An input end of the pass switch SW7 is connected to a first analog plate line PL1U_A of the U system. An output end of the pass switch SW7 is connected to a first plate line PL1U of the U system. A control end of the pass switch SW7 is connected to an input end of the analog enable signal TESTU of the U system. An input end of the pass switch SW8 is connected to the first analog plate line PL1D_A of the D system. An output end of the pass switch SW8 is connected to the first plate line PL1D of the D system. A control end of the pass switch SW8 is connected to an input end of the analog enable signal TESTD of the D system.

An input end of the inverter INV13 and of the inverter INV14 are both connected to the second digital plate line PL2_D. An output end of the inverter INV13 is connected to the second plate line PL2U of the U system. An output end of the inverter INV14 is connected to the second plate line PL2D of the D system. A control end of the inverter INV13 is connected to an input end of the inverted analog enable signal TESTUB (a logical inversion signal of the analog enable signal TESTU) of the U system. A control end of the inverter INV14 is connected to an input end of the inverted analog enable signal TESTDB (a logical inversion signal of the analog enable signal TESTD) of the D system.

An input end of the pass switch SW9 is connected to the second analog plate line PL2U_A of the U system. An output end of the pass switch SW9 is connected to the second plate line PL2U of the U system. A control end of the pass switch SW9 is connected to an input end of the analog enable signal TESTU of the U system. An input end of the pass switch SW10 is connected to the second analog plate line PL2D_A of the D system. An output end of the pass switch SW10 is connected to the second plate line PL2D of the D system. A control end of the pass switch SW10 is connected to an input end of the analog enable signal TESTD of the D system.

In the test circuit portion TEST having the structure described previously the analog enable signal TESTU of the U system and the analog enable signal TESTD of the D system are set to have contradictory logic to each other. Specifically, when the analog enable signal TESTU of the U system is set to high level (enable logic), the analog enable signal TEST D of the D system is set to low level (disable logic). Conversely, when the analog enable signal TESTU of the U system is set to low level (disable logic), the analog enable signal TESTD of the D system is set to high level (enable logic). Note that the specific operations of test circuit portion TEST having the structure described above will be explained later.

Figure 27:
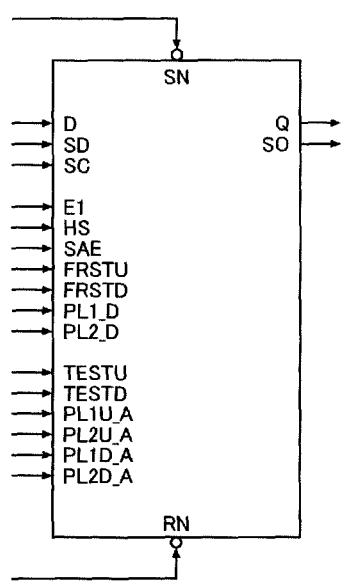
FIG. 27 is a block diagram illustrating the signal pin used in a fifth variation example of the data holding device according to the present invention.

FIG. 27 is a block diagram illustrating the signal pin used in a fifth variation example of the data holding device [according to the present invention]. FIG. 28 is a chart explaining the function of the signal pin described above. A clock terminal (CP), a data input terminal (D), a preset terminal (SN), a clear terminal (RN), a scan data input terminal (SD), and a scan control terminal (SC) are disposed in the data holding device of the present variation example as signal pins for logic control, as illustrated in both drawings. In addition, a ferroelectric element write enable terminal (E1), a data hold terminal (HS), a sense amplifier enable terminal (SAE), a U system ferroelectric element reset terminal (FRSTU), a D system ferroelectric element reset terminal (FRSTD), a first plate line digital input terminal (PL1_D), and a second plate line digital input terminal (PL2_D) are included as ferroelectric element control signal pins. In addition, a U system PL1/2 analog enable terminal (TESTU), a D system PL1/2 analog enable terminal (TESTD), a PL1U analog input terminal (PL1U_A), a PL2U analog input terminal (PL2U_A), a PL1D analog input terminal (PL1D_A), a PL2D analog input terminal (PL2D_A), a scan output terminal (SO), and an output terminal (Q) are included as ferroelectric element test signal pins.

Figure 29:
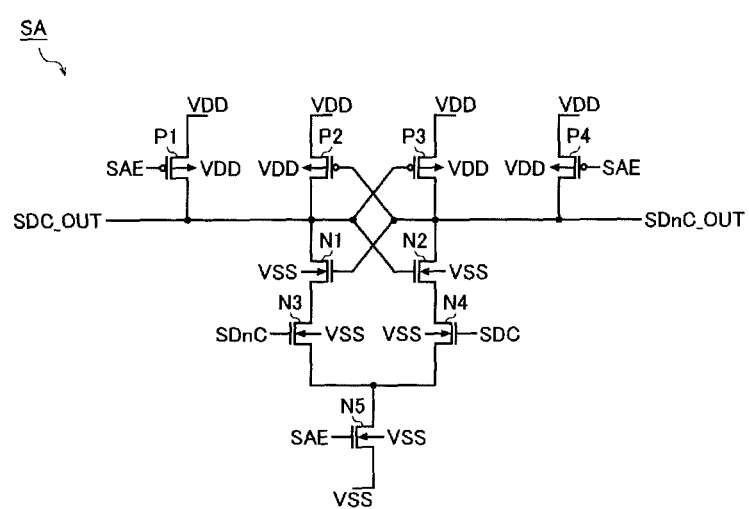
FIG. 29 is a circuit diagram illustrating a structural example of a sense amplifier.

FIG. 29 is a circuit diagram illustrating a structural example of a sense amplifier SA. The sense amplifier of the present structural example SA includes P channel field-effect transistors P1 to P4 and N channel field-effect transistors N1 to N5.

A back gate and a source of the transistor P1 are connected to a receiving end of the power supply voltage VDD. A drain of the transistor P1 is connected to a second output end (the output end of the second output signal SDC_OUT) of the sense amplifier SA. The gate of the transistor P1 is connected to an input end of the sense amplifier enable signal SAE.

A back gate and a source of the transistor P2 are connected to a receiving end of the power supply voltage VDD. A drain of the transistor P2 is connected to a second output end (the output end of the second output signal SDC_OUT) of the sense amplifier SA. The gate of the transistor P2 is connected to a first output end (the output end of the first output signal SDnC_OUT) of the sense amplifier.

A source and a back gate of the transistor P3 are connected to a receiving end of the power supply voltage VDD. A drain of the transistor P3 is connected to a first output end (the output end of the first output signal SDnC_OUT) of the sense amplifier SA. The gate of the transistor P3 is connected to a second output end (the output end of the second output signal SDC_OUT) of the sense amplifier SA.

A source and a back gate of the transistor P4 are connected to a receiving end of the power supply voltage VDD. A drain of the transistor P4 is connected to the first output end (the output end of the first output signal SDnC_OUT) of the sense amplifier SA. The gate of the transistor P4 is connected to an input end of the sense amplifier enable signal SAE.

A drain of the transistor N1 is connected to a second output end (the output end of the second output signal SDC_OUT) of the sense amplifier SA. A source of the transistor N1 is connected to the drain of the transistor N3. The gate of the transistor N1 is connected to a first output end (the output end of the first output signal SDnC_OUT) of the sense amplifier SA. The back gate of the transistor N1 is connected to a receiving end of the ground voltage VSS.

A drain of the transistor N2 is connected to a first output end (the output end of the first output signal SDnC_OUT) of the sense amplifier SA. A source of the transistor N2 is connected to the drain of the transistor N4. The gate of the transistor N2 is connected to a second output end (the output end of the second output signal SDC_OUT) of the sense amplifier SA. The back gate of the transistor N2 is connected to a receiving end of the ground voltage VSS.

A drain of the transistor N3 is connected to the source of the transistor N1. A source of the transistor N3 is connected to the drain of the transistor N5. The gate of the transistor N3 is connected to a first input end (the input end of the first input signal SDnC) of the source amplifier SA. The back gate of the transistor N3 is connected to a receiving end of the ground voltage VSS.

A drain of the transistor N4 is connected to the source of the transistor N2. A source of the transistor N4 is connected to the drain of the transistor N5. The gate of the transistor N4 is connected to a second input end (the input end of the second input signal SDC) of the source amplifier SA. The back gate of the transistor N4 is connected to a receiving end of the ground voltage VSS.

A drain of the transistor N5 is connected to each source of both the transistor N3 and [the transistor] N4. A source and a back gate of the transistor N5 are connected to a receiving end of the ground voltage VSS. A gate of the transistor N5 is connected to an input end of the sense amplifier enable signal SAE.

When the sense amplifier enable signal SAE is set to high level (enable logic) in the source amplifier SA having the structure described above, the transistors P1 and P2 turn off, the transistor N5 turns on, and operations of the source amplifier SA are allowed. At this time, if the first input signal SDnC has a higher voltage than the second input signal SDC, then the first output signal SDnC_OUT is set to high level (power supply voltage VDD) and the second output signal SDC_OUT is set to low level (ground voltage VSS). Conversely, if the first input signal SDnC has a lower voltage than the second input signal SDC, the first output signal SDnC_OUT is set to low level (ground voltage VSS) and the second output signal SDC_OUT is set to high level (power supply voltage VDD). On the other hand, when the sense amplifier enable signal SAE is set to low level (disable logic), the transistors P1 and P2 turn on, the transistor N5 turns off, and operations of the source amplifier SA are prohibited. At this time, the first output signal SDnC_OUT and the second output signal SDC_OUT are always fixed to high level (power supply voltage VDD) without regard to the first input signal SDnC and the second input signal SDC.

Next, the operations of the data holding device having the structure described above will be explained referencing the drawings.

Figure 30:
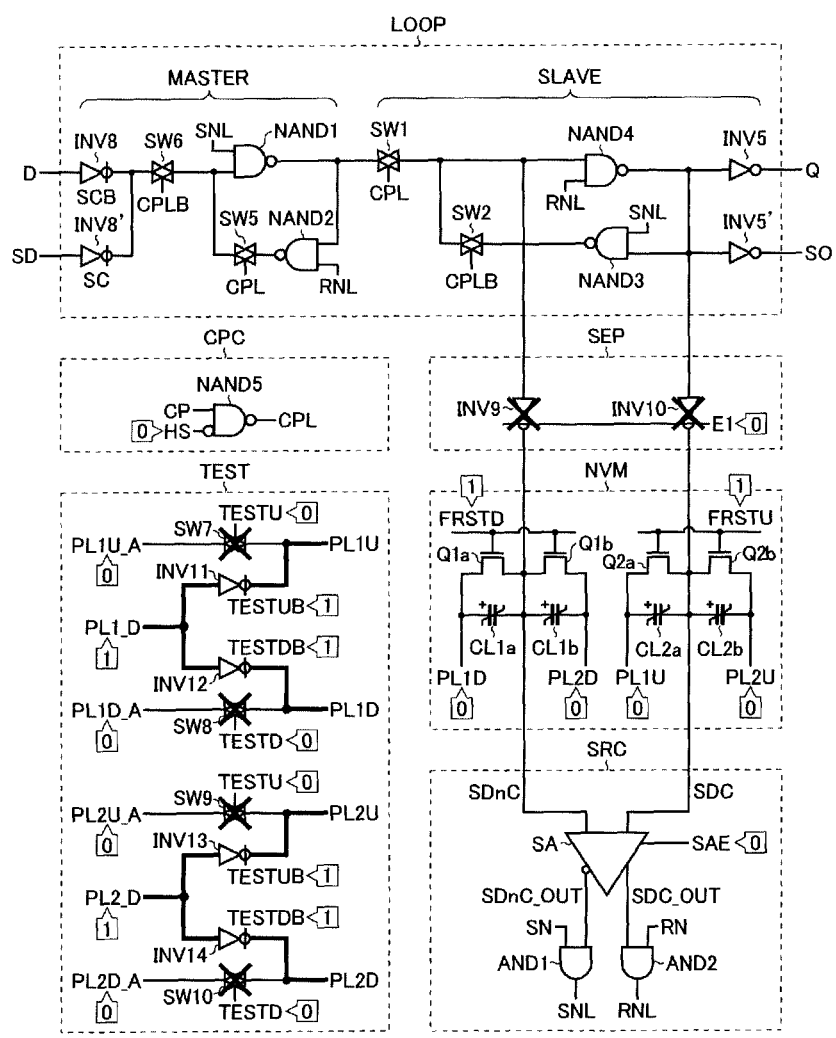
FIG. 30 is a circuit diagram illustrating the operational state of the various parts of the device during regular operations.

First, regular operations of the data holding device will be explained. FIG. 30 is a circuit diagram illustrating the operational state of the various parts of the device during regular operations.

A low level (0) data storage control signal HS is input into the clock pulse controller CPC during regular operations of the data holding device in order to enable an external clock signal CP. Thus, the external clock signal CP (more accurately, the logical inversion signal thereof) is provided as an internal clock signal CPL from the clock pulse controller CPC to the loop structure portion LOOP. Therefore, latch operations of a data signal D are performed in the loop structure portion LOOP based on the internal clock signal CPL (and by extension, the external clock signal CP).

In addition, a low level (0) control signal E1 is input so that the three state inverters INV9 and INV10 (corresponding to the driver that writes to the ferroelectric element) are turned off in the circuit separating portion SEP during regular operations of the data holding device. Thus, an output end of the three state inverters INV9 and INV10 are both put into a state of high impedance, and the loop structure portion LOOP and the nonvolatile storage portion NVM are electrically separated.

In addition, high level (1) F reset signals FRSTD and FRSTU are input into the nonvolatile storage portion NVM during regular operations of the data holding device. Thus, transistors Q1a, Q1b, Q2a, and Q2b are turned on, and so that each of the ferroelectric element CL1a, CL1b, CL2a, CL2b is short-circuited at the ends. Therefore, it is possible to avoid receiving unintended voltage as regards each ferroelectric element. Note that at this time, low level (0) voltage signals are applied to the first plate lines PL1D and PL1U and the second plate lines PL2D and PL2U.

In addition, a low level (0) sense amplifier enable signal SAE is input into the set/reset controller SRC during regular operations of the data holding device. Thus, the first output signal SDnC_OUT and the second output signal SCD_OUT of the source amplifier SA are both fixed to high level. Consequently, an external set signal SN and an external reset signal RN are output in unmodified form as an internal set signal SNL and an internal reset signal RNL into the loop structure portion LOOP from the set/reset controller SRC.

In addition, low level (0) analog enable signals TESTD and TESTU are input into the test circuit portion TEST during regular operations of the data holding device. Thus, the switches SW7 to SW10 are each set to off and the three state inverters INV11 to INV14 are each set to on. Note that at this time a high level (1) voltage signal is applied to each of the first digital plate line PL1_D and the second digital plate line PL2_D. Consequently, a low level (0) voltage signal is applied passing through each of the three state inverters INV11 to INV14 to the first plate lines PL1D and PL1U and to the second plate lines PL2D and PL2U. In addition, at this time a low level (0) voltage signal is applied to each of the first analog plate lines PL1D_A and PL1U_A and to the second analog plate lines PL2D_A and PL2U_A.

Figure 31:
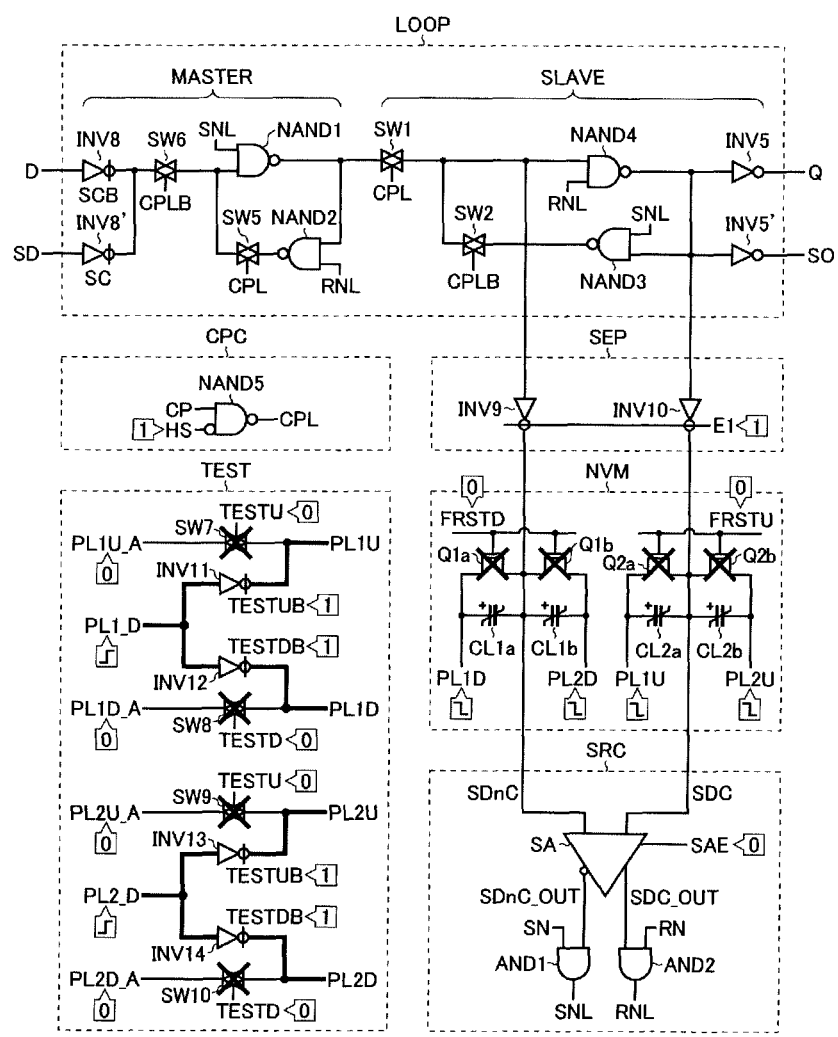
FIG. 31 is a circuit diagram illustrating the operational state of the various parts of the device during data writing operations.

Next, data writing operations (data saving operations to the nonvolatile storage portion NVM) of the data holding device will be explained. FIG. 31 is a circuit diagram illustrating the operational state of the various parts of the device during data writing operations.

A high level (1) data storage control signal HS is input into the clock pulse controller CPC so that the external clock signal CP is disabled during data writing operations of the data holding device. Thus, it is possible to fix the internal clock signal CPL to high level without relying on the external clock signal CP. Therefore, it is possible to block the input signal path of the data signal D so that the contents of the data stored in the loop structure portion LOOP (in other words, data that should be saved to the nonvolatile storage portion NVM) are not changed. By extension, it is possible to increase the stability of data writing operations (data saving operations) to the nonvolatile storage portion NVM.

In addition, a high level (1) control signal E1 is input into the circuit separating portion SEP so that the three state inverters INV9 and INV10 (corresponding to the drivers writing to the ferroelectric elements) are on during data writing operations of the data holding device. Thus, logical inversion output of the three state inverters INV9 and INV10 is possible, and the loop structure portion LOOP and the nonvolatile storage portion NVM are electrically connected.

In addition, low level (0) F reset signals FRSTD and FRSTU are input into the nonvolatile storage portion NVM during data writing operations of the data holding device. Thus, transistors Q1a, Q1b, Q2a, and Q2b are turned off, so that each of the ferroelectric elements CL1a, CL1b, CL2a, and CL2b is disconnected at the ends (not short-circuited). Therefore, data writing voltage can be applied to each ferroelectric element. Note that at this time, the same pulse voltage signal (for instance, from high level to low level) is applied to each of the first plate lines PL1D and PL1U and the second plate lines PL2D and PL2U as the data writing voltage described above. By applying this kind of pulse voltage signal, the remanent polarization state inside the ferroelectric elements is set to the inverted state or the non-inverted state. This is as described previously, so the details will not be re-explained here.

In addition, a low level (0) sense amplifier enable signal SAE is input into the set/reset controller SRC during data writing operations of the data holding device, in the same manner as was done during regular operations. Thus the first output signal SDnC_OUT and the second output signal SDC_OUT of the source amplifier SA are both fixed to high level. Consequently, the external set signal SN and the external reset signal RN are output in unmodified form as the internal set signal SNL and the internal reset signal RNL into the loop structure portion LOOP from the set/reset controller SRC.

In addition, low level (0) analog enable signals TESTD and TESTU are input into the test circuit portion TEST during data writing operations of the data holding device, in the same manner as was done during regular operations. Thus, the switches SW7 to SW10 are all set to off and the three state inverters INV11 to INV14 are all set to on. Note that at this time, a same pulse voltage signal (for instance, from a low level to a high level) is applied to each of the first digital plate lines PL1_D and the second digital plate line PL2_D. Consequently, a same pulse voltage signal (for instance from a high level to a low level) is applied passing through each of the three state inverters INV11 to INV14 to the first plate lines PL1D and PL1U and the second plate lines PL2D and PL2U. In addition, at this time a low level (0) voltage signal is applied to each of the first analog plate lines PL1D_A and PL1U_A and the second analog plate lines PL2D_A and PL2U_A.

Figure 32:
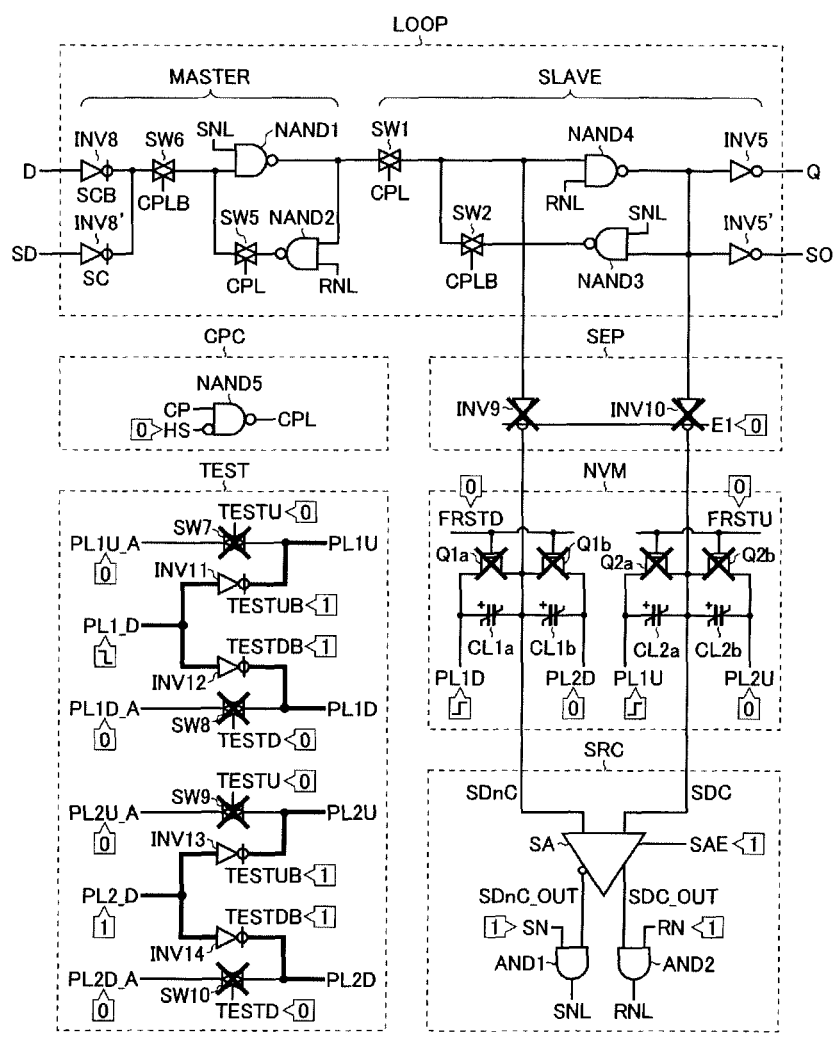
FIG. 32 is a circuit diagram illustrating the operational state of the various parts of the device during data read out operations.

Next, read out operations (data restore operations from the loop structure portion LOOP) of the data holding device will be explained. FIG. 32 is a circuit diagram illustrating the operational state of the various parts of the device during data read out operations.

A low level (0) data storage control signal HS is input to the clock pulse controller CPC in order to enable the external clock signal CP during data read out operations of the data holding device, in the same manner as was used during regular operations. Thus, an external clock signal CP (more accurately, the logical inverse signal thereof) is provided from the clock pulse controller CPC to the loop structure portion LOOP as an internal clock signal CPL. In this way, data is restored from the nonvolatile storage portion NVM to the loop structure portion LOOP without causing the input of the external clock signal CP to stop in the data holding device of the fifth variation example.

In addition, a low level (0) control signal E1 is input to the circuit separating portion SEP so that the three state inverters INV9 and INV10 (corresponding to the reading drivers to the ferroelectric elements) are set to off during data read out operations of the data holding device, in the same manner as was used during regular operations. Thus, the output ends of each of the three state inverters INV9 and INV10 are set to a state of high impedance, and the loop structure portion LOOP and the nonvolatile storage portion NVM are electrically separated.

In addition, low level (0) F reset signals FRSTD and FRSTU are input to the nonvolatile storage portion NVM during read out operations of the data holding device. Thus, transistors Q1a, Q1b, Q2a, and Q2b are turned off, so that each of the ferroelectric elements CL1a, CL1b, CL2a, and CL2b is disconnected at the ends (not short-circuited). Therefore, applying a data read out voltage to each ferroelectric element is possible. Note that at this time a predetermined pulse voltage signal (for instance, from a low level to a high level) is applied to the first plate line PL12D, PL1U, and the second plate lines PL2D and PL2U are maintained at a low level as the data read out voltage described above. A restoration voltage signal (corresponding to the first input signal SDnC of the source amp SA and the second input signal SDC) appears by applying this kind of pulse voltage signal corresponding to each remanent polarization state inside the ferroelectric elements to the D system output end (the connection node between the negative end of the ferroelectric element CL1a and the positive end of the ferroelectric element CL1b) of the nonvolatile storage portion NVM and the U system output end (the connection node between the negative end of the ferroelectric element CL2a and the positive end of the ferroelectric element CL2b). Because this is described above, it will not be re-explained here.

In addition, a high level (1) sense amplifier enable signal SAE is input to the set/reset controller SRC during read out operations of the data holding device. Thus, the first output signal SDnC_OUT and the second output signal SCD_OUT of the source amp SA become logical levels in accordance with the high or low state of the voltage level of each of the first input signal SDnC and the second input signal SDC. Specifically, if the first input signal SDnC is higher voltage than the second input signal SDC, the first output signal SDnC_OUT becomes high level (1) and the second output signal SDC_OUT becomes low level (0). Conversely, if the first input signal SDnC is lower voltage than the second input signal SDC, the first output signal SDnC_OUT becomes low level (0) and the second output signal SDC_OUT becomes high level (1).

In addition, the external set signal SN and the external reset signal RN input to the set/reset controller SRC are each fixed to a high level (1) during read out operations of the data holding device. Thus, the first output signal SDnC_OUT and the second output signal SDC_OUT are output in unmodified form as the internal set signal SNL and the internal reset signal RNL of the source amp SA from the set/reset controller SRC to the loop structure portion LOOP.

Note that in the loop structure portion LOOP, if the internal set signal SNL input into the NOT-AND circuits NAND1 and NAND3 becomes low level (0), output signal Q forcibly becomes high level (1), and if the internal reset signal RNL input into the NOT-AND circuits NAND2 and NAND4 becomes low level (0), output signal Q forcibly becomes low level (0). In other words, in the data holding device of the fifth structural example, data read out operations (restoration operations) are can be implemented by executing the set/reset control (the creation control of the internal set signal SNL and the internal reset signal RNL) of the loop structure portion LOOP based on the output signal of the nonvolatile storage portion NVM.

For instance, consider the case wherein saved data written from the loop structure portion LOOP to the nonvolatile storage portion NVM by the data writing operations of the data holding device is "1." In this case, the first input signal SDnC input from the nonvolatile storage portion NVM to the set/reset controller SRC by the data read out operations of the data holding device becomes lower voltage than the second input signal SDC input from the nonvolatile storage portion NVM to the set/reset controller SRC in the same way. Consequently, the first output voltage SDnC_OUT of the source amp SA becomes low level (0), and by extension, the internal set signal SNL becomes low level (0). Therefore, output signal Q is forcibly set to a high level (1). This fact means that the save data "1" that is written to the nonvolatile storage portion NVM was restored to the loop structure portion LOOP.

Conversely, the case wherein save data written from the loop structure portion LOOP to the nonvolatile storage portion NVM by the data writing operations of the data holding device is "0" is considered. In this case, the first input signal SDnC input from the nonvolatile storage portion NVM to the set/reset controller SRC by the data read out operations of the data holding device becomes higher voltage than the second input signal SDC input from the nonvolatile storage portion NVM to the set/reset controller SRC in the same way. Consequently, the second output voltage SDC_OUT of the source amp SA becomes low level (0), and by extension, the internal reset signal RNL becomes low level (0). Therefore, output signal Q is forcibly reset to a low level (0). This fact means that the save data "0" that is written to the nonvolatile storage portion NVM was restored to the loop structure portion LOOP.

In addition, low level (0) analog enable signals TESTD and TESTU are input in the same way as during regular operations to the test circuit portion TEST during data read out operations of the data holding device. Thus, the switches SW7 to SW10 are all set to off and the three state inverters INV11 to INV14 are all set to on. Note that at this time a predetermined pulse voltage signal (for example, from a high level to a low level) is applied to the first digital plate line PL1_D, and a high level (1) voltage signal is applied to the second digital plate line PL2_D. Consequently, the same pulse voltage signal (for instance, from a low level to a high level) is applied passing through each three state inverter INV11 and INV12 to the first plate line PL1D and PL1U, and a low level (0) voltage signal is applied passing through each of the three state inverters INV13 and INV14 to the second plate line PL2D and PL2U. In addition, at this time a low level (0) voltage signal is applied to each of the first analog plate lines PL1D_A and PL1U_A and the second analog plate lines PL2D_A and PL2U_A.

The data holding device of the fifth variation example is configured differently from the previously described structure, as stated above, in that the loop structure portion LOOP is not used as a sense amplifier for data restoration, but a separate and independent sense amplifier SA is provided, and the loop structure portion LOOP is controllably set and reset using this amplifier. In addition, the data holding device of the fifth variation example is configured to perform control so that the external clock signal CP is transmitted or not transmitted to the loop structure portion LOOP as an internal clock signal CPL without being stopped. By making this kind of a structure, stopping the external clock CP is not necessary to save and restore data. Therefore, timing analysis at the time of setup becomes simplified, and compatibility with a low-consumption energy technique that uses gated clocks and the like is improved.

Figure 33:
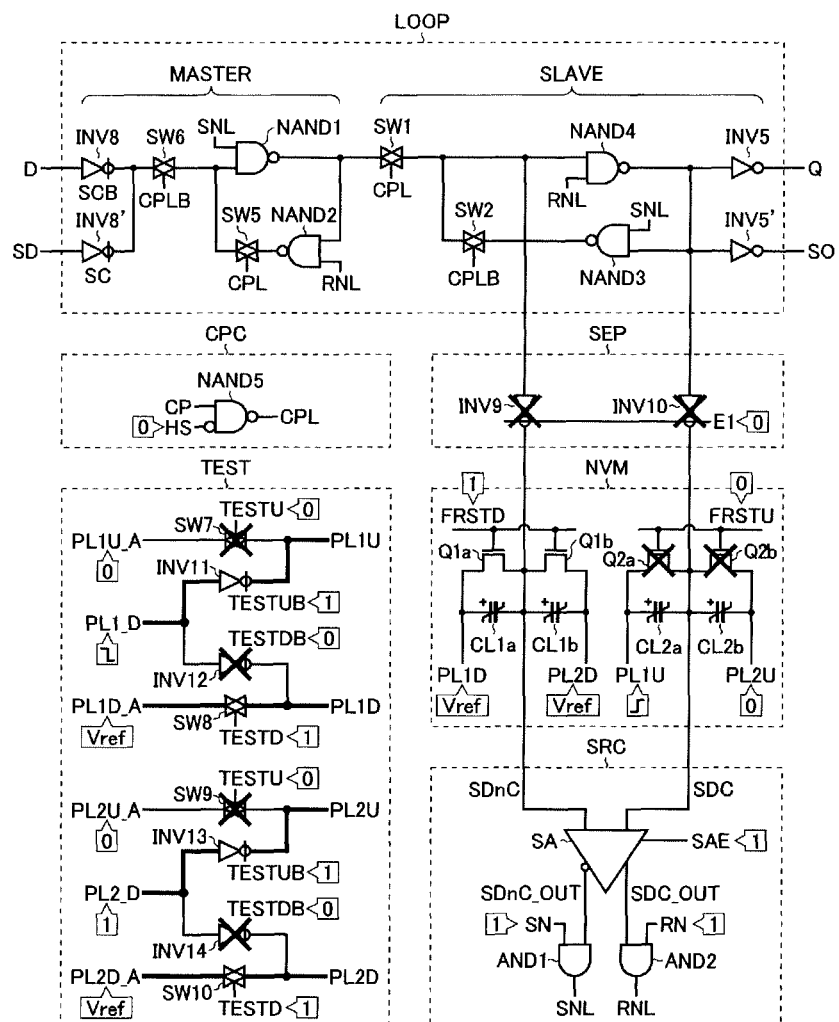
FIG. 33 is a circuit diagram illustrating the operational state of the various parts of the device during test operations.

Next, test operations of the data holding device (analog characteristics evaluation operations of the ferroelectric elements) are explained. FIG. 33 is a circuit diagram illustrating the operational state of the various parts of the device during test operations (particularly the saved data restoration step wherein saved data included a set of test operations sequences is restored). Note that the example of executing analog characteristics evaluation (voltage value measurement of the second input signal SDC) of the second input signal SDC having been input into the source amplifier SA from an output end of the U system of the nonvolatile storage portion NVM is given below, and that this is called "nonvolatile storage portion NVM U system test operations," and is explained in detail.

During nonvolatile storage portion NVM U system test operations a low level (0) data storage control signal HS is input to the clock pulse controller CPC in order to enable the external clock signal CP in the same way as during regular operations and during read out operations. Thus, an external clock signal CP (more accurately, the logical inversion signal thereof) is provided from the clock pulse controller CPC to the loop structure portion LOOP as an internal clock signal CPL. Thus, the data holding device of the fifth variation example does not cause input of the external clock signal CP to stop, and nonvolatile storage portion NVM U system test operations are executed.

In addition, during nonvolatile storage portion NVM U system test operations a low level (0) control signal E1 is input to the circuit separating portion SEP so that the three state inverters INV9 and INV10 (corresponding to the writing drivers to the ferroelectric elements) are set to off, in the same manner as during regular operations and during read out operations. Thus, an output end of each of the three state inverters INV9 and INV10 are set to a high impedance state, and the loop structure portion LOOP and the nonvolatile storage portion NVM are electrically separated.

In addition, during nonvolatile storage portion NVM U system test operations a low level (0) F reset signal FRSTU is input to the U system of the nonvolatile storage portion NVM. Thus, the transistors Q2a and Q2b are turned off, to that each of the ferroelectric elements CL2a and CL2b is disconnected at the ends (not short-circuited). Therefore, it is possible to apply data read out voltages to each of the ferroelectric elements. Note that at this time the second plate line PL2U is maintained at a low level as the data read out voltage noted above, and a predetermined pulse voltage signal (for instance, from a low level to a high level) is applied to the first plate line PL1U. By applying this kind of pulse voltage signal a restoration voltage signal (corresponding to the second input signal SDC of the source amplifier SA) appears in accordance with a remanent polarization state inside the ferroelectric element in an output end of the U system of the nonvolatile storage portion NVM (the connection node between the negative end of the ferroelectric element CL2a and the positive end of the ferroelectric element CL2b). Because this is as described previously, a re-explanation will not be made here.

On the other hand, during nonvolatile storage portion NVM U system test operations a high level (1) F reset signal FRSTD is applied to the D system of the nonvolatile storage portion NVM. Thus, the transistors Q1a and Q1b are turned on, so that each of the ferroelectric elements CL1a and CL1b is short-circuited at the ends. In addition, at this time a reference voltage signal Vref, having a predetermined analog voltage value (an intermediate voltage value that can be set arbitrarily between low level (ground voltage VSS) and high level (power supply voltage VDD)), is applied to both the first plate line PL1D and the second plate line PL2D. Consequently, the above reference voltage signal Vref becomes a direct input format as the first input signal SDnC from an output end of the D system of the nonvolatile storage portion NVM (a connection node between the negative end of the ferroelectric element CL1a and the positive end of the ferroelectric element CL1b) to the source amp SA. Note that the significance of directly inputting the reference voltage Vref as the first input signal SDnC of the source amplifier SA will be discussed in more detail later.

In addition, during nonvolatile storage portion NVM U system test operations a high level (1) sense amplifier enable signal SAE is input to the set/reset controller SRC. Thus, the first output signal SDnC_OUT and the second output signal SDC_OUT of the source amplifier SA are each logical level corresponding to whether the voltage level of the first input signal SDnC and the voltage level of the second input signal SDC are high or low. Specifically, if the first input signal SDnC has higher voltage than the second input signal SDC, then the first output signal SCnC_OUT becomes high level (1) and the second output signal SDC_OUT becomes low level (0). Conversely, if the first input signal SDnC is lower voltage than the second input signal SDC, then the first output signal SDnC_OUT is set to low level (0), and the second output signal SDC_OUT is set to high level (1).

In addition, during nonvolatile storage portion NVM U system test operations the external set signal SN and the external reset signal RN input into the set/reset controller SRC are both fixed to high level (1). Thus, the first output signal SDnC_OUT and the second output signal SDC_OUT of the source amplifier SA are each output in unmodified form as the internal set signal SNL and the internal reset signal RNL from the set/reset controller SRC to the loop structure portion LOOP. This is the same during as the previously explained data read out operations.

In addition, during nonvolatile storage portion NVM U system test operations the analog enable signal TESTU of the U system input into the test circuit portion TEST is set to low level (0). Thus, the switches SW7 and SW9 are each set to off, and the three state inverters INV11 and INV13 are each set to on. Note that at this time a predetermined pulse voltage signal (for instance from high level to low level) is applied to the first digital plate line PL1_D and a high level (1) voltage signal is applied to the second digital plate line PL2_D. Consequently, a predetermined pulse voltage signal (for instance from a low level to a high level) is applied passing through the three state inverter INV11 to the first plate line PL1U of the U system, and a low level (0) voltage signal is applied passing through the three state inverter INV13 to the second plate line PL2U of the U system. Note that at this time a low level (0) voltage signal is applied to both the first analog plate line PL1U_A of the U system and the second analog plate line PL2U_A of the U system.

On the other hand, during nonvolatile storage portion NVM U system test operations the analog enable signal TESTD of the D system input into the test circuit portion TEST is set to high level (1). Thus, the switches SW8 and SW10 are each set to on, and the three state inverters INV12 and INV14 are each set to off. Note that at this time a reference voltage signal Vref having a predetermined voltage value is applied to both the first analog plate line PL1D_A of the D system and the second analog plate line PL2D_A of the D system. Consequently, the reference voltage signal Vref having a predetermined voltage value is applied passing through each of the switches SW8 and SW10 to both the first plate line PL1D of the D system and the second plate line PL2D of the D system.

Figure 34:
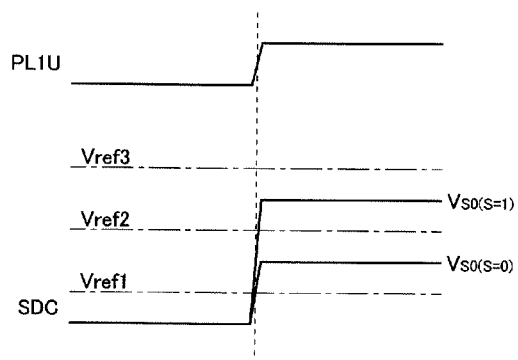
FIG. 34 is a timing chart used to explain the operation to evaluate the analog characteristics of the ferroelectric element.

FIG. 34 is a timing chart used to explain the operation to evaluate the analog characteristics of the ferroelectric element, and depicts the pulse voltage signal applied to the first plate line PL1U of the U system, the restoration voltage signal (corresponding to the second input signal SDC of the source amplifier SA) appearing at an output end of the U system of the nonvolatile storage portion NVM, and the reference voltage signal Vref (in FIG. 34 the three voltage values Vref1 to Vref3) input directly into an output end of the D system of the nonvolatile storage portion NVM.

During nonvolatile storage portion NVM U system test operations the second plate line PL2U of the U system is maintained at a low level, and when a predetermined pulse voltage signal (for instance, from low level to high level) is applied to the first plate line PL1U of the U system, a restoration voltage signal (corresponding to the second input signal SDC of the source amplifier SA) appears in accordance with a remanent polarization state inside the ferroelectric element in an output end of the U system of the nonvolatile storage portion NVM (the connection node between the negative end of the ferroelectric element CL2a and the positive end of the ferroelectric element CL2b), as stated previously.

Here, when data "0" is stored to the nonvolatile storage portion NVM (S=0), the second input signal SDC of the source amplifier SA becomes the first restoration voltage level VSO (S=0) (corresponding to the previously described logical WL), and when data "1" is stored in the nonvolatile storage portion NVM (S=1), the second input signal SDC of the source amplifier SA becomes the second restoration voltage level VSO (S=1) (corresponding to the previously described logical WH) that is higher than the first restoration voltage level VSO (S=0).

On the other hand, during nonvolatile storage portion NVM U system test operations a reference voltage signal Vref (corresponding to the first input voltage SDnC of the source amplifier SA) having an arbitrary analog voltage value is input directly from without the device to an output end of the D system of the nonvolatile storage portion NVM (the connection node between the negative end of the ferroelectric element CL1a and the positive end of the ferroelectric element CL1b).

Consequently, while the restoration voltage signal appearing in an output end of the U system of the nonvolatile storage portion NVM is input as the second input signal SDC of the source amplifier SA, the voltage value of the reference voltage signal Vref input as the first input signal SDnC of the source amplifier SA is sequentially changed by step control or sweep control, and the analog voltage value of the restoration voltage signal (the second input signal SDC of the source amplifier SA) appearing in an output end of the U system of the nonvolatile storage portion NVM can be determined by monitoring the logical level of the output signal Q restored to the loop structure portion LOOP each time the changes are made.

Figure 35:
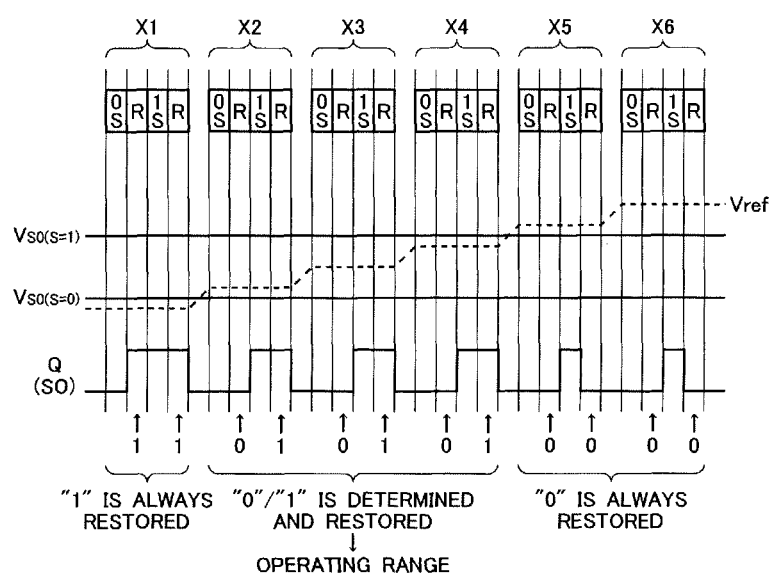
FIG. 35 is a schematic diagram illustrating the relationship between a reference voltage signal Vref and an output signal Q.

FIG. 35 is a schematic diagram illustrating the relationship between a reference voltage signal Vref and an output signal Q. Note that in the test sequence illustrated in this diagram, while the voltage value of the reference voltage signal Vref is sequentially changed at every cycle so that the data "0" writing step (0S), the data read out step (R), the data "1" writing step (1S), and the data read out step (R) constitute a single cycle, the logical level of the output signal Q restored to the loop structure portion LOOP is monitored every time changes are made, and the analog voltage value of the restoration voltage signal appearing in an output end of the U system of the nonvolatile storage portion NVM is measured based on the results of the monitoring.

Note that in the data "0" writing step (0S) and the data "1" writing step (1S), after data "0" and data "1," respectively, are input to the loop structure portion LOOP, comes a step wherein the data stored in the loop structure portion LOOP is saved to the nonvolatile storage portion NVM. In addition, the data read out step (R) causes the data stored in the nonvolatile storage portion NVM to be restored to the loop structure portion LOOP and is the step wherein the restored data is read out as the output signal Q.

Below, a specific explanation is made in accordance with the example of FIG. 35.

First, in the first cycle X1, the voltage value of the reference voltage signal Vref is set to a voltage value Vref1 lower than both the first restoration voltage level VSO (S=0) and the second restoration voltage level VSO (S=1). Consequently, whether data "0" or data "1" was written to the nonvolatile storage portion NVM, data "1" is always restored from the loop structure portion LOOP. In other words, data "1" is read out as the output signal Q for both in the second data read out step included in the first cycle X1.

Next, in the second cycle X2, the voltage value of the reference voltage signal Vref is set to a voltage value Vref2 higher than the voltage value Vref1 set in the first cycle X1. Note that in the example of FIG. 35 the voltage value Vref2 is higher than the first restoration voltage level VSO (S=0), and lower than the second restoration voltage level VSO (S=1). Consequently, when data "0" is written to the nonvolatile storage portion NVM data "0" is restored to the loop structure portion LOOP, and when data "1" is written to the nonvolatile storage portion NVM data "1" is restored to the loop structure portion LOOP. In other words, data "0" and data "1" are sequentially read out as the output signal Q in the second data read out step included in the second cycle X2. Here, the operation state is such that the data contents (0 or 1) stored in the nonvolatile storage portion NVM are determined and continually restored to the loop structure portion LOOP.

At this time point we understand that the first restoration voltage level VSO (S=0) is higher than the voltage value Vref1 and lower than the voltage value Vref2.

Also, thereafter, in the third cycle X3 the voltage value of the reference voltage signal Vref is set to a voltage value Vref3 that is higher than the voltage value Vref2, and in the fourth cycle X4 the voltage value of the reference voltage signal Vref is set to a voltage value Vref4 that is higher than the voltage value Vref3. However, the voltage values Vref3 and Vref4 are the same as the voltage value Vref2 in that each Vref3 and Vref4 are higher than the first restoration voltage level VSO (S=0), but are lower than the second restoration voltage value VSO (S=1). Therefore, when data "0" is written to the nonvolatile storage portion NVM data "0" is restored to the loop structure portion LOOP and when data "1" is written to the nonvolatile storage portion NVM, data "1" is restored to the loop structure portion LOOP. In other words, data "0" and data "1" are sequentially read out as the output signal Q in the two data read out steps included in the third cycle X3 and the fourth cycle X4.

Next, in the fifth cycle X5 the voltage value of the reference voltage signal Vref is set to a voltage value Vref5 that is higher than the voltage value Vref4. Note that in the example of FIG. 35 the voltage value Vref5 is higher than either of the first restoration voltage level VSO (S=0) and the second restoration voltage level VSO (S=1). Consequently, whether data "0" or data "1" is written to the nonvolatile storage portion NVM data "0" is always restored to the loop structure portion LOOP. In other words, data "0" is read out as the output signal Q in both of the two data read out steps included in the fifth cycle X5.

At this time point we understand that the second restoration voltage level VSO (S=1) is higher than the voltage value Vref4 and lower than the voltage value Vref5.

Note that in the example of FIG. 35 a situation is depicted wherein the sixth step X6 and the sequence thereafter continues, but at the point in time wherein the analog voltage value of both the first restoration voltage level VSO (S=0) and the second restoration voltage level VSO (S=1) are confirmed, the test sequence may end.

In addition, in FIG. 35 the example given includes a test sequence wherein the data "0" writing step (0S), the data read out step (R), the data "1" writing step (1S), and the data read out step (R) constitute one cycle. However the test sequence is not limited to this, and for example, it is possible to adopt a structure wherein the data "0" writing step (0S) and the data read out step (R) are assumed to constitute a single cycle, the first restoration voltage level VSO (S=0) alone is measured, the data "1" writing step (1S) and the data read out step (R) are then assumed to constitute a single cycle, and the second restoration voltage level VSO (S=1) alone is measured.

In addition, in the description above an example was given wherein the analog characteristics evaluation (voltage value measurement of the second input signal SDC) of the second input signal SDC input into the source amplifier from an output end of the U system of the nonvolatile storage portion is executed, but even in cases wherein the analog characteristics evaluation (voltage value measurement of the first input signal SDC) of the first input signal SDnC input into the source amplifier SA from an output end of the D system of the nonvolatile storage portion NVM is executed, the same applies and is needless to say.

In other words, when voltage measurement of the first input signal SDnC is executed, a restoration voltage signal (corresponding to the first input voltage SDnC of the source amplifier SA) is drawn out in accordance with the contents of stored data from an output end of the D system of the nonvolatile storage portion NVM (the connection node between the negative end of the ferroelectric element CL1a and the positive end of the ferroelectric element CL1b). On the other hand, a reference voltage signal Vref (corresponding to the second input voltage SDC of the source amplifier SA), having an arbitrary analog voltage value, is input directly to an output end of the U system of the nonvolatile storage portion NVM (the connection node between the negative end of the ferroelectric element CL2a and the positive end of the ferroelectric element CL2b), and a test sequence the same as the one described above may be executed.

Figure 36:
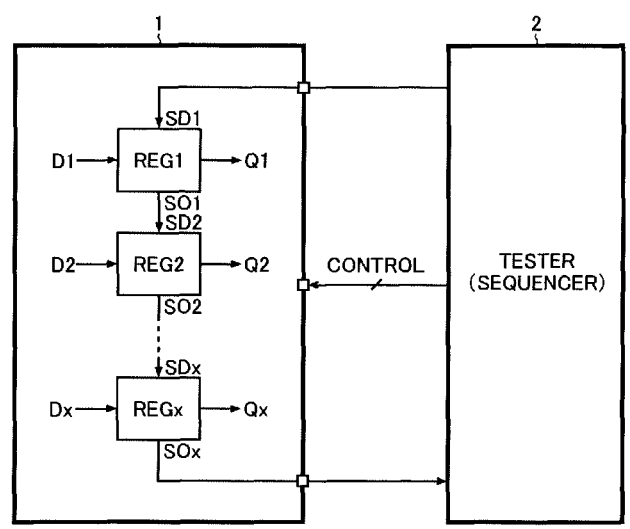
FIG. 36 is a block diagram used to explain the test operations of the data holding device wherein a SCAN-PASS [test circuit] is used.

Next, test operations of the data holding device using a SCAN-PASS test circuit will be explained. FIG. 36 is a block diagram used to explain the test operations of the data holding device wherein a SCAN-PASS test circuit is used. A logical arithmetic device 1 is a semiconductor integrated circuit device having a number x (however, x must be an integer greater than 2) of registers REG1 to REGx arranged in a line. Note that registers REG1 to REGx each correspond to the data holding device (see FIG. 26, etc.) of the fifth variation example of the present invention as described previously.

During regular operations of the logical arithmetic device 1, each of data D1 to Dx is input from the prior-stage logic circuit (not shown) to the registers REG1 to REGx, and each output signal Q1 to Qx is output from the registers REG1 to REGx to the subsequent-stage logic circuit (not shown).

On the other hand, during test operations of the logical arithmetic device 1, a control signal is input from the tester (sequencer) 2 so that registers REG1 to REGx pass through the SCAN-PASS test circuit and compose a serially connected shift register. In other words, scan data SD1 is input from the tester 2 to the first-stage register REG1, and a scan output signal SO1 of the register REG1 is input into the register REG2 as scan data SD2. This is true for the registers from the next stage and thereafter, and the scan output signal of the prior-stage register is sequentially input as the scan data of the subsequent-stage registers. The scan output signal SOx output from the last-stage register REGx is input into the tester 2.

In this way, by making the structure one that executes test operations of the data holding device using a SCAN-PASS test circuit, even in systems wherein multiple data holding devices (in FIG. 36 registers REG1 to REGx) that are the target of the test exist, appropriate test operations can be executed without unnecessarily increasing the pin number of the data output terminals brought out into the exterior of the device.

Figure 37A:
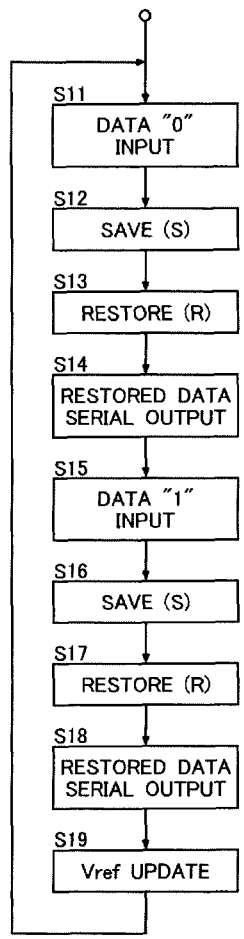
FIG. 37A is a flowchart illustrating one example of test operations wherein a SCAN-PASS [test circuit] is used.

FIG. 37A is a flowchart illustrating one example of test operations wherein a SCAN-PASS test circuit is used, and based substantially on the test sequence illustrated in FIG. 35 above.

First, in step S11 data "0" is entered into each of the loop structure portions LOOP of the registers REG1 to REGx. Note that any of the following methods may be used as methods of inputting data "0": a method wherein data "0" is entered from an input end of the data D, a method wherein data "0" is input from an input end of the scan data SD, or a method wherein data "0" is input by resetting the loop structure portion LOOP using the external reset signal RN.

Next, in step S12 data is saved from each loop structure portion LOOP of the registers REG1 to REGx to each nonvolatile storage portion NVM, and in step 13 data is restored from each nonvolatile storage portion NVM of the registers REG1 to REGx to each loop structure portion LOOP. At this time, when measuring the voltage value of the first input signal SDnC, an arbitrary reference voltage signal Vref may be input directly as the second input voltage SDC, and conversely, when measuring the voltage value of the second input signal SDC, an arbitrary reference voltage signal Vref may be directly input as the first input voltage SDnC. This kind of data saving/restoration operation is as described previously, so a re-explanation will not be made here.

Next, in step S14 data restored to each loop structure portion LOOP of the registers REG1 to REGx is serially output using the SCAN-PASS test circuit. Specifically, the scan data SD1 is input x times from the tester 2 into the first-stage register REG1 synchronizing with the clock signal including x pulses, and the scan output signal SOx is output x times from the last-stage register REGx to the tester 2 in accordance therewith. In other words, in the tester 2, data restored to each loop structure portion LOOP of the registers REG1 to REGx is serially output in reverse order (in the order: from register REGx to REG1). Note that at this time the contents of the scan data SD1 entered into the first-stage register REG1 from the tester 2 are not questioned.

Next, in step S15 data "1" is entered into each of the loop structure portions LOOP of the registers REG1 to REGx. Note that any of the following methods may be used as methods of inputting data "1": a method wherein data "1" is entered from an input end of the data D, a method wherein data "1" is input from an input end of the scan data SD, or a method wherein data "1" is input by resetting the loop structure portion LOOP using the external reset signal SN.

Next, in step S16 data is saved from each loop structure portion LOOP of the registers REG1 to REGx to each nonvolatile storage portion NVM, and in step S17 data is restored from each nonvolatile storage portion NVM of the registers REG1 to REGx to each loop structure portion LOOP. At this time, when measuring the voltage value of the first input signal SDnC, an arbitrary reference voltage signal Vref may be input directly as the second input voltage SDC, and conversely, when measuring the voltage value of the second input signal SDC, an arbitrary reference voltage signal Vref may be directly input as the first input voltage SDnC. This kind of data saving/restoration operation is as described previously, so a re-explanation will not be made here.

Next, in step S18 data restored to each loop structure portion LOOP of the registers REG1 to REGx is serially output using the SCAN-PASS test circuit. Specifically, the scan data SD1 is input x times from the tester 2 into the first-stage register REG1 synchronizing with the clock signal including x pulses, and the scan output signal SOx is output x times from the last-stage register REGx to the tester 2 in accordance therewith. In other words, data restored to each loop structure portion LOOP of the registers REG1 to REGx is serially output in reverse order (in the order: from register REGx to REG1).

Next, in step S19 the voltage value of the reference voltage Vref is updated, and the flow returns to step S11. Taking this kind of series of steps as one cycle, the test sequence that was explained earlier and illustrated in FIG. 35 is executed, and the voltage values of both the first input signal SDnC and the second input signal SDC are measured.

Figure 37B:
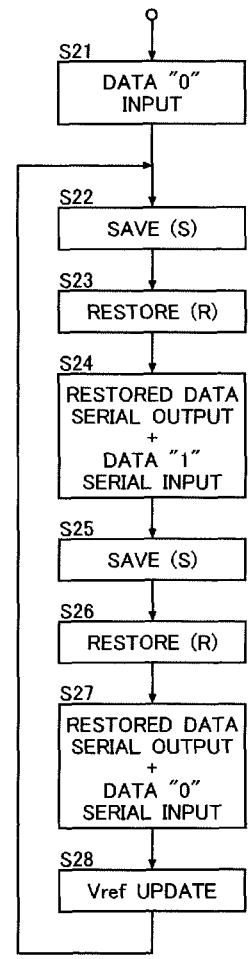
FIG. 37B is a flowchart illustrating another example of test operations wherein a SCAN-PASS [test circuit] is used.

FIG. 37B is a flowchart illustrating another example of test operations wherein a SCAN-PASS test circuit is used. Fundamentally, FIG. 37B adopts the test sequence illustrated in FIG. 35 and described previously.

First, in step S21 data "0" is entered into each of the loop structure portions LOOP of the registers REG1 to REGx. Note that any of the following methods may be used as methods of inputting data "0": a method wherein data "0" is entered from an input end of the data D, a method wherein data "0" is input from an input end of the scan data SD, or a method wherein data "0" is input by resetting the loop structure portion LOOP using the external reset signal RN.

Next, in step S22 data is saved from each loop structure portion LOOP of the registers REG1 to REGx to each nonvolatile storage portion NVM, and in step 23 data is restored from each nonvolatile storage portion NVM of the registers REG1 to REGx to each loop structure portion LOOP. At this time, when measuring the voltage value of the first input signal SDnC, an arbitrary reference voltage signal Vref may be input directly as the second input voltage SDC, and conversely, when measuring the voltage value of the second input signal SDC, an arbitrary reference voltage signal Vref may be directly input as the first input voltage SDnC. This kind of data saving/restoration operation is as described previously, so a re-explanation will not be made here.

Next, in step S24 data restored to each loop structure portion LOOP of the registers REG1 to REGx is serially output using the SCAN-PASS test circuit, and data "1" is serially input to the loop structure portion LOOP of each of the registers REG1 to REGx. Specifically, the data "1" scan data SD1 is input x times from the tester 2 into the first-stage register REG1 synchronizing with the clock signal including x pulses, and the scan output signal SOx is output x times from the last-stage register REGx to the tester 2 in accordance therewith. In other words, data restored to each loop structure portion LOOP of the registers REG1 to REGx is serially output in reverse order (the order: from register REGx to REG1), and data "1" is serially input in sequential manner into each loop structure portion LOOP of each of the registers REG1 to REGx. Consequently, step S14 and step S15 of FIG. 37A can be gathered into a single step S24.

Next, in step S25 data is saved from each loop structure portion LOOP of the registers REG1 to REGx to each nonvolatile storage portion NVM, and in step S26 data is restored from each nonvolatile storage portion NVM of the registers REG1 to REGx to each loop structure portion LOOP. At this time, when measuring the voltage value of the first input signal SDnC, an arbitrary reference voltage signal Vref may be input directly as the second input voltage SDC, and conversely, when measuring the voltage value of the second input signal SDC, an arbitrary reference voltage signal Vref may be directly input as the first input voltage SDnC. This kind of data saving/restoration operation is as described previously, so a re-explanation will not be made here.

Next, in step S27 data restored to each loop structure portion LOOP of the registers REG1 to REGx is serially output using the SCAN-PASS test circuit, and data "0" is serially input to the loop structure portions LOOP of each of the registers REG1 to REGx. Specifically, the data "0" scan data SD1 is input x times from the tester 2 into the first-stage register REG1 synchronizing with the clock signal including x pulses, and the scan output signal Sox is output x times from the last-stage register REGx to the tester 2 in accordance therewith. In other words, data restored to each loop structure portion LOOP of the registers REG1 to REGx is serially output in reverse order (in the order: from register REGx to REG1), and data "0" is serially input in sequential manner to the loop structure portion LOOP of each of the registers REG1 to REGx. Consequently, step S18 and step S11 of FIG. 37A can be gathered into a single step S27.

Next, in step S28 the voltage value of the reference voltage Vref is updated, and the flow returns to step S22. Taking this kind of series of steps as one cycle, the test sequence that was explained earlier and illustrated in FIG. 35 is executed, and the voltage values of both the first input signal SDnC and the second input signal SDC are measured.

As described above, the data holding device of the fifth variation example of the present invention is capable of executing analog characteristics evaluations of the ferroelectric elements in detail even when the device is included in a system.

Figure 38:
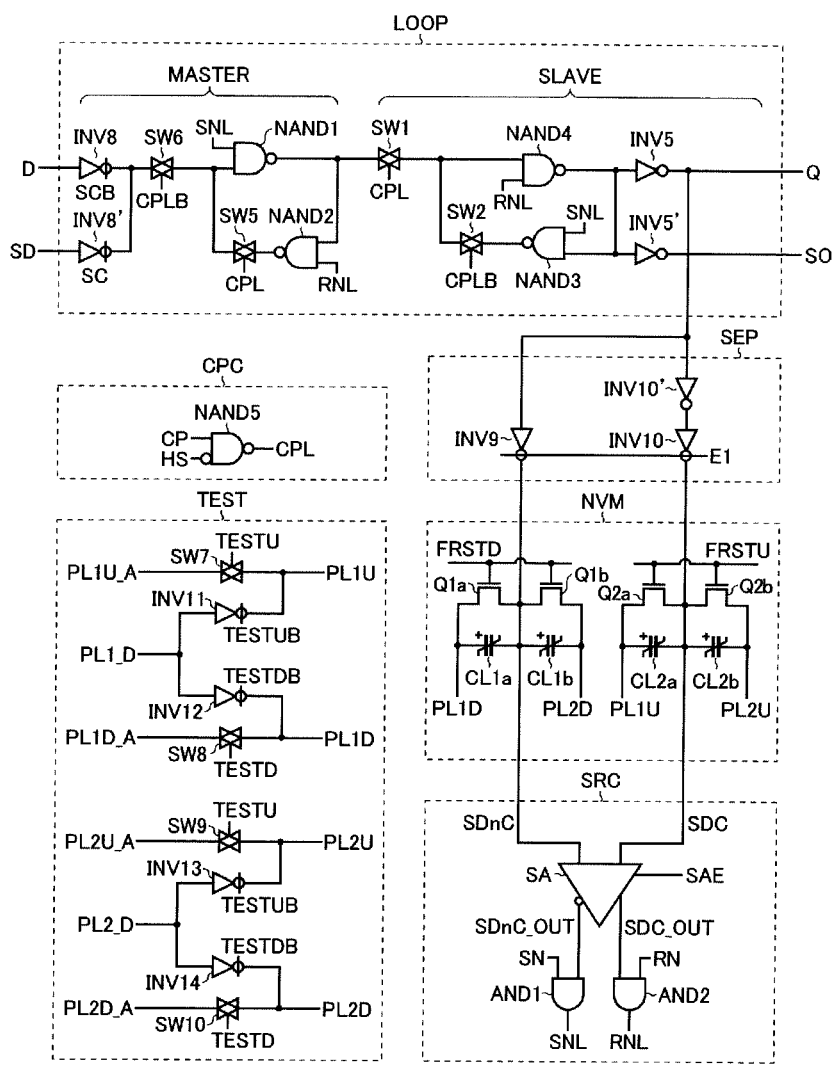
FIG. 38 is a circuit diagram illustrating a sixth variation example of the data holding device according to the present invention.

FIG. 38 is a circuit diagram illustrating a sixth variation example of the data holding device according to the present invention. Note that the present variation example of the present invention has essentially the same structure as the previously described fifth variation example, and illustrates a structure wherein only the output signal Q of the loop structure portion LOOP is input into the circuit separating portion SEP. Note that the circuit separating portion SEP is configured so that the output signal Q is input directly into the three state inverter INV9, and the logical inversion signal of the output signal Q is input into the three state inverter INV10 via the separate and newly inserted inverter 10'. By having this kind of structure, it becomes possible to add the circuit separating portion SEP, the nonvolatile storage portion NVM, and the set/reset controller SRC at a later time without modifying the loop structure portion LOOP at all. Therefore, making existing data holding devices nonvolatile is easily possible.

Figure 39:
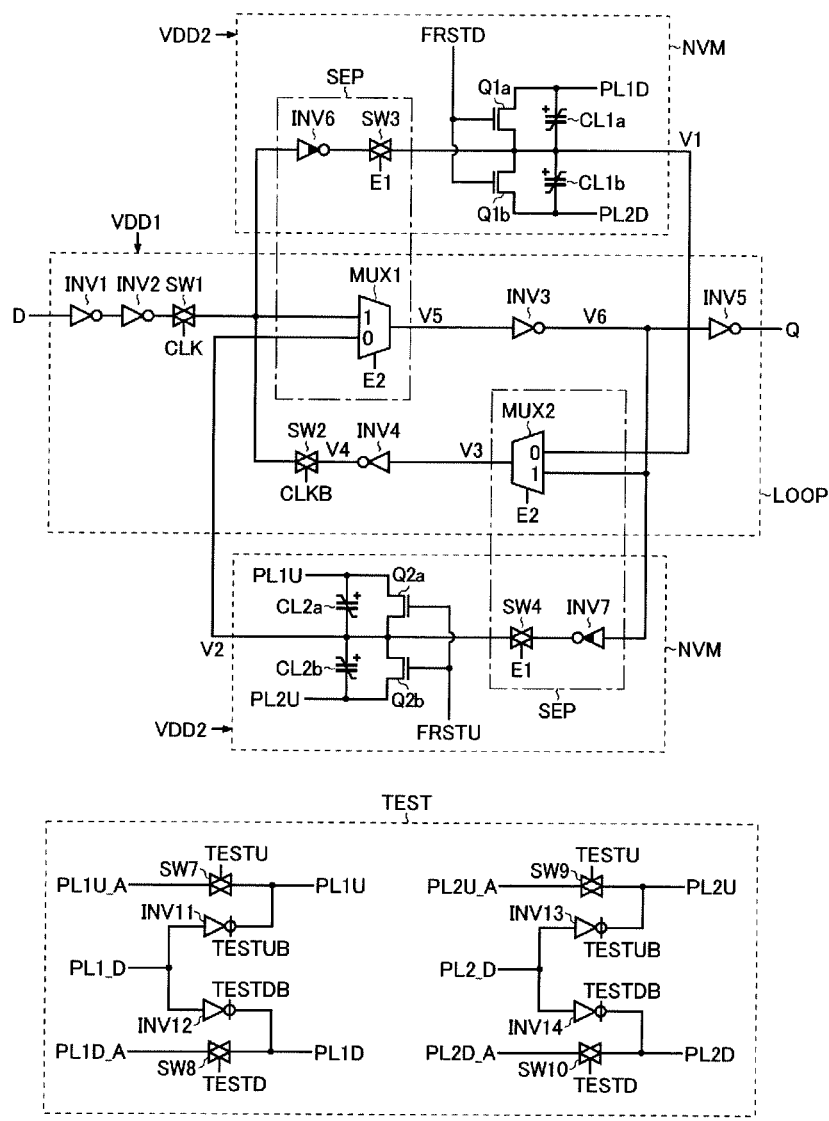
FIG. 39 is a circuit diagram illustrating a seventh variation example of the data holding device according to the present invention.

FIG. 39 is a circuit diagram illustrating a seventh variation example of the data holding device according to the present invention. Note that the present variation example corresponds to a structure wherein the previously described test circuit portion TEST was inserted after the first plate line, the second plate line, and the F reset signal line of the data holding device of FIG. 1 were each divided into two systems (the U system and the D system).

Figure 40:
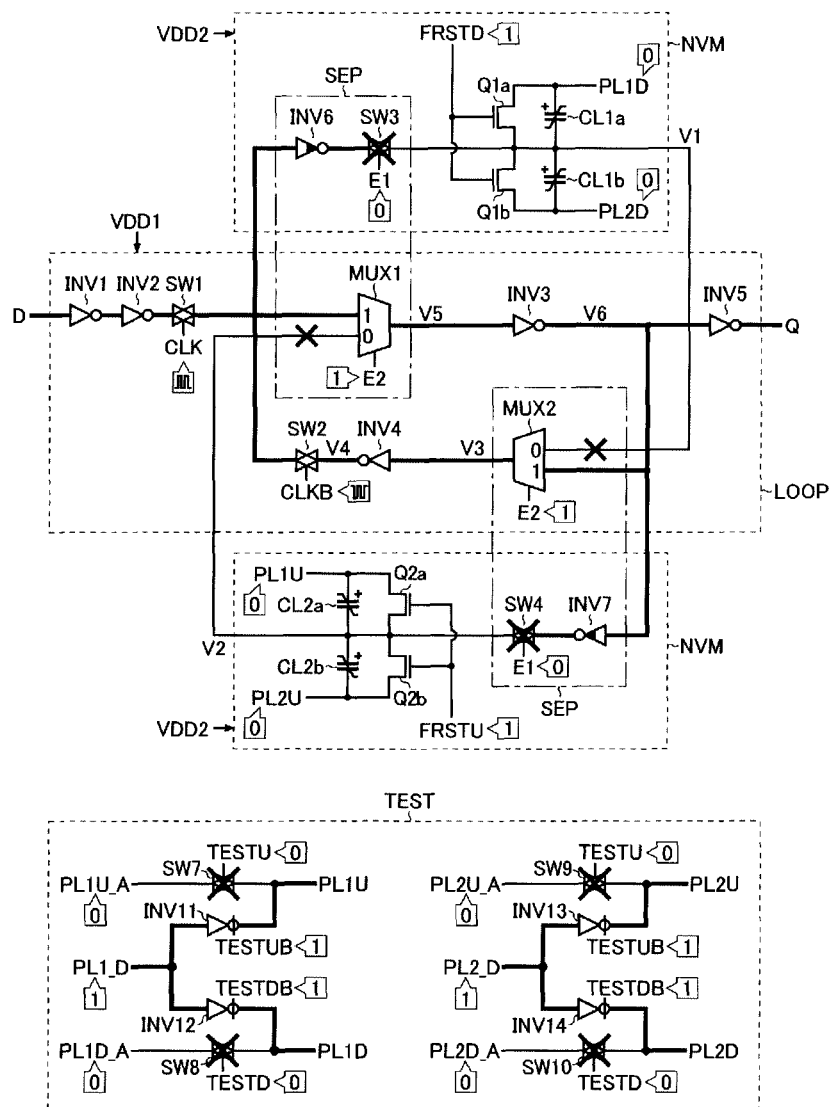
FIG. 40 is a circuit diagram illustrating the operational state of the various parts of the device during regular operations of the seventh variation example of the data holding device according to the present invention.

First, regular operations of the data holding device will be explained. FIG. 40 is a circuit diagram illustrating the operational state of the various parts of the device during regular operations.

During regular operations of the data holding device latch operations of the data signal D are executed based on the pulse driven clock signal CLK and the inverse clock signal CLKB in the loop structure portion LOOP.

In addition, during regular operations of the data holding device the control signal E1 is set to low level "0," and the switches SW3 and SW4 are each set to off in the circuit separating portion SEP. In addition, the control signal E2 is set to high level "1," and a first input end "1" of the multiplexers MUX1 and MUX2 is selected. Thus, the loop structure portion LOOP and the nonvolatile storage portion NVM are electrically separated, and a regular loop of the loop structure portion LOOP is formed.

In addition, during regular operations of the data holding device high level "1" F reset signals FRSTD and FRSTU are input into the nonvolatile storage portion NVM. Thus, each of the transistors Q1a, Q1b, Q2a, and Q2b are turned on, so that each of the ferroelectric elements CL1a, CL1b, CL2a, and CL2b is short-circuited at the ends. Therefore, it is possible to avoid applying unintended voltage to each of the ferroelectric elements. Note that at this time a low level "0" voltage signal is applied to each of the first plate lines PL1D and PL1U and each of the second plate lines PL2D and PL2U.

In addition, during regular operations of the data holding device low level "0" analog enable signals TESTD and TESTU are input into the test circuit portion TEST. Thus, the switches SW7 to SW10 are each set to off, and the three state inverters INV11 to INV14 are each set to on. Note that at this time a high level "1" voltage signal is applied to both the first digital plate line PL1_D and the second digital plate line PL2_D. Consequently, a low level "0" voltage signal is applied to each of the first plate lines PL1D and PL1U and each of the second plate lines PL2D and PL2U via each of the three state inverters INV11 to INV14. In addition, at this time a low level "0" voltage signal is applied to each of the first analog plate lines PL1D_A and PL1U_A and each of the second analog plate lines PL2D_A and PL2U_A.

Figure 41:
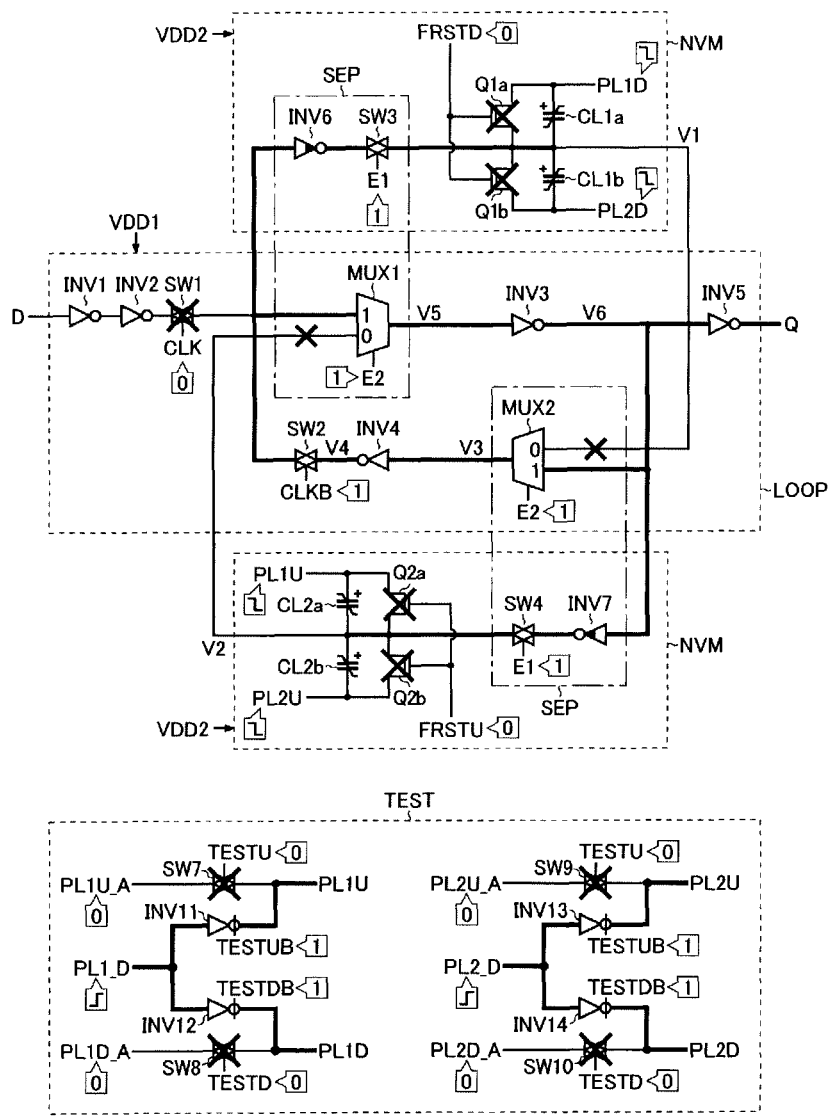
FIG. 41 is a circuit diagram illustrating the operational state of the various parts of the device during data writing operations of the seventh variation example of the data holding device according to the present invention.

Next, data writing operations (data saving operations to the nonvolatile storage portion NVM) of the data holding device will be explained. FIG. 41 is a circuit diagram illustrating the operational state of the various parts of the device during data writing.

During data writing operations of the data holding device, the clock signal CLK input into the loop structure portion LOOP and the inverse clock signal CLKB are hare-set to low level "0" and high level "1," respectively. Thus, it is possible to block the input path of the data signal D so that the contents of the data stored in the loop structure portion LOOP (in other words, data that should be saved to the nonvolatile storage portion NVM) do not change. By extension, the stability of writing operations (data saving operations) to the nonvolatile storage portion NVM can be increased.

In addition, during data writing operations of the data holding device, the control signal E1 is set to high level "1" in the circuit separating portion SEP, and the switches SW3 and SW4 are set to off. In addition, the control signal E2 is set to high level "1," and an input end "1" of the multiplexers MUX1 and MUX2 is selected. The loop structure portion LOOP and the nonvolatile storage portion NVM are thereby made electrically conductive in a state in which a regular loop of the loop structure portion LOOP is formed.

In addition, during data writing operations of the data holding device low level "0" F reset signals FRSTD and FRSTU are input to the nonvolatile storage portion NVM. Thus, each of the transistors Q1a, Q1b, Q2a, and Q2b are turned off, so that each of the ferroelectric elements CL1a, CL1b, CL2a, and CL2b is disconnected at the ends (not short-circuited). Therefore, data writing voltage can be applied to each of the ferroelectric elements. Note that at this time the same pulse voltage signal (for example, from high level to low level) is applied to each of the first plate lines PL1D and PL1U and each of the second plate lines PL2D and PL2U as the above data writing voltage. A remanent polarization state of the ferroelectric elements is set to an inverse or a non-inverse state by applying this kind of voltage signal. This is as previously explained, so a re-explanation will not be made here.

In addition, during data writing operations of the data holding device, low level "0" analog enable signals TESTD and TESTU are input to the test circuit portion TEST in the same manner as during regular operations. Thus, each of the switches SW7 to SW10 are set to off and each of the three state inverters INV11 to INV14 are set to on. Note that at this time the same pulse voltage signal (for example from low level to high level) is applied to both the first digital plate line PL1_D and the second digital plate line PL2_D. Consequently, the same pulse voltage signal (for example, from high level to low level) is applied via each of the three state inverters INV11 to INV14 to the first plate lines PL1D and PL1U and the second plate lines PL2D and PL2U. In addition, at this time a low level "0" voltage signal is applied to each of the first analog plate lines PL1D_A and PL1U_A and each of the second analog plate lines PL2D_A and PL2U_A.

Figure 42:
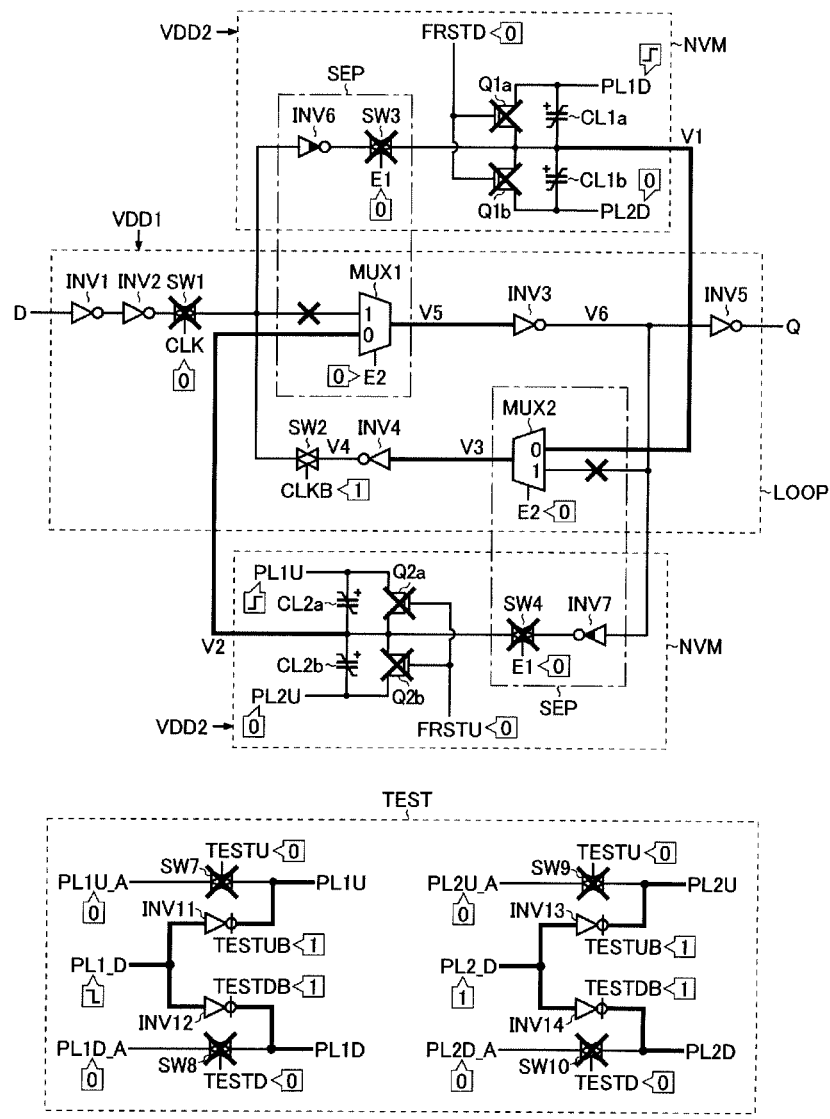
FIG. 42 is a circuit diagram illustrating the operational state of the various parts of the device during data read out operations of the seventh variation example of the data holding device according to the present invention.

Next, data read out operations (data restoration operations to the loop storage portion LOOP) of the data holding device are explained. FIG. 42 is a circuit diagram illustrating the operational state of the various parts of the device during data read out operations.

During data read out operations of the data holding device the clock signal CLK input into the loop structure portion LOOP and the inverse clock signal CLKB are set to low level "0" and to high level "1," respectively—in the same manner as during data writing operations. Note that the pulse drive of the clock signal CLK and the inverse clock signal CLKB re-initiates after the data read out operations have completed.

In addition, during data read out operations of the data holding device the control signal E1 is set to low level "0" in the circuit separating portion SEP, and the switches SW3 and SW4 are set to off. In addition, the control signal E2 is set to low level "0," and the second input end "0" of the multiplexers MUX1 and MUX2 is selected. The loop structure portion LOOP and the nonvolatile storage portion NVM are thereby made electrically conductive in a connected state in which data can be read out from the nonvolatile storage portion NVM to the loop structure portion LOOP.

In addition, during data read out operations of the data holding device low level "0" F reset signals FRSTD and FRSTU are input into the nonvolatile storage portion NVM. Thus, the transistors Q1a, Q1b, Q2a, and Q2b are turned off, so that each of the ferroelectric elements CL1a, CL1b, CL2a, and CL2b is disconnected at the ends (not short-circuited). Therefore, a data-read-out voltage can be applied to each ferroelectric element. Note that at this time the second plate lines PL2D and PL2U are maintained at low level, as the data read out voltage described above, and a predetermined pulse voltage signal (for example, from low level to high level) is applied to the first plate lines PL2D and PL1U. By applying this kind of pulse voltage signal, node signals V1 and V2 corresponding to a remanent polarization state of the ferroelectric element, appear on an output end of the D system (the connection node between the negative end of the ferroelectric element CL1a and the positive end of the ferroelectric element CL1b) of the nonvolatile storage portion NVM and an output end of the U system (the connection node between the negative end of the ferroelectric element CL2a and the positive end of the ferroelectric element CL2b). In this way, the restoration voltage signal (the potential difference between the node voltage V1 and the node voltage V2) read out from the nonvolatile storage portion NVM is amplified at the loop structure portion LOOP when the control signal E2 rises from low level "0" to high level "1," and the data held as output signal Q before the power supply block is restored. This is as previously described, so a re-explanation will not be made here.

In addition, during data read out operations of the data holding device low level "0" analog enable signals TESTD and TESTU are input into the test circuit portion TEST in the same manner as during regular operations. Thus, the switches SW7 to SW10 are each set to off, and the three state inverters INV11 to INV14 are each set to on. Note that at this time a predetermined voltage pulse (for example, from high level to low level) is applied to the first digital plate line PL1_D, and a high level "1" voltage signal is applied to the second digital plate line PL2_D. Consequently, the same pulse voltage signal (for example from low level to high level) is applied via both three state inverters INV11 and INV12 to the first plate lines PL1D and PL1U, and a low level "0" voltage signal is applied via both three state inverters INV13 and INV14 to the second plate lines PL2D and PL2U. In addition, at this time a low level "0" voltage signal is applied to each of the first analog plate lines PL1D_A and PL1U_A and to both of the second analog plate lines PL2D_A and PL2U_A.

Figure 43:
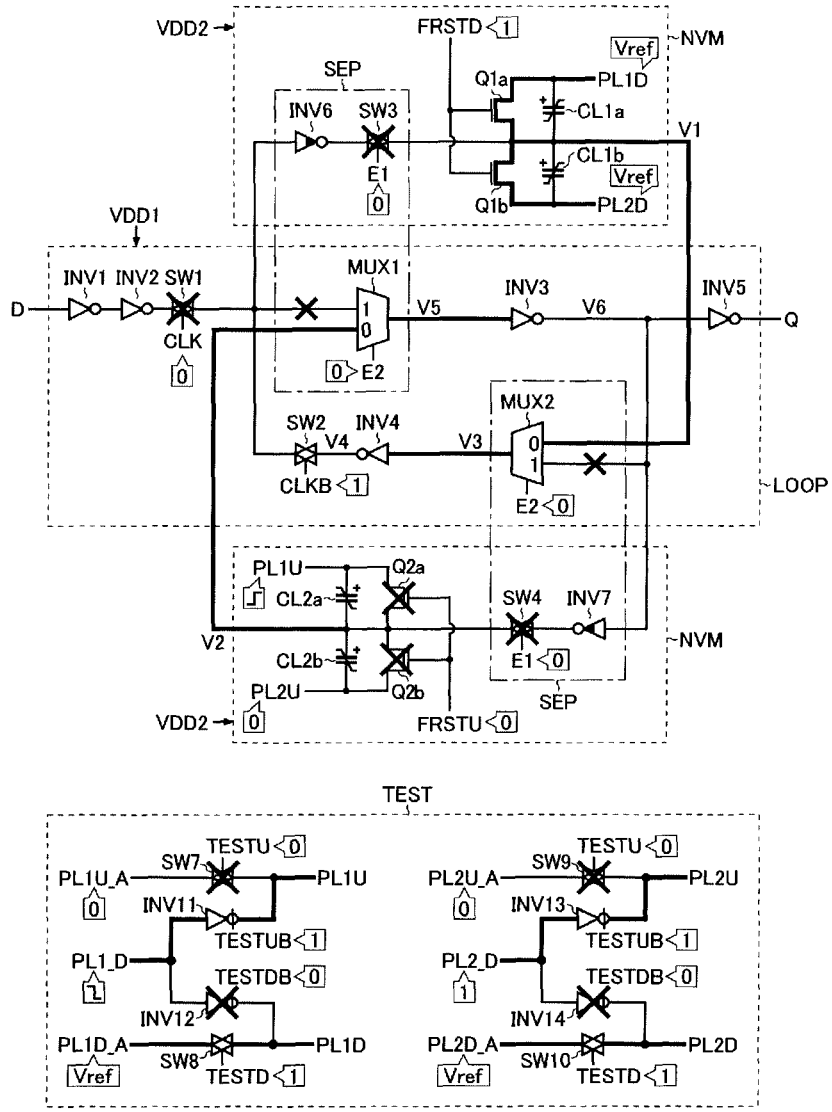
FIG. 43 is a circuit diagram illustrating the operational state of the various parts of the device during test operations of the seventh variation example of the data holding device according to the present invention.

Next, test operations (analog characteristics evaluation operations of the ferroelectric elements) will be explained. FIG. 43 is a circuit diagram illustrating the operational state of the various parts of the device during test operations (particularly, at the time of the step of restoring stored data included in a series of test operations sequences). Note that the below example features analog characteristics evaluations of the node voltage V2 appearing in an output end of the U system of the nonvolatile storage portion NVM. This is called "nonvolatile storage portion NVM U system test operations," and will be described specifically.

During nonvolatile storage portion NVM U system test operations, the clock signal CLK input into the loop structure portion LOOP and the inverse clock signal CLKB are fixed to low level "0" and to high level "1" respectively, in the same manner as during data writing operations and data read out operations. Note that the pulse drive of the clock signal CLK and the inverse clock signal CLKB re-initiates after the data read out operations have completed.

During nonvolatile storage portion NVM U system test operations, the control signal E1 is set to low level "0" in the circuit separating portion SEP, and the switches SW3 and SW4 are set to off. In addition, the control signal E2 is set to low level "0" and a second input end "0" of the multiplexers MUX1 and MUX2 is selected. The loop structure portion LOOP and the nonvolatile storage portion NVM are thereby made electrically conductive in a connected state in which data can be read out from the nonvolatile storage portion NVM to the loop structure portion LOOP.

In addition, during nonvolatile storage portion NVM U system test operations a low level "0" F reset signal FRSTU is input into the U system of the nonvolatile storage portion NVM. Thus, the transistors Q2a, and Q2b are turned off, so that each of the ferroelectric elements CL2a, and CL2b is disconnected at the ends (not short-circuited). Therefore, a data-read-out voltage can be applied to each ferroelectric element. Note that at this time the second plate line PL2U is maintained at low level as the data read out voltage described above, and a predetermined pulse voltage signal (for example, from low level to high level) is applied to the first plate line PL1U. By applying this kind of pulse voltage signal, node signal V2, corresponding to a remanent polarization state of the ferroelectric element, appears on an output end of the U system (the connection node between the negative end of the ferroelectric element CL2a and the positive end of the ferroelectric element CL2b) of the nonvolatile storage portion NVM. This is as previously described, so a re-explanation will not be made here.

On the other hand, during nonvolatile storage portion NVM U system test operations a high level "1" F reset signal FRSTD is input into the D system of the nonvolatile storage portion NVM. Thus, the transistors Q1a, and Q1b are turned on, so that each of the ferroelectric elements CL1a, and CL1b is short-circuited at the ends. In addition, at this time a reference voltage signal Vref, having a predetermined analog voltage value, is applied to both the first plate line PL1D and the second plate line PL2D. Consequently, node voltage V1, which appears on an output end of the D system (the connection node between the negative end of the ferroelectric element CL1a and the positive end of the ferroelectric element CL1b) of the nonvolatile storage portion NVM, is the same as the previously mentioned reference voltage signal Vref.

In addition, during nonvolatile storage portion NVM U system test operations the analog enable signal TESTU of the U system input into the test circuit portion TEST is set to low level (0). Thus, the switches SW7 and SW9 are each set to off, and the three state inverters INV11 and INV13 are each set to on. Note that at this time a predetermined pulse voltage signal (for example, from high level to low level) is applied to the first digital plate line PL1_D and a high level (1) voltage signal is applied to the second digital plate line PL2_D. Consequently, a predetermined pulse voltage signal (for example, from low level to high level) is applied via the three state inverter INV11 to the first plate line PL1U of the U system, and a low level (0) voltage signal is applied via the three state inverter INV13 to the second plate line PL2U of the U system. Note that at this time a low level (0) voltage signal is applied to both the first analog plate line PL1U_A of the U system and the second analog plate line PL2U_A of the U system.

On the other hand, during nonvolatile storage portion NVM U system test operations the analog enable signal TESTD of the D system input into the test circuit portion TEST is set to high level (1). Thus, the switches SW8 and SW10 are each set to on, and the three state inverters INV12 and INV14 are each set to off. Note that at this time a reference voltage signal Vref having a predetermined voltage value is applied to both the first analog plate line PL1D_A of the D system and the second analog plate line PL2D_A of the D system. Consequently, the reference voltage signal Vref having a predetermined voltage value is applied via each of the switches SW8 and SW10 to both the first plate line PL1D of the D system and the second plate line PL2D of the D system.

While the node voltage V2 appearing in an output end of the U system of the nonvolatile storage portion NVM is thus read, the voltage value of the reference voltage signal Vref input as the node voltage V1 is sequentially changed by step control or sweep control, and the analog voltage value of the node voltage V2 appearing in an output end of the U system of the nonvolatile storage portion NVM can be determined by monitoring the logical level of the output signal Q restored to the loop structure portion LOOP each times the changes are made. This aspect has already been described above, and a detailed description thereof will therefore be omitted. The aspect whereby a control routine that is reverse of that described above should be performed in a case in which the goal is to determine the analog voltage value of the node voltage V1 appearing in an output end of the D system of the nonvolatile storage portion NVM is also as previously described.

In this way, it is naturally possible to insert a test circuit portion TEST even into data holding devices that require stopping the clock signal when saving and restoring data.

Figure 44:
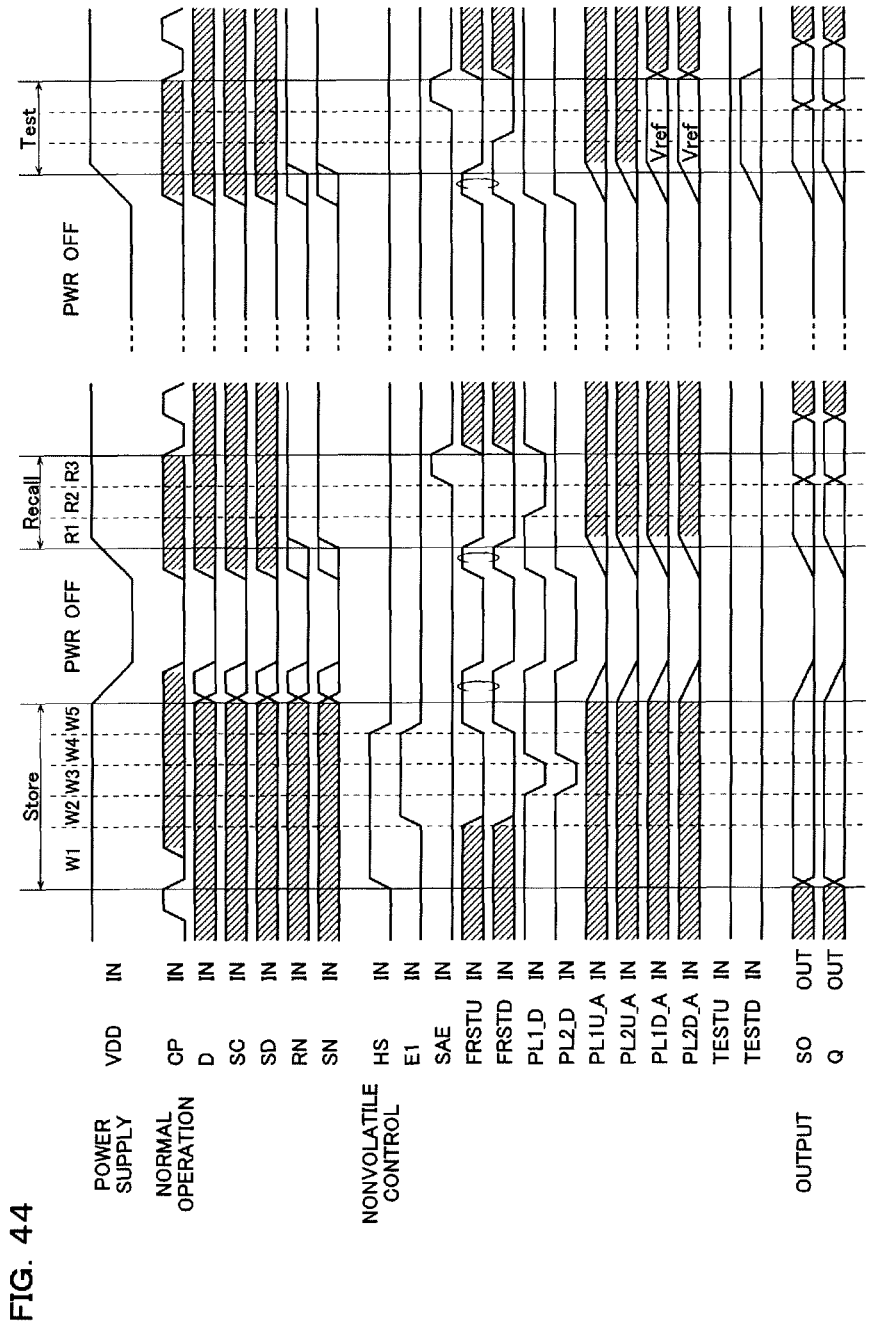
FIG. 44 is a timing chart used to explain the data corruption prevention function during on/off of the power supply.

FIG. 44 is a timing chart used to explain the data corruption prevention function during on/off of the power supply. From the top FIG. 44 depicts: a power supply voltage VDD, an external clock signal CP, a data signal D, a scan control signal SC, a scan data SD, an external reset signal RN, an external set signal SN, a data storage control signal HS, a control signal E1, a sense amplifier enable signal SAE, an F reset signal FRSTU of the U system, an F reset signal FRSTD of the D system, a first digital plate line PL1_D, a second digital plate line PL2_D, a first analog plate line PL1U_A of the U system, a second analog plate line PL2U_A of the U system, a first analog plate line PL1D_A of the D system, a second analog plate line PL2D_A of the D system, an analog enable signal TESTU of the U system, an analog enable signal TESTD of the D system, a scan output data SO, and an output signal Q.

As illustrated in the present timing chart, the data holding device of the present invention executes appropriate sequence control so that high voltages capable of corrupting data stored to the nonvolatile storage portion NVM are not applied to the ends of the ferroelectric elements even if the driver INV that applies voltage signals to ferroelectric elements is operated incorrectly when the power supply is turned on or off, or during other transitory states. Thus, highly reliable nonvolatile storage is possible.

Note that the structure of the present invention can be modified variously other than the embodiment described above in the scope of the spirit of the present invention without deviating from the same. In other words, the embodiments described above are exemplifications on all points and are not meant to be provided by way of limitation. The technical range of the present invention is indicated in the claims rather than in the description of the embodiments, and should be construed to include all meanings equivalent to the claims as well as modifications within the scope of the claims.

For instance, the embodiment described above exemplifies the structure in which the inverter or the NOT-AND circuit is used as the logic gate constituting the loop structure portion LOOP. However, the present invention is not limited to this structure and may use other logic gate such as a NOT-OR circuit.

In addition, FIG. 1 exemplifies a structure in which the combination of inverters INV6 and INV7 and pass switches SW3 and SW4 is used as a structural element of the circuit separating portion SEP that electrically separates the loop structure portion LOOP and the nonvolatile storage portion NVM. However, the present invention is not limited to this structure and may use the three state inverters INV6' and INV7' (inverters which are capable of floating point output) as structural elements of the circuit separating portion SEP, as illustrated in FIG. 7 and in other places.

In addition, the point of the circuit separating portion SEP is that a voltage is not applied to the ferroelectric element in the normal operation. Other than the structure exemplified in the embodiment described above (i.e., the structure in which the applied voltage to the ferroelectric element is kept to be a constant voltage in the normal operation), it can be considered to adopt another structure in which at least one of the electrodes of the ferroelectric element for receiving the voltage is kept to be a floating state. As a specific example, it can be considered to adopt a method of turning off the transistors Q1a, Q1b, Q2a and Q2b while making the first plate line PL1 and the second plate line PL2 be the floating state in the normal operation in FIG. 1, or other methods. In addition, if the circuit structure itself is modified, an additional transistor may be disposed between the ferroelectric element and the outlet end of the node voltage V1 (V2), or between the ferroelectric element and the plate line PL1 (PL2), so that on-off control of the transistor is performed.

In addition, if the applied voltage to the ferroelectric element is kept to be constant in the normal operation or in the data reading action, the transistor connected between the ends of the ferroelectric element should be turned on, but the voltage of the plate line is not necessarily the low level.

In addition, FIG. 1 exemplifies a structure in which the voltage level of the second power supply voltage VDD2 supplied to the nonvolatile storage portion NVM is higher than the first power supply voltage VDD1 supplied to the loop structure portion LOOP. However, the structure of the present invention is not limited to that structure, and a structure in which the second power supply voltage VDD2 is lower than the first power supply voltage VDD1 is also possible.

As described above, in the nonvolatile logic technique, the ferroelectric element is driven so as to save or restore the register data when the power supply is turned off or on, or at other timing. Here, if the voltage level used for driving the ferroelectric element is reduced as much as possible, the power consumption in driving the ferroelectric element can be reduced.

For instance, the loop structure portion LOOP may be driven by the first power supply voltage VDD1 of 3.3 volts while the nonvolatile storage portion NVM may be driven by the second power supply voltage VDD2 of 1.5 volts. Then, it can be avoided to consume a large power wastefully in driving the ferroelectric element.

Figure 45:
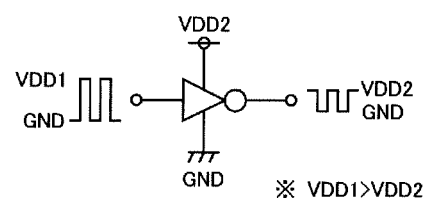
FIG. 45 is a diagram illustrating an example of the inverters INV6 and INV7 that are used in the case where a second power supply voltage VDD2 is lower than the first power supply voltage VDD1.
Figure 46:
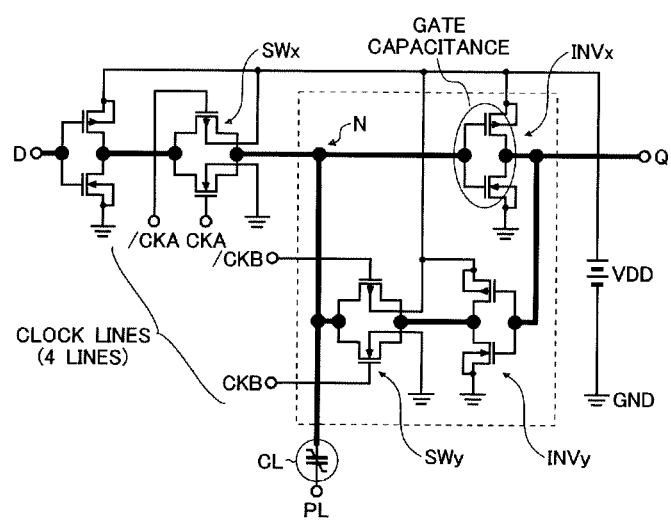
FIG. 46 illustrates a circuit of a data holding device according to a conventional example.
Figure 47:
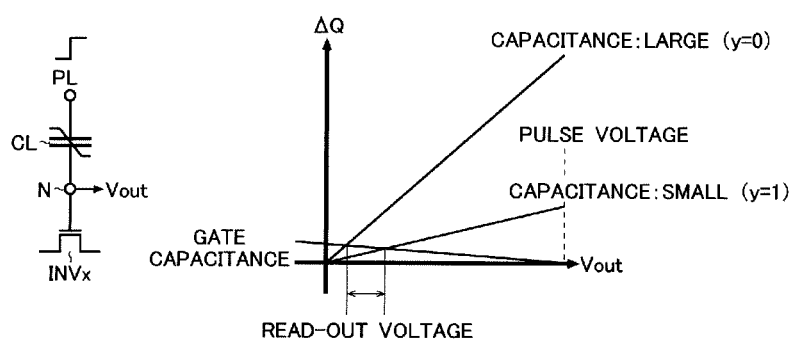
FIG. 47 is a diagram illustrating a conventional data reading method.

Note that if the loop structure portion LOOP is driven by a high voltage while the nonvolatile storage portion NVM is driven by a low voltage as described above, the inverters INV6 and INV7 constituting the circuit separating portion SEP are not required to have the level shifter function (see FIGS. 2 and 8). As illustrated in FIG. 45, it is possible to use a simple inverter that is driven by the second power supply voltage VDD2 that is lower than the first power supply voltage VDD1.

In addition, it would be simple for a person skilled in the art to conceive of new structures achieved by the arbitrary arrangement of the various embodiments described above, and it should be construed that such structures are naturally within the technological scope of the present invention.

CONCLUSION

Hereinafter, the technological characteristics disclosed in the present specification will be generally discussed. The data holding device disclosed in the present specification includes a loop structure portion for holding data using a plurality of logic gates connected in a loop, a nonvolatile storage portion for storing in a nonvolatile manner the data held in the loop structure portion by using the hysteresis characteristics of ferroelectric elements, and a circuit separating portion for electrically separating the loop structure portion and the nonvolatile storage portion. The plurality of logic gates are each set and reset to an arbitrary output logic level in accordance with a predetermined set signal and reset signal. The data holding device has a structure (first structure) that includes a set/reset controller for generating the set signals and the reset signals based on the data stored in the nonvolatile storage portion.

Note that in the data holding device having the first structure described above, the nonvolatile storage portion outputs first and second restoration voltage signals whereby the logic level of the data restored to the loop structure portion is determined according to the high and low relationship of mutual voltage values. The set/reset controller may be made to have a structure (second structure) that includes a differential amplifier wherein the first and second restoration voltage signals are differentially input.

In addition, data holding devices having the first or second structure may be made to have a structure (third structure) that includes a clock pulse controller for receiving a clock signal input from the exterior and controlling the application or blockage of the clock signal to the loop structure portion.

In addition, the other data holding device disclosed in the present specification is a data holding device that includes a loop structure portion for holding data using a plurality of logic gates connected in a loop, a nonvolatile storage portion for storing in a nonvolatile manner the data held in the loop structure portion by using the hysteresis characteristics of ferroelectric elements, and a circuit separating portion for electrically separating the loop structure portion and the nonvolatile storage portion. The nonvolatile storage portion outputs first and second restoration voltage signals whereby the logic level of the data restored to the loop structure portion is determined according to the high and low relationship of mutual voltage values. The data holding device has a structure (fourth structure) that includes a test circuit portion for controlling the nonvolatile storage portion so that one of either the first or the second restoration voltage signals is caused to be output normally, and the other of the two is output as an arbitrary reference voltage signal.

Note that a data holding device having the fourth structure described above may be made to have a structure (fifth structure) including an output terminal for outputting the data restored to the loop structure portion to the exterior of the device.

In addition a data holding device having the fifth structure described above may be made to have a structure (sixth structure) wherein the output terminal is a SCAN-PASS output terminal serially connected to another data holding device.

In addition, the tester disclosed in the present specification is connected to a data holding device having the fifth or the sixth structure described above, and may be provided with a structure (seventh structure) wherein the data restored to the loop structure portion is consecutively monitored while causing the voltage value of the reference voltage signal to change, and wherein the voltage value of the first and the second restoration voltage signals is determined based on the results thereof.

In addition, the other data holding device disclosed in the present specification includes a loop structure portion for holding data using a plurality of logic gates connected in a loop, a nonvolatile storage portion for storing in a nonvolatile manner the data held in the loop structure portion by using the hysteresis characteristics of ferroelectric elements, and a circuit separating portion for electrically separating the loop structure portion and the nonvolatile storage portion. The data holding device may be provided with a structure (eighth structure) wherein the nonvolatile storage portion includes a switch element for short-circuiting the ends of the ferroelectric elements when the power supply of the data holding device is turned on or off.

Note that a data holding device having any structure selected from the first to sixth structures and the eighth structure may be provided with a structure (ninth structure) has the structure for operating the loop structure portion LOOP electrically while maintaining the applied voltage to the ferroelectric elements to be constant in the normal operation of the data holding device.

In addition, a data holding device having any structure selected from the first to sixth structures, the eighth structure, and the ninth structure may be provided with a structure (tenth structure) in which data is read out from the ferroelectric elements by using a capacitive coupling between the ferroelectric element in the non-inverted state and the ferroelectric element in the inverted state.

In addition, a data holding device having a structure being any one of the first to sixth structures or alternatively the eighth or the ninth structure may be provided with a structure (eleventh structure) in which data is read out from the ferroelectric elements by using a capacitive coupling between the ferroelectric elements and other capacitance elements.

According to the technological characteristics disclosed in the present specification it is possible to maintain data in a nonvolatile manner even after the power supply has been cut without inviting an increase in consumed electricity or reductions in speed during regular operations. Also, it is possible to provide a highly reliable and convenient data holding device.

The technical characteristics disclosed in the present specification are techniques for implementing non-volatility in a data holding device mounted on a logical arithmetic circuit, a logical arithmetic device, a CPU, an MPU, a DSP or other processor, as well as a mobile device or the like.

LIST OF REFERENCE NUMERALS

INV1 to INV5, INV5', INV10' Inverter
INV6, INV7 Inverter (having a level shift function)
INV6', INV7' Inverter (having a level shift function, three state)
INV8, INV8', INV9 to INV14 Inverter (three state)
SW1 to SW10 Pass switch
MUX1, MUX2, MUX3, MUX4 Multiplexer
DeMUX1, DeMUX2 De-multiplexer
Q1$a$, Q1$b$, Q2$a$, Q2$b$ N channel field-effect transistor
Q11$a$, Q12$a$, . . . , Q1$ma$ N channel field-effect transistor
Q11$b$, Q12$b$, . . . , Q1$mb$ N channel field-effect transistor
Q21$a$, Q22$a$, . . . , Q2$ma$ N channel field-effect transistor
Q21$b$, Q22$b$, . . . , Q2$mb$ N channel field-effect transistor
CL1$a$, CL1$b$, CL2$a$, CL2$b$ ferroelectric element
CL11$a$, CL12$a$, . . . , CL1$ma$ ferroelectric element
CL11$b$, QL12$b$, . . . , CL1$mb$ ferroelectric element
CL21$a$, CL22$a$, . . . , CL2$ma$ ferroelectric element
CL21$b$, CL22$b$, . . . , CL2$mb$ ferroelectric element
C1, C2 Capacitance element
NAND1 to NAND5 NOT-AND circuit
LOOP Loop structure portion
NVM Nonvolatile storage portion
SEP Circuit separating portion
P1 to P3 P channel MOS field-effect transistor
N1 to N3 N channel MOS field-effect transistor
SRC Set/reset controller
SA Sense amplifier (differential amplifier)
P1 to P4 P channel field-effect transistor
N1 to N5 N channel field-effect transistor
AND1, AND2 AND circuit TEST Test circuit portion
CPC Clock pulse controller
1 Logical arithmetic device
2 Tester (sequencer)
REG1 to REGx Register (data storage device)

What is claimed is:

1. A data holding device, comprising:
   a loop structure portion for holding data using a plurality of logic gates connected in a loop;
   a nonvolatile storage portion for storing in a nonvolatile manner the data held in the loop structure portion by using hysteresis characteristics of ferroelectric elements;
   a circuit separating portion for electrically separating the loop structure portion and the nonvolatile storage portion; and
   a set/reset controller for generating a predetermined set signal and reset signal based on data stored in the nonvolatile storage portion;
   wherein the plurality of logic gates are each set and reset to an arbitrary output logic level in accordance with the set signal and reset signal.

2. The data holding device of claim 1, wherein:
   the nonvolatile storage portion outputs first and second restoration voltage signals whereby the logic level of the data restored to the loop structure portion is determined according to the high and low relationship of mutual voltage values; and
   the set/reset controller includes a differential amplifier wherein the first and second restoration voltage signals are differentially input.

3. The data holding device of claim 2, further comprising a clock pulse controller for receiving a clock signal input from the exterior and controlling the application or blockage of the clock signal to the loop structure portion.

4. The data holding device of claim 1, further comprising a clock pulse controller for receiving a clock signal input from the exterior and controlling the application or blockage of the clock signal to the loop structure portion.

5. The data holding device of claim 1, wherein the circuit separation portion electrically operates the loop structure portion while maintaining the applied voltage to the ferroelectric elements to be constant in the normal operation of the data holding device.

6. The data holding device of claim 1, wherein data is read out from the ferroelectric elements by using a capacitive coupling between the ferroelectric element in the non-inverted state and the ferroelectric element in the inverted state.

7. The data holding device of claim 1, wherein data is read out from the ferroelectric elements by using a capacitive coupling between the ferroelectric elements and other capacitance elements.

8. A data holding device, comprising:
   a loop structure portion for holding data using a plurality of logic gates connected in a loop;
   a nonvolatile storage portion for storing in a nonvolatile manner the data held in the loop structure portion by using hysteresis characteristics of ferroelectric elements, and outputting first and second restoration voltage signals whereby the logic level of the data restored to the loop structure portion is determined according to the high and low relationship of mutual voltage values;
   a circuit separating portion for electrically separating the loop structure portion and the nonvolatile storage portion; and
   a test circuit portion for controlling the nonvolatile storage portion so that one of either the first or the second restoration voltage signals is caused to be output normally, and the other of the two is output as an arbitrary reference voltage signal.

9. The data holding device of claim 8, further comprising an output terminal for outputting data restored to the loop structure portion to the exterior of the device.

10. The data holding device of claim 9, wherein the output terminal is a SCAN-PASS output terminal serially connected to another data holding device.

11. A tester connected to the data holding device of claim 10, wherein the data restored to the loop structure portion is consecutively monitored while causing the voltage value of the reference voltage signal to change, and wherein the voltage value of the first and the second restoration voltage signals is determined based on the results thereof.

12. A tester connected to the data holding device of claim 9, wherein the data restored to the loop structure portion is consecutively monitored while causing the voltage value of the reference voltage signal to change, and wherein the voltage value of the first and the second restoration voltage signals is determined based on the results thereof.

13. The data holding device of claim 8, wherein the circuit separation portion electrically operates the loop structure portion while maintaining the applied voltage to the ferroelectric elements to be constant in the normal operation of the data holding device.

14. The data holding device of claim 8, wherein data is read out from the ferroelectric elements by using a capacitive coupling between the ferroelectric element in the non-inverted state and the ferroelectric element in the inverted state.

15. The data holding device of claim 8, wherein data is read out from the ferroelectric elements by using a capacitive coupling between the ferroelectric elements and other capacitance elements.

16. A data holding device, comprising:
   a loop structure portion for holding data using a plurality of logic gates connected in a loop;
   a nonvolatile storage portion for storing in a nonvolatile manner the data held in the loop structure portion by using hysteresis characteristics of ferroelectric elements; and
   a circuit separating portion for electrically separating the loop structure portion and the nonvolatile storage portion;
   wherein the nonvolatile storage portion includes switch elements arranged to electrically short-circuit the ferroelectric elements at the ends during on/off of the data holding device power supply and fix nodes of the ferroelectric elements to ground potential when the switch elements are turned on.

17. The data holding device of claim 16, wherein the circuit separation portion electrically operates the loop structure portion while maintaining the applied voltage to the ferroelectric elements to be constant in the normal operation of the data holding device.

18. The data holding device of claim 16, wherein data is read out from the ferroelectric elements by using a capacitive coupling between the ferroelectric element in the non-inverted state and the ferroelectric element in the inverted state.

19. The data holding device of claim 16, wherein data is read out from the ferroelectric elements by using a capacitive coupling between the ferroelectric elements and other capacitance elements.

* * * * *